(12) United States Patent
Hosomi et al.

(10) Patent No.: US 9,431,563 B2
(45) Date of Patent: Aug. 30, 2016

(54) SOLAR CELL ELEMENT AND METHOD FOR MANUFACTURING SOLAR CELL ELEMENT

(71) Applicant: KYOCERA Corporation, Kyoto-shi, Kyoto (JP)

(72) Inventors: Kazunori Hosomi, Yasu (JP); Kenji Ooba, Moriyama (JP)

(73) Assignee: KYOCERA Corporation, Kyoto-shi, Kyoto (JP)

( * ) Notice: Subject to any disclaimer, the term of this patent is extended or adjusted under 35 U.S.C. 154(b) by 5 days.

(21) Appl. No.: 14/412,406

(22) PCT Filed: Dec. 25, 2013

(86) PCT No.: PCT/JP2013/084585
§ 371 (c)(1),
(2) Date: Dec. 31, 2014

(87) PCT Pub. No.: WO2014/104058
PCT Pub. Date: Jul. 3, 2014

(65) Prior Publication Data
US 2015/0364633 A1    Dec. 17, 2015

(30) Foreign Application Priority Data

Dec. 28, 2012  (JP) ................. 2012-287851

(51) Int. Cl.
| | |
|---|---|
| H01L 31/065 | (2012.01) |
| H01L 31/068 | (2012.01) |
| H01L 31/18 | (2006.01) |
| H01L 31/0224 | (2006.01) |

(52) U.S. Cl.
CPC ..... *H01L 31/065* (2013.01); *H01L 31/022425* (2013.01); *H01L 31/068* (2013.01);
(Continued)

(58) Field of Classification Search
CPC ............. H01L 31/065; H01L 31/0682; H01L 31/0684; H01L 31/0463; H01L 31/06; H01L 31/072; H01L 31/0224; H01L 31/022433; H01L 31/0508; Y02E 10/50; Y02E 10/52
See application file for complete search history.

(56) References Cited

U.S. PATENT DOCUMENTS

| | | |
|---|---|---|
| 7,985,610 B2 | 7/2011 | You |
| 8,513,754 B2 | 8/2013 | You |

(Continued)

FOREIGN PATENT DOCUMENTS

JP    2011-512041 A    4/2011

OTHER PUBLICATIONS

International Search Report dated Mar. 18, 2014, issued for International Application No. PCT/JP2013/084585.

(Continued)

*Primary Examiner* — Jeffrey T Barton
*Assistant Examiner* — Daniel Malley, Jr.
(74) *Attorney, Agent, or Firm* — Procopio Cory Hargreaves and Savitch LLP

(57) ABSTRACT

A solar cell element includes a semiconductor substrate which includes a first semiconductor region positioned on a first main surface and a second semiconductor region in a surface layer portion of a second main surface, and an electrode in line shape disposed on the second main surface. The second semiconductor region includes a first concentration region being separated from the electrode by a predetermined distance in plan view, and a second concentration region including a high concentration region where a dopant concentration is higher than that in the first concentration region and exists along a longitudinal direction of the electrode.

5 Claims, 16 Drawing Sheets

(52) U.S. Cl.
CPC .......... *H01L 31/18* (2013.01); *H01L 31/1804* (2013.01); *H01L 31/1864* (2013.01); *Y02E 10/547* (2013.01); *Y02P 70/521* (2015.11)

(56) References Cited

U.S. PATENT DOCUMENTS

| | | | |
|---|---|---|---|
| 2009/0260684 A1* | 10/2009 | You | H01L 31/022433 136/256 |
| 2011/0253209 A1 | 10/2011 | You | |
| 2012/0171804 A1* | 7/2012 | Moslehi | B23K 26/0656 438/71 |

OTHER PUBLICATIONS

Written Opinion of the International Searching Authority issued by Japan Patent Office for International Application No. PCT/JP2013/084585.

* cited by examiner

MEASUREMENT POSITION (DISTANCE FROM END SURFACE OF SUBSTRATE) [mm]

SOLAR CELL ELEMENT AND METHOD FOR MANUFACTURING SOLAR CELL ELEMENT

TECHNICAL FIELD

The present invention relates to a solar cell element and a method for manufacturing the solar cell element.

BACKGROUND ART

A solar cell element has been known in which a region (reverse conductivity type region) where a reverse conductivity type impurity element is introduced is provided in a surface layer portion of a front surface in a one conductivity type semiconductor substrate, in which an anti-reflection film and an electrode in line shape are placed on the region, and in which an electrode is placed on a rear surface of the semiconductor substrate. In Japanese Unexamined Patent Application Publication (Translation of PCT Application) No. 2011-512041, a solar cell element is suggested, the solar cell element having a structure (selective emitter structure) in which a content concentration of the reverse conductivity type impurity element is increased in the region where the electrode in line shape is placed in the reverse conductivity type region.

For example, the selective emitter structure is formed as follows. First, a p-type semiconductor substrate is disposed in a heating furnace as the one conductivity type semiconductor substrate. Next, in a state where the semiconductor substrate is heated, gas which contains an n-type impurity element as a reverse conductivity type is supplied to the inside of the heating furnace, and thereby the n-type impurity element is introduced into the surface layer portion of the p-type semiconductor substrate by diffusion. At this time, a first emitter region is formed in the surface layer portion of the p-type semiconductor substrate, and a layer (for example, phosphosilicate glass layer) which is a diffusion source of the n-type impurity element is formed on the first emitter region. When a preset position of the diffusion source is selectively irradiated with laser light, the diffusion source is locally heated, and the n-type impurity element is further introduced into the semiconductor substrate by diffusion. Accordingly, in the region where the electrode in line shape is placed, a second emitter region where a content concentration of the n-type impurity element as the reverse conductivity type is increased is formed.

As another example, one main surface of the p-type semiconductor substrate as the one conductivity type is coated with a paste-formed raw material solution (for example, $P_2O_5$) which contains the n-type impurity element as the reverse conductivity type. Subsequently, a heat treatment is performed, thereby forming a reverse conductivity region is formed in the surface layer portion of the p-type semiconductor substrate.

SUMMARY OF INVENTION

Problem to be Solved by the Invention

When a first emitter region is formed in a surface layer portion of a one conductivity type semiconductor substrate, for example, a gas concentration in a heating furnace and a temperature (substrate temperature) of the semiconductor substrate vary. Accordingly, a concentration of a reverse conductivity type impurity element varies in the first emitter region and a thickness of the first emitter region varies. In other words, a sheet resistance in the first emitter region varies. For example, in the vicinity of an outer peripheral portion of the one conductivity type semiconductor substrate, the concentration of the reverse conductivity type impurity element varies in the first emitter region, the thickness of the first emitter region varies, and a thickness of a diffusion source varies, due to a decrease in the gas concentration and the substrate temperature.

Subsequently, when a preset position of the diffusion source is uniformly irradiated with laser light, according to the variation in the concentration of the reverse conductivity type impurity element in the first emitter region and the variation in the thickness of the diffusion source of the impurity element which is formed on the first emitter region, or the like, a concentration and a thickness of a reverse conductivity type impurity element in a second emitter region vary. Accordingly, a sheet resistance in the second emitter region increases, and a pn junction depth may be less than an optimum value. In other words, for example, a contact resistance in a boundary part between the semiconductor substrate and an electrode in line shape increases, and the pn junction depth becomes less than the optimum value. As a result, an FF and an open-circuit voltage in a solar cell element decrease, and conversion efficiency in the solar cell element decreases.

A solar cell element which can improve the conversion efficiency by improving the boundary part between the semiconductor substrate and the electrode and a method for manufacturing the solar cell element are desired.

Means for Solving the Problem

In order to solve the above-described problem, a solar cell element according to an aspect includes: a semiconductor substrate which includes a first conductivity type first semiconductor region positioned on a first main surface, and a second conductivity type second semiconductor region which is different from the first conductivity type in a surface layer portion of a second main surface positioned on an opposite side to the first main surface; and an electrode in line shape which is disposed on the second main surface of the semiconductor substrate. In the solar cell element, the second semiconductor region includes a first concentration region which exists at a position separated from the electrode by a predetermined distance in plan view, and a second concentration region which includes a high concentration region where a dopant concentration is higher than that in the first concentration region and exists along a longitudinal direction of the electrode. The solar cell element includes a part in which a minimum place which has a minimum value of a dopant concentration difference that is obtained by subtracting a dopant concentration value of the first concentration region at a place which is close to a one place from a dopant concentration value of the second concentration region at the one place and a maximum place which has a maximum value of the dopant concentration difference alternately and repeatedly exist, along the longitudinal direction of the electrode, and in which a minimum place interval between one end portions of the adjacent minimum places in the longitudinal direction of the electrode varies.

A method for manufacturing a solar cell element according to another aspect includes: a preparation process of preparing a first conductivity type semiconductor substrate; a first forming process of forming a second conductivity type first concentration region where a second conductivity type dopant concentration is in a first concentration range, by diffusing an element which becomes the second conductivity type dopant that is different from the first conductivity type, in a surface layer portion of one main surface of the first conductivity type semiconductor substrate; a second forming process of forming a second conductivity type second concentration region which includes a high concentration region having the second conductivity type dopant concentration in a second concentration range that is higher than the first concentration range, by diffusing the element which becomes the second conductivity type dopant, in the surface layer portion of the semiconductor substrate from an element supply source, by irradiating the element supply source with laser light at a periodic timing, in a state where the element supply source containing the element which becomes the second conductivity type dopant is placed on the first concentration region; and a third forming process of forming an electrode on the second concentration region. In the second forming process of this manufacturing method, while moving in one direction a position of an irradiation target region which is irradiated with the laser light on the element supply source, at least one condition among three conditions of an interval between center positions of the irradiation target regions, an area of the irradiation target region, and a radiation energy of the laser light for the irradiation target region is changed.

Advantageous Effects of Invention

According to a solar cell element of one aspect, since a dopant concentration in a second concentration region which is formed by allowing a part having a relatively low dopant concentration in a first concentration region to be a base portion can appropriately increase, a distribution of a sheet resistance in the second concentration region can be narrow and can be settled in an appropriate value range. As a result, by improving a boundary part between a semiconductor substrate and an electrode, it is possible to improve conversion efficiency.

According to a method for manufacturing a solar cell element of another aspect, since a sheet resistance in a second concentration region which is formed by allowing a part having a relatively high sheet resistance in a first concentration region to be a base portion can appropriately decrease, a distribution of a sheet resistance in the second concentration region can be narrow and can be settled in an appropriate value range. As a result, by improving a boundary part between a semiconductor substrate and an electrode, it is possible to improve conversion efficiency.

MODE FOR CARRYING OUT OF THE INVENTION

Hereinafter, an embodiment and various modification examples of the present invention will be described with reference to the drawings. The drawings are schematically illustrated, and a size and a positional relationship of various structures in each drawing can be appropriately changed. In addition, in FIGS. 1 to 8, FIG. 12, FIGS. 20 to 26, and FIGS. 28 and 34, an XYZ coordinate system of a right-hand oriented system is assigned in which an extending direction (upper direction in FIG. 1) of a first line-shaped portion 5a of a solar cell element 10 is considered as a +Y direction.

(1)—Embodiment (1-1) Schematic Configuration of Solar Cell Element

Figure 1:
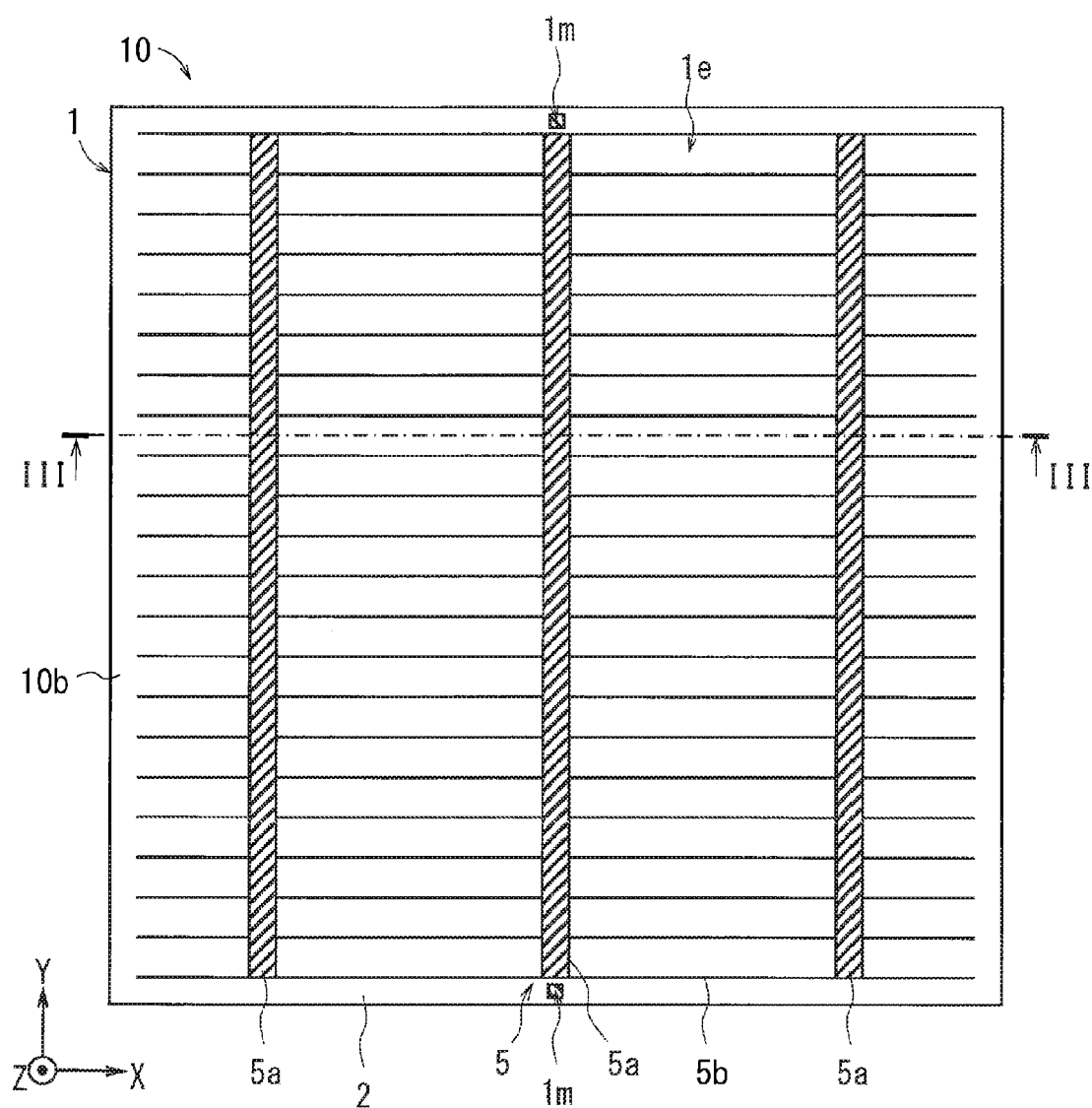
FIG. 1 is a plan view illustrating an upper surface of a solar cell element according to an embodiment.
Figure 2:
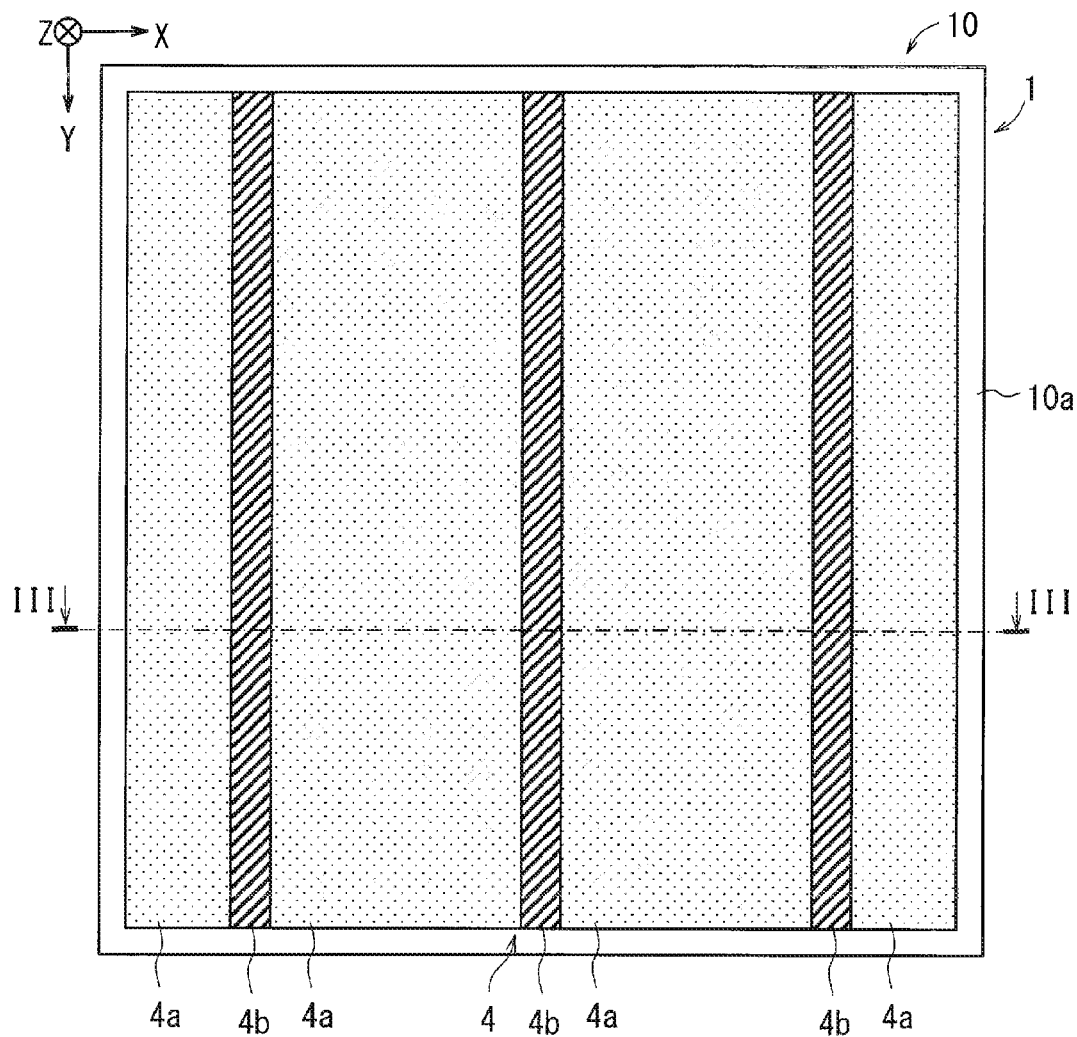
FIG. 2 is a plan view illustrating a lower surface of the solar cell element according to the embodiment.
Figure 3:
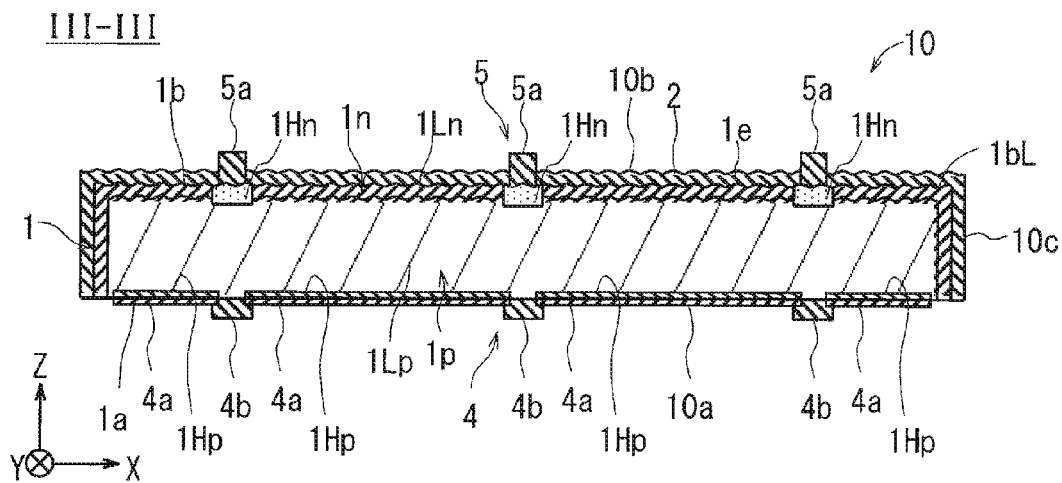
FIG. 3 is a cross-sectional view illustrating an XZ cross section at a position illustrated by one-dot chain line III-III in FIGS. 1 and 2.

As illustrated in FIGS. 1 to 3, the solar cell element 10 includes a first main surface 10a, a second main surface 10b, and a side surface 10c. The second main surface 10b is a surface (light receiving surface) which receives incident light. The first main surface 10a is a surface (non-light-receiving surface) which is positioned on an opposite side to the second main surface 10b in the solar cell element 10. The side surface 10c is a surface which connects the first main surface 10a and the second main surface 10b to each other. In FIG. 3, the first main surface 10a is drawn as a lower surface on a −Z side of the solar cell element 10, and the second main surface 10b is drawn as an upper surface on a +Z side of the solar cell element 10.

The solar cell element 10 includes a semiconductor substrate 1 in a plate shape, an anti-reflection film 2, a first electrode 4, and a second electrode 5.

The semiconductor substrate 1 has a configuration in which a first conductivity type first semiconductor region 1p and a second conductivity type second semiconductor region 1n which is different from the first conductivity type are stacked. The first semiconductor region 1p is positioned on the first main surface 10a side (−Z side in the drawing) in the semiconductor substrate 1. In addition, the second semiconductor region 1n is positioned in a surface layer portion on the second main surface 10b side (+Z side in the drawing) which is opposite to the first main surface 10a side in the semiconductor substrate 1.

Here, for example, it is sufficient that the semiconductor substrate 1 has a plate shape which has a rectangular surface. For example, it is sufficient that the semiconductor substrate 1 is a monocrystal or polycrystal silicon substrate (crystal silicon substrate). It is sufficient that the first conductivity type and the second conductivity type may be conductivity types which are reverse to each other. For example, when the first conductivity type is a p-type, it is sufficient that the second conductivity type is an n-type. When the first conductivity type is the n-type, it is sufficient that the second conductivity type is the p-type. Accordingly, the first semiconductor region 1p and the second semiconductor region 1n form a pn junction region. Note that, in the embodiment, the first conductivity type is the p-type, and the second conductivity type is the n-type. In other words, the first semiconductor region 1p is a p-type semiconductor region. The second semiconductor region 1n is an n-type semiconductor region.

One side of the plate surface of the semiconductor substrate 1 may be 156 mm, for example. A thickness of the first semiconductor region 1p may be equal to or less than 250 μm, for example, and further, may be equal to or less than 150 μm. The shape of the semiconductor substrate 1 is not particularly limited, but, for example, if the shape is rectangular in plan view, it is easy to manufacture the semiconductor substrate 1.

The second semiconductor region 1n includes a first concentration region 1Ln and a second concentration region 1Hn. The first concentration region 1Ln is a semiconductor region where a concentration (dopant concentration) of an n-type dopant as the second conductivity type is in a first concentration range. In addition, the n-type dopant concentration in the second concentration region 1Hn is higher than the n-type dopant concentration in the first concentration region 1Ln.

Here, for example, the second semiconductor region 1n is formed in the surface layer portion on a second main surface 1b side in the crystal silicon substrate by introducing an element which becomes the n-type dopant into a region on the second main surface 1b side in the p-type crystal silicon substrate, by diffusion. In this case, a part other than the second semiconductor region 1n in the crystal silicon substrate becomes the first semiconductor region 1p. As the n-type dopant, for example, a phosphorus (P) is employed.

The first semiconductor region 1p includes a third concentration region 1Lp and a fourth concentration region 1Hp. The fourth concentration region 1Hp is positioned in the surface layer portion on a first main surface 1a side in the semiconductor substrate 1. The fourth concentration region 1Hp includes a gap which allows an output extraction electrode 4b and the third concentration region 1Lp to be in contact with each other on the first main surface 1a. The p-type dopant concentration in the fourth concentration region 1Hp is higher than the p-type dopant concentration in the third concentration region 1Lp. As the p-type dopant, for example, boron (B), gallium (Ga), or aluminum (Al) is employed.

The fourth concentration region 1Hp has a role of reducing recombination of carriers in the region on the first main surface 1a side in the semiconductor substrate 1. Accordingly, since the fourth concentration region 1Hp exists, decrease of conversion efficiency is suppressed in the solar cell element 10. In the fourth concentration region 1Hp, an internal electric field is generated on the first main surface 1a side in the semiconductor substrate 1. For example, the fourth concentration region 1Hp is formed by introducing the dopant, such as B or Al, into the region on the first main surface 1a side in the semiconductor substrate 1, by diffusion. In this case, a part other than the fourth concentration region 1Hp in the first semiconductor region 1p becomes the third concentration region 1Lp.

As illustrated in FIG. 3, a projection and recess portion 1bL is placed across the substantially entire second main surface 1b in the semiconductor substrate 1. Here, it is sufficient that a height of a projection portion in the projection and recess portion 1bL are approximately equal to or greater than 0.1 μm and equal to or less than 10 μm, for example. It is sufficient that a width of the projection portion is approximately equal to or greater than 0.1 μm and equal to or less than 20 μm, for example. In addition, a surface shape of a recess portion of the projection and recess portion 1bL may be, for example, substantially spherical. The above-described height of the projection portion is considered to be a distance from a reference surface to a top surface of the projection portion in a normal line direction of the reference surface. The reference surface is a surface which passes through a bottom surface of the recess portion and is parallel to the first main surface 1a. The above-described width of the projection portion means a distance between the top surfaces of the adjacent projection portions in a direction which is parallel to the above-described reference surface. Since the projection and recess portion 1bL exists, reflectance is reduced in the second main surface 1b on the light receiving surface side of the semiconductor substrate 1.

Furthermore, in the surface layer portion on the second main surface 1b side of the semiconductor substrate 1, alignment reference portions 1m are provided to be separated from each other at two or more locations. The alignment reference portions 1m at two or more locations are used as a reference when adjusting a position where the second electrode 5 is formed. In the embodiment, the alignment reference portions 1m are placed at two locations on the second main surface 1b, but the embodiment is not limited thereto. The alignment reference portions 1m may be placed at three or more locations on the second main surface 1b.

The anti-reflection film 2 is a film for improving light absorption efficiency in the solar cell element 10. The anti-reflection film 2 is placed on the first concentration region 1Ln on the second main surface 1b side in the semiconductor substrate 1. As a material of the anti-reflection film 2, for example, a silicon nitride, a titanium oxide, a silicon oxide, a magnesium oxide, an indium tin oxide, a tin oxide, a zinc oxide or the like is employed. When a silicon nitride film is employed as the anti-reflection film 2, since the anti-reflection film 2 functions as a passivation film, a passivation effect is realized.

Since the anti-reflection film 2 is placed along the projection and recess portion 1bL of the second main surface 1b, the upper surface on the +Z side of the anti-reflection film 2 includes a projection and recess portion according to the shape of the projection and recess portion 1bL. A thickness of the anti-reflection film 2 may be appropriately set in accordance with materials of the semiconductor substrate 1 and anti-reflection film 2. Accordingly, in the solar cell element 10, a condition that light is unlikely to be reflected with respect to various types of light radiation is realized. When the semiconductor substrate 1 is the crystal silicon substrate, it is sufficient that a refractive index of the anti-reflection film 2 is approximately equal to or greater than 1.8 and equal to or less than 2.3, for example, and it is sufficient that a thickness of the anti-reflection film 2 is approximately equal to or greater than 50 nm and equal to or less than 120 nm, for example.

The first electrode 4 is placed on the first main surface 1a of the semiconductor substrate 1. As illustrated in FIGS. 2 and 3, the first electrode 4 includes a collection electrode 4a and the output extraction electrode 4b.

The collection electrode 4a is placed on the fourth concentration region 1Hp. Specifically, for example, it is sufficient that the collection electrode 4a is on the substantially entire surface except a region in which the output extraction electrode 4b is formed, in the first main surface 1a of the semiconductor substrate 1. It is sufficient that a thickness of the collection electrode 4a is approximately equal to or greater than 15 μm and equal to or less than 50 μm. For example, the collection electrode 4a is formed by applying a conductive paste (Al paste) which contains Al as a main component to the first main surface 1a of the semiconductor substrate 1 with a desirable pattern by screen printing or the like and, thereafter, by firing the conductive paste.

The output extraction electrode 4b is on the third concentration region 1Lp, in the gap of the fourth concentration region 1Hp. The output extraction electrode 4b is placed from the third concentration region 1Lp across the collection electrodes 4a which are respectively placed on the fourth concentration regions 1Hp on both sides of the gap. In other words, the output extraction electrode 4b is electrically connected to the collection electrode 4a. It is sufficient that a thickness of the output extraction electrode 4b is approximately equal to or greater than 10 μm and equal to or less than 30 μm, for example. It is sufficient that a width of the output extraction electrode 4b in a short direction is approximately equal to or greater than 1.3 mm and equal to or less than 7 mm, for example. For example, the output extraction electrode 4b is formed by applying a conductive paste (Ag paste) which contains silver (Ag) as a main component to the first main surface 1a of the semiconductor substrate 1 with a desirable pattern by screen printing or the like, and thereafter by firing the conductive paste.

The second electrode 5 is placed on the second main surface 1b of the semiconductor substrate 1. Specifically, the second electrode 5 is placed on the second concentration region 1Hn on the second main surface 1b side in the semiconductor substrate 1. As illustrated in FIG. 1, the second electrode 5 includes the first line-shaped portion 5a as a busbar electrode and a plurality of second line-shaped portions 5b as a finger electrode. The first line-shaped portion 5a extends in a Y direction which is a first extending direction. Each of the second line-shaped portions 5b extends in an X direction which is a second extending direction (longitudinal direction of the second line-shaped portions 5b) which is different from the first extending direction. Furthermore, the first line-shaped portion 5a intersects the plurality of second line-shaped portions 5b. As illustrated in FIG. 3, the second concentration region 1Hn extends along the boundary between the second semiconductor region 1n and the second electrode 5. In other words, the second concentration region 1Hn extends along the second electrode 5. In each end portion of the second line-shaped portion 5b, the second electrode 5 may include a third line-shaped portion which extends in the Y direction and is connected to the plurality of second line-shaped portions 5b.

Here, since at least a part of the first line-shaped portion 5a intersects the plurality of second line-shaped portions 5b, the first line-shaped portion 5a is electrically connected to the plurality of second line-shaped portions 5b. A line width of the first line-shaped portion 5a may be greater than a line width of the plurality of second line-shaped portions 5b. Specifically, it is sufficient that the line width of the second line-shaped portion 5b in the Y direction which is the short direction (line width direction) is approximately equal to or greater than 50 μm and equal to or less than 200 μm, for example. It is sufficient that the line width of the first line-shaped portion 5a in the X direction which is the short direction (line width direction) is approximately equal to or greater than 1.3 mm and equal to or less than 2.5 mm, for example. In addition, it is sufficient that an interval between the adjacent second line-shaped portions 5b among the plurality of second line-shaped portions 5b is approximately equal to or greater than 1.5 mm and equal to or less than 3 mm. Furthermore, it is sufficient that a thickness of the second electrode 5 is approximately equal to or greater than 10 μm and equal to or less than 40 μm, for example. The second electrode 5 may include one or more first line-shaped portions 5a, for example. In the embodiment, the second electrode 5 includes three first line-shaped portions 5a. Here, it is sufficient that an interval between the adjacent first line-shaped portions 5a among the three first line-shaped portions 5a is approximately 50 mm, for example.

Meanwhile, for example, the second electrode 5 is formed of a similar material and by a similar manufacturing method to that of the above-described output extraction electrode 4b. In other words, for example, the second electrode 5 is formed by coating the Ag paste to the second main surface 1b of the semiconductor substrate 1 at a predetermined pattern by screen printing or the like, and thereafter by firing the paste. At this time, as illustrated in FIG. 1, the alignment reference portions 1m which are provided at two or more locations in the surface layer portion on the second main surface 1b side of the semiconductor substrate 1 is considered as a reference, and a region (formed region) in which the second electrode 5 is formed is adjusted. Accordingly, the second electrode 5 can be formed on the second concentration region 1Hn of the semiconductor substrate 1 with high accuracy.

(1-2) Solar Cell Module

A solar cell module 100 according to the embodiment includes one or more solar cell elements 10. For example, it is sufficient that the solar cell module 100 includes the plurality of solar cell elements 10 which are electrically connected to each other. When an electric output of a single solar cell element 10 is small, the solar cell module 100 is formed by connecting the plurality of solar cell elements 10 to each other, for example, in series and in parallel. For example, when the plurality of solar cell modules 100 are combined, a practical electric output can be extracted.

Figure 4:
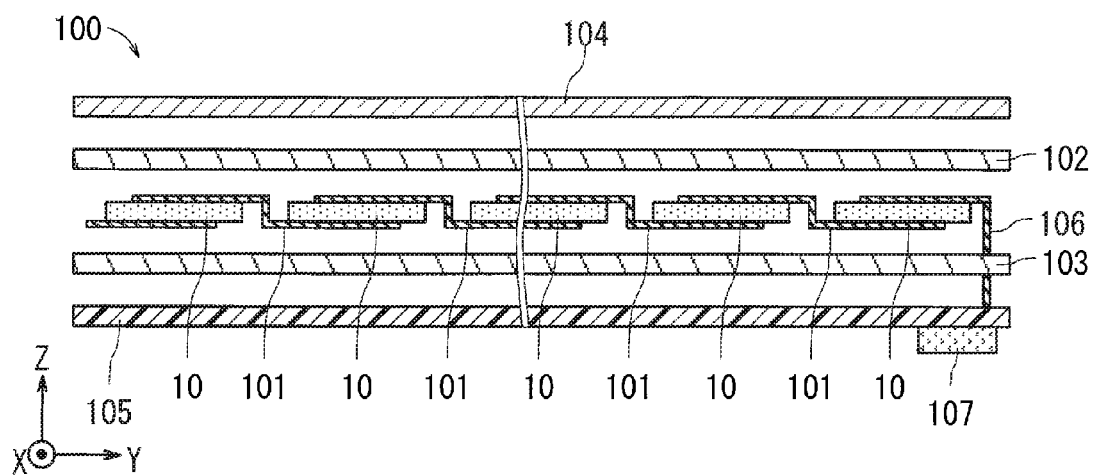
FIG. 4 is an exploded cross-sectional view illustrating a YZ cross section of a solar cell module according to the embodiment.

As illustrated in FIG. 4, the solar cell module 100 includes a stacked body in which a transparent member 104, a front side filler 102, a plurality of solar cell elements 10, a wiring member 101, a rear side filler 103, and a rear surface protector 105 are stacked. Here, the transparent member 104 is a member for protecting the light receiving surface in the solar cell module 100. For example, it is sufficient that the transparent member 104 is a transparent flat plate-shaped member. As a material of the transparent member 104, for example, glass or the like is employed. It is sufficient that the front side filler 102 and the rear side filler 103 may be, for example, transparent fillers. As materials of the front side filler 102 and the rear side filler 103, for example, an ethylene-vinyl acetate copolymer (EVA) or the like is employed. The rear surface protector 105 is a member for protecting the solar cell module 100 from the rear surface. As a material of the rear surface protector 105, for example, polyethylene terephthalate (PET), polyvinyl fluoride resin (PVE) or the like is employed. The rear surface protector 105 may have a mono-layered structure or a stacked structure.

The wiring member 101 is a member (connection member) which electrically connects the plurality of solar cell elements 10 to each other. Between the solar cell elements 10 adjacent in a ±Y direction in the plurality of solar cell elements 10 which are included in the solar cell modules 100, the first electrode 4 in one solar cell element 10 and the second electrode 5 in the other solar cell element 10 are connected to each other by the wiring member 101. Accordingly, the plurality of solar cell elements 10 are electrically connected to each other in series. Here, a thickness of the wiring member 101 may be approximately equal to or greater than 0.1 mm and equal to or less than 0.2 mm, for example. It is sufficient that a width of the wiring member 101 is approximately 2 mm. As the wiring member 101, for example, a member of which the entire surface of copper foil is covered by soldering is employed.

Figure 5:
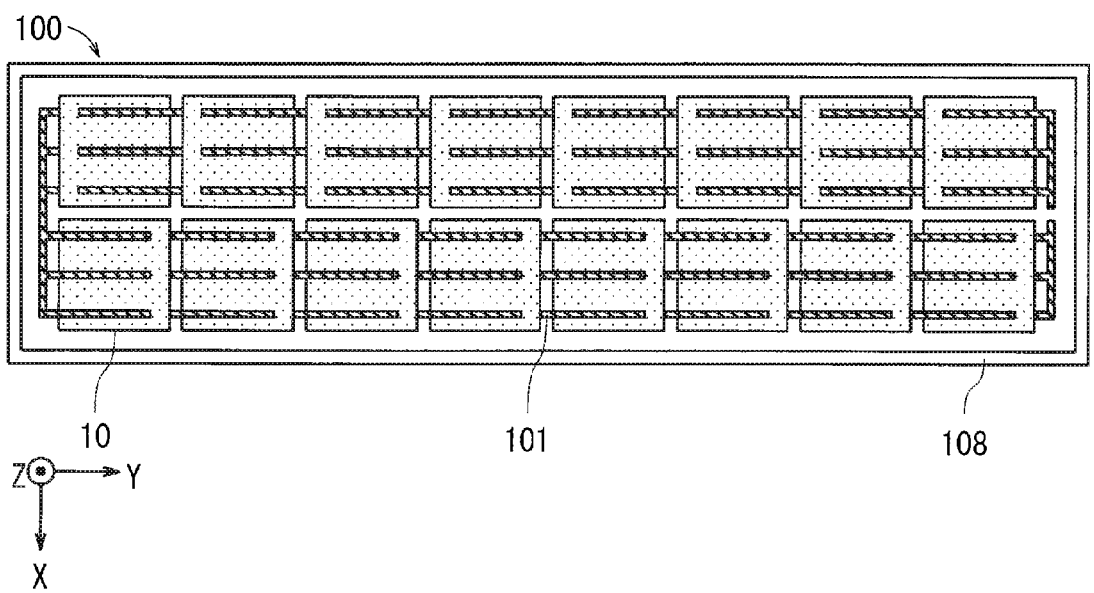
FIG. 5 is a plan view illustrating an outer appearance of the solar cell module according to the embodiment.

In the plurality of solar cell elements 10 which are electrically connected to each other in series, each of one end of the electrode of a first solar cell element 10 and one end of the electrode of a last solar cell element 10 is electrically connected to a terminal box 107 as the output extraction portion, by an output extraction wiring 106. In addition, although not illustrated in FIG. 4, as illustrated in FIG. 5, the solar cell module 100 may include a frame 108 which holds the above-described stacked body at the periphery. As a material of the frame 108, for example, Al or the like which has both corrosion resistance and intensity is employed.

When the EVA is employed as a material of at least one of the front side filler 102 and the rear side filler 103, since the EVA includes a vinyl acetate, an acetate tends to be generated due to sequential hydrolysis because the EVA transmits moisture or water when the temperature is high. In contrast, when an acid acceptor including a magnesium hydroxide or a calcium hydroxide is added to the EVA, generation of the acetate from the EVA can be reduced. Accordingly, corrosion resistance of the solar cell module 100 can be improved. In other words, it is possible to ensure reliability of the solar cell module 100 for a long period of time.

(1-3) Configuration of Second Semiconductor Region

Figure 6:
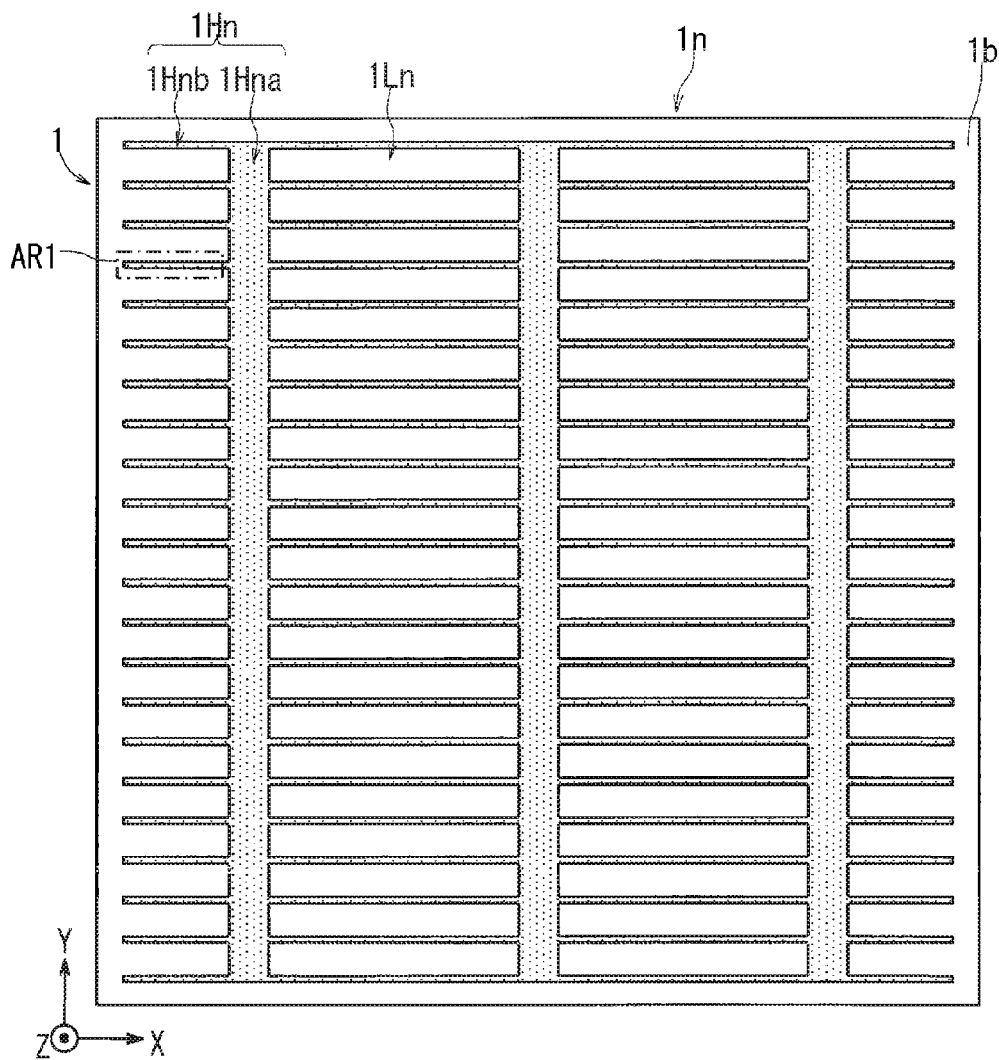
FIG. 6 is a schematic plan view illustrating a configuration of a second semiconductor region.

As illustrated in FIG. 6, the second semiconductor region 1n is provided across the entire region of the surface layer portion on the second main surface 1b side in the semiconductor substrate 1. In the second semiconductor region 1n, the first concentration region 1Ln is placed, and the second concentration region 1Hn extends.

As illustrated in FIG. 6, the second concentration region 1Hn includes a first line-shaped region 1Hna and a plurality of second line-shaped regions 1Hnb. The first line-shaped region 1Hna extends in the Y direction which is the first extending direction. Each of the second line-shaped regions 1Hnb extends in the X direction which is the second extending direction. The first line-shaped region 1Hna intersects the plurality of second line-shaped regions 1Hnb. In addition, in the second concentration region 1Hn, in each end portion of the second line-shaped regions 1Hnb, a third line-shaped region which extends in the Y direction and is connected to the plurality of second line-shaped regions 1Hnb may be included.

Here, it is sufficient that a width of the first line-shaped region 1Hna is greater than a width of the plurality of second line-shaped regions 1Hnb. Specifically, it is sufficient that a line width of the second line-shaped region 1Hnb in the Y direction which is the short direction (line width direction) is approximately equal to or greater than 100 µm and equal to or less than 500 µm, for example. It is sufficient that a width of the first line-shaped region 1Hna in the X direction which is the short direction (line width direction) is approximately equal to or greater than 2.5 mm and equal to or less than 5 mm, for example. In addition, it is sufficient that an interval between the adjacent second line-shaped regions 1Hnb among the plurality of second line-shaped regions 1Hnb is approximately equal to or greater than 1.5 mm and equal to or less than 3 mm. Furthermore, it is sufficient that a thickness of the second semiconductor region 1n is approximately equal to or greater than 0.5 μm and equal to or less than 2 μm. For example, it is sufficient that the second semiconductor region 1n includes one or more first line-shaped regions 1Hna. In the embodiment, the second semiconductor region 1n includes three first line-shaped regions 1Hna. It is sufficient that an interval between the adjacent first line-shaped regions 1Hna among the three first line-shaped regions 1Hna is approximately 50 mm, for example.

As illustrated in FIG. 1, on the second concentration region 1Hn, the second electrode 5 is placed. Specifically, the first line-shaped portion 5a is placed on each of the first line-shaped regions 1Hna of the second concentration region 1Hn. In addition, the second line-shaped portions 5b are placed on the respective second line-shaped regions 1Hnb of the second concentration region 1Hn.

Here, the n-type dopant concentration as the second conductivity type in the first concentration region 1Ln is in the first concentration range. The n-type dopant concentration in the entire second concentration region 1Hn is higher than the n-type dopant concentration in the entire first concentration region 1Ln. Specifically, the second concentration region 1Hn includes a region (high concentration region) in which the n-type dopant concentration as the second conductivity type is in the second concentration range. In the embodiment, the second concentration region 1Hn includes a plurality of high concentration regions which are arranged in the extending direction of the second concentration region 1Hn. For example, the first line-shaped region 1Hna includes the plurality of high concentration regions which are arranged in the Y direction which is the first extending direction. In addition, for example, the second line-shaped region 1Hnb includes the plurality of high concentration regions which are arranged in the X direction which is the second extending direction. Here, for example, each high concentration region is formed by irradiating a supply source with the laser light in a state where the supply source of the n-type dopant is placed on the first concentration region 1Ln. A thickness and the extending direction of the first line-shaped region 1Hna and the second line-shaped region 1Hnb are different from each other, but the configuration is similar to each other. Here, a configuration of the second line-shaped region 1Hnb will be described as an example.

Figure 7:
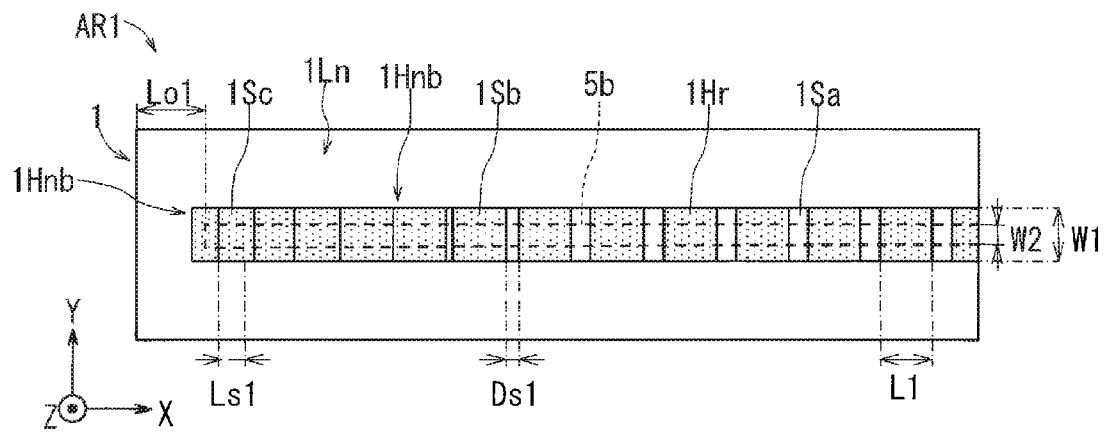
FIG. 7 is an enlarged plan view of a region AR1 surrounded by a one-dot chain line in FIG. 6.

In FIG. 7, an outer edge of the second line-shaped portions 5b which is located on the second line-shaped region 1Hnb is illustrated by a dotted line. As illustrated in FIG. 7, for example, the second line-shaped region 1Hnb includes a plurality of high concentration regions 1Hr which are provided in the X direction which is the longitudinal direction thereof. In accordance with the n-type dopant concentration in the first concentration region 1Ln in the periphery of the second line-shaped region 1Hnb, a frequency of occurrence of the plurality of high concentration regions 1Hr in the X direction which is the second extending direction is appropriately set. Accordingly, the local n-type dopant concentration in the second line-shaped region 1Hnb can be appropriately set. As described below, the first concentration region 1Ln exists at a position which is apart from the second line-shaped portions 5b by a predetermined distance in plan view.

For example, a length (overlapped length) Ls1 in the X direction of a region (overlapped region) 1Sc in which two or more high concentration regions 1Hr are overlapped with each other, and a distance (separation distance) Ds1 in the X direction between two high concentration regions 1Hr, are appropriately set. Accordingly, the local n-type dopant concentration in the second line-shaped region 1Hnb can be set.

In this case, in the second line-shaped region 1Hnb, a region (non-arrangement region) 1Sa in which the high concentration region 1Hr is not placed, a region (single arrangement region) 1Sb in which two or more high concentration regions 1Hr are placed without being overlapped with each other, and the overlapped region 1Sc, exist. Here, for example, the non-arrangement region 1Sa corresponds to the gap between two adjacent high concentration regions 1Hr.

In addition, a shape and a size of the high concentration region 1Hr are determined by a shape, a size, a positional tolerance, a width tolerance of the second electrode 5, and irradiation positional tolerance and a width tolerance of the laser light. For example, it is assumed that a line width W2 of the second line-shaped portions 5b in the Y direction which is the line width direction is approximately 100 μm, and a sum of the irradiation positional tolerance and the width tolerance of the laser light is ±80 μm. In this case, for example, it is sufficient that a line width W1 of the second line-shaped region 1Hnb in the Y direction which is the line width direction and the width W1 of the high concentration regions 1Hr in the Y direction is approximately 260 μm. In contrast, when a length L1 of the high concentration regions 1Hr in the X direction is set to be approximately 200 μm, the overlapped region 1Sc and the separation distance Ds1 are easily set, and the second line-shaped portions 5b can be located on the second line-shaped regions 1Hnb with high accuracy. A distance Lo1 from an end portion of the semiconductor substrate 1 to an end portion of the second line-shaped portions 5b is set to be approximately 1.5 mm, for example.

(1-4) In-Plane Nonuniformity in First Concentration Region

When forming the first concentration region 1Ln, at least one of a concentration of elements which become dopant supplied to the second main surface 1b of the semiconductor substrate 1 and a temperature of the semiconductor substrate 1 may vary. Accordingly, dopant concentration in the first concentration region 1Ln may vary. As a result, sheet resistance ρs in the first concentration region 1Ln may vary.

Here, when forming the first concentration region 1Ln, it is assumed that raw material gas having a lower temperature than the temperature of the semiconductor substrate 1 is supplied from the one end portion side of the semiconductor substrate 1. The raw material gas is gas containing an element which becomes the n-type dopant. In this case, the temperature on the one end portion side of the semiconductor substrate 1 can be lower than the temperature of a center portion of the semiconductor substrate 1. At this time, in the one end portion of the semiconductor substrate 1 rather than the center portion of the semiconductor substrate 1, the element which becomes the dopant is unlikely to be introduced by diffusion. Accordingly, the n-type dopant concentration in the first concentration region 1Ln which is positioned on the one end portion side of the semiconductor substrate 1 is lower than the n-type dopant concentration in the first concentration region 1Ln which is positioned in the center portion of the semiconductor substrate 1. As a result, the sheet resistance ρs in the first concentration region 1Ln which is positioned on the one end portion side of the semiconductor substrate 1 is higher than the sheet resistance ρs in the first concentration region 1Ln which is positioned in the center portion of the semiconductor substrate 1. In the embodiment, an example in which such a state occurs will be described.

When forming the first concentration region 1Ln, it is also considered that the raw material gas flows from the one end portion side of the semiconductor substrate 1 toward the other end portion side, in the heating furnace. In this case, a concentration gradient of the raw material gas can be generated from an upside of the one end portion to an upside of the other end portion of the semiconductor substrate 1. Accordingly, the n-type dopant concentration in the first concentration region 1Ln shows a tendency of decreasing from the one end portion to the other end portion of the semiconductor substrate 1. As a result, the sheet resistance ρs in the first concentration region 1Ln shows a tendency of increasing from the one end portion to the other end portion of the semiconductor substrate 1.

When forming the first concentration region 1Ln, it is considered that there is a case in which the raw material gas having a lower temperature than the temperature of the semiconductor substrate 1 is supplied, but a temperature distribution depending on a supply direction of the raw material gas is not generated in the semiconductor substrate 1. In this case, according to a cooling effect by the flow of the raw material gas, the temperature of the end portion of the entire periphery of the semiconductor substrate 1 can be lower than the temperature of the center portion of the semiconductor substrate 1. Accordingly, in the end portion of the entire periphery of the semiconductor substrate 1 rather than the center portion of the semiconductor substrate 1, the element which becomes the dopant is unlikely to be introduced by diffusion. Accordingly, the n-type dopant concentration in the first concentration region 1Ln is lower in the end portion of the entire periphery of the semiconductor substrate 1 than that in the center portion of the semiconductor substrate 1. As a result, the sheet resistance ρs in the first concentration region 1Ln in the end portion of the entire periphery of the semiconductor substrate 1 is higher than that in the center portion of the semiconductor substrate 1.

(1-5) Measuring Method of Sheet Resistance in First Concentration Region and Second Concentration Region Here, a measuring method of the sheet resistance ρs in the first concentration region 1Ln and the second concentration region 1Hn will be described. The sheet resistance ρs in the first concentration region 1Ln and the second concentration region 1Hn is measured by a four-probe method, in a darkroom which has 25.5° C. of room temperature, and 60% RH of relative humidity, for example. For example, it is sufficient that the four-probe method is a four-probe method based on JIS H 0602-1995 (resistivity measuring method by the four-probe method of silicon monocrystal and silicon wafer). In addition, as the sheet resistance ρs, for example, a sheet resistance which is corrected to a value under a condition of 25° C. of room temperature from a value obtained at 25.5° C. is employed.

Measurement of the sheet resistance ρs in the first concentration region 1Ln and the sheet resistance ρs in the second concentration region 1Hn is performed after forming the second semiconductor region 1n by introducing the n-type dopant into the surface layer portion on the second main surface 1b side in the semiconductor substrate 1 by diffusion. Specifically, for example, immediately after forming the second semiconductor region 1n, each sheet resistance ρs can be measured by allowing the probe to be in contact from above a thin film of the supply source (element supply source) of the dopant formed on the second main surface 1b. As the element supply source, for example, a phosphosilicate glass layer (PSG layer) or the like is employed.

Specifically, for example, before measuring the sheet resistance ρs in the first concentration region 1Ln, the semiconductor substrate 1 is removed from the heating furnace for forming the first concentration region 1Ln, the semiconductor substrate 1 is left for approximately 20 minutes in the darkroom, and the temperature of the semiconductor substrate 1 becomes substantially equal to the room temperature. Subsequently, for example, after the semiconductor substrate 1 is disposed in a measurement instrument, static electricity is removed from the surface of the semiconductor substrate 1 by grounding. When measuring the sheet resistance ρs in the first concentration region 1Ln, the distance between the probes is set to be approximately 1 mm, for example. A diameter of a tip end of the probe is set to be approximately 100 μm, for example. As a material of the surface of the probe, for example, tungsten carbide is employed. A weight for pressing the probe to the semiconductor substrate 1 is set to be 1 N, for example. A current applied between the probes is set to be 1 mA, for example. For example, a measurement value is read in 1 second after the current is started to be applied. For example, an average of 10 measurement values at the same measurement position is calculated as the sheet resistance ρs.

Meanwhile, a line width in the second concentration region 1Hn is narrow. Accordingly, when measuring the sheet resistance ρs in the second concentration region 1Hn, the distance between the probes is set to be approximately 0.1 mm, for example. The diameter of the tip end of the probe is set to be 10 μm, for example. As the material of the surface of the probe, tungsten carbide is employed. The weight for pressing the probe to the semiconductor substrate 1 is set to be 0.1 N, for example. The current applied between the probes is set to be 0.1 mA, for example. For example, the measurement value is read in 1 second after the current is started to be applied. For example, an average of 10 measurement values at the same measurement position is calculated as the sheet resistance ρs.

Here, the following Formula (1) and Formula (2), which express the sheet resistance (surface resistivity) ρs and a volume resistivity ρ, are used.

$$\rho = 2\pi \times (V/I) \times [1/\{(1/S1) + (1/S2) - 1/(S3+S2) - 1/(S1+S2)\}] \quad (1)$$

$$\rho s = \rho/t \quad (2)$$

When the probe is in point contact with the measurement target region having an infinite size and a uniform resistivity, Formula (1) is a general formula which expresses the volume resistivity ρ. In Formula (1), S1 to S3 represent the distance (in general, S1=S2=S3) between each probes, V represents a voltage between two probes, and I represents a current which flows between the probes at both ends among the four-probe that are aligned on a straight line. Formula (2) holds true when the volume resistivity ρ of a layer (diffusion layer) which is formed by introducing the n-type dopant into the surface layer portion of the semiconductor substrate 1 by diffusion is uniform and a depth of this diffusion layer is t. In the embodiment, the depth t may be 2 μm. As the voltage V which is detected by the four-probe method is substituted in Formula (1) and Formula (2), the sheet resistance ρs can be calculated.

In addition, in general, there is a case where the thickness and the size of the semiconductor substrate 1 are not sufficient; the width, the length, and the depth in the first concentration region 1Ln and the second concentration region 1Hn as the diffusion layer are not sufficient; and the measurement position is positioned in the vicinity of the end portion of the semiconductor substrate 1. In this case, regarding the measurement value of the sheet resistance ρs which is calculated by Formula (1) and Formula (2), an error from a true value is generated. For example, in the semiconductor substrate 1, the sheet resistance ρs of the second semiconductor region 1n is lower than the sheet resistance ρs of the first semiconductor region 1p. Accordingly, for example, because the depth of the first concentration region 1Ln is limited, the measurement value of the sheet resistance ρs in the first concentration region 1Ln can be measured as a value which is slightly higher than the true value. In addition, the sheet resistance ρs in the second concentration region 1Hn is lower than the sheet resistance ρs in the first concentration region 1Ln. Accordingly, because the width and the length of the second concentration region 1Hn are limited, a measurement value of the sheet resistance ρs in the second concentration region 1Hn can be measured as a value which is slightly higher than the true value. However, since the error is relatively small, a correction for reducing the error from the true value caused by the size and the shape of each region may not be performed.

As another measuring method of the sheet resistance ρs in the first concentration region 1Ln and the second concentration region 1Hn, for example, a measuring method in which a secondary ion mass spectrometry method (SIMS) is employed. For example, after the thin film (PSG layer or the like) of the element supply source formed on the second main surface 1b is removed by cleaning using a hydrofluoric acid (HF) or the like, a donor concentration Nd and an acceptor concentration Na in the first concentration region 1Ln and the second concentration region 1Hn are measured by the SIMS. An electron mobility μe, a positive hole mobility μp, an electron elementary charge q, the donor concentration Nd, and the acceptor concentration Na are substituted in the following Formula (3), and thereby a conductivity σ in the first concentration region 1Ln and a conductivity σ in the second concentration region 1Hn are respectively calculated.

$$\sigma = \mu e \times q \times Nd + \mu p \times q \times Na \quad (3)$$

Here, a relationship of the following Formula (4) holds true between the conductivity σ and the volume resistivity ρ in the measurement target region.

$$\rho = 1/\sigma \quad (4)$$

Here, as the conductivity σ in the first concentration region 1Ln and the second concentration region 1Hn which is calculated by Formula (3) is substituted in Formula (4), each of the volume resistivity ρ in the first concentration region 1Ln and the second concentration region 1Hn is calculated. As the volume resistivity ρ is substituted in Formula (2), the sheet resistance ρs in the first concentration region 1Ln and the sheet resistance ρs in the second concentration region 1Hn are respectively calculated.

According to the measuring method of the sheet resistance ρs, a part of the measurement target region is destroyed. However, the sheet resistance ρs can be calculated from the analysis result of the donor concentration and the acceptor concentration in the extremely small measurement target region. Accordingly, regarding the measurement value of the sheet resistance ρs obtained by the measuring method, the error from the true value caused by the size, the shape and the like of the first concentration region 1Ln and the second concentration region 1Hn can be small.

(1-6) Measuring Method of Dopant Concentration in First Concentration Region and Second Concentration Region The n-type dopant concentration in the first concentration region 1Ln and the second concentration region 1Hn can be measured by, for example, time-of-flight secondary ion mass spectrometry (TOF-SIMS) in which each surface of the first concentration region 1Ln and the second concentration region 1Hn is considered as the measurement target region. For example, if the concentration distribution of P which is the n-type dopant is visibly output, the position of the high concentration region 1Hr and a two-dimensional distribution of the n-type dopant concentration can be confirmed.

(1-7) Adjustment of Dopant Concentration and Sheet Resistance in Second Concentration Region In the embodiment, in accordance with a variation in the n-type dopant concentration and the sheet resistance ρs in the first concentration region 1Ln, the frequency of occurrence of the plurality of high concentration regions 1Hr in the second concentration region 1Hn in the extending direction is appropriately adjusted. Accordingly, the n-type dopant concentration and the sheet resistance ρs in the second concentration region 1Hn are adjusted. As a result, the distribution of the sheet resistance ρs in the second concentration region 1Hn can be narrow and can be settled in an appropriate value range.

In the embodiment, in the second line-shaped region 1Hnb in the second concentration region 1Hn, an example in which the frequency of occurrence of the plurality of high concentration regions 1Hr in the X direction which is the second extending direction is adjusted will be described.

Figure 8:
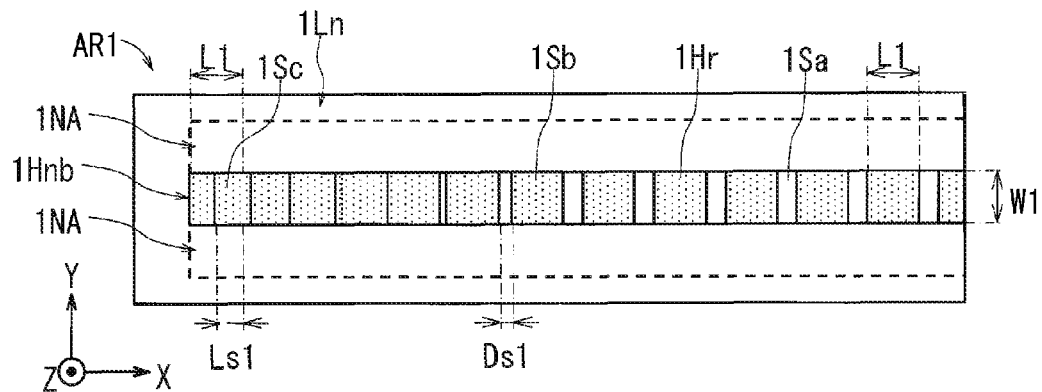
FIG. 8 is an enlarged plan view of the region AR1 surrounded by the one-dot chain line in FIG. 6.

Between the second line-shaped region 1Hnb and a region (close region) 1NA which is close to the second line-shaped region 1Hnb in the first concentration region 1Ln and extends in the X direction along the second line-shaped region 1Hnb, the n-type dopant concentration and the sheet resistance are different. In FIG. 8, an outer edge of the close region 1NA is illustrated by a dotted line.

It is sufficient that the close region 1NA is a region which is close to the second line-shaped region 1Hnb in a direction (intersection direction) which intersects the second extending direction of the second line-shaped region 1Hnb in the first concentration region 1Ln. In addition, it is sufficient that the close region 1NA is a region which is included in a range of a preset distance from the second line-shaped region 1Hnb. The preset distance may be equal to or less than the interval between adjacent second line-shaped regions 1Hnb, for example. It is sufficient that the interval between the adjacent second line-shaped regions 1Hnb is approximately equal to or greater than 1 mm and equal to or less than 2 mm, for example. Accordingly, the above-described preset distance may be approximately equal to or greater than 100 μm and equal to or less than 1000 μm, for example.

Figure 9:
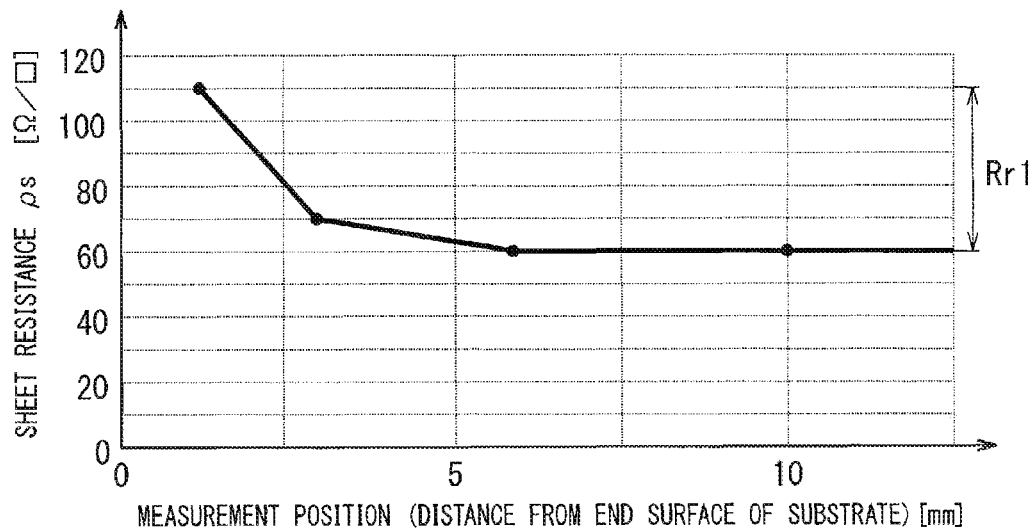
FIG. 9 is a graph illustrating an example of a distribution of a sheet resistance in a first concentration region.
Figure 10:
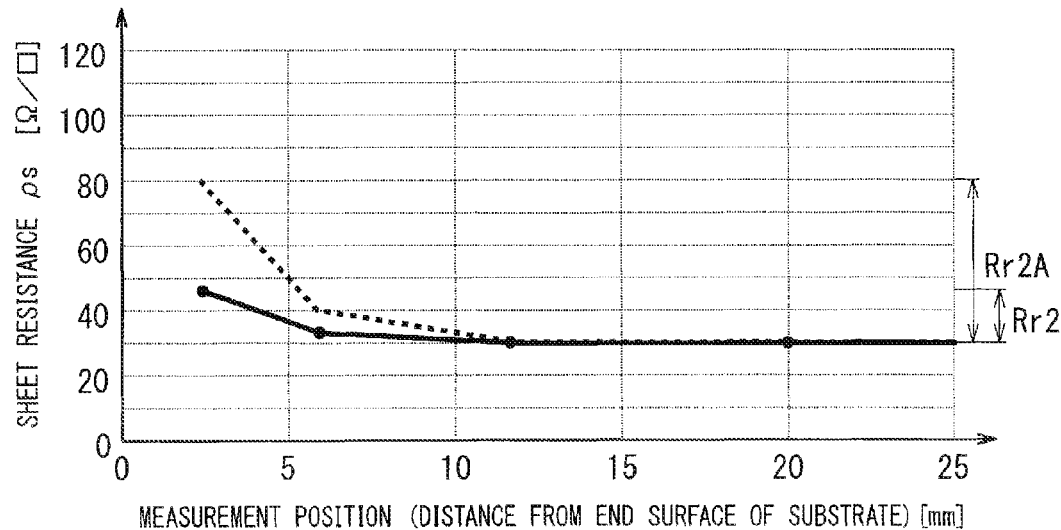
FIG. 10 is a graph illustrating an example of a distribution of the sheet resistance in a second concentration region.

In FIG. 9, a distribution of the sheet resistance ρs in the X direction in the close region 1NA is illustrated by a bold line. In FIG. 10, a distribution of the sheet resistance ρs in the X direction in the second line-shaped region 1Hnb is illustrated by a bold line. In FIGS. 9 and 10, on a horizontal axis, a distance from an end surface on the −X side of the semiconductor substrate 1 to the measurement position is illustrated, and on a vertical axis, the sheet resistance ρs is illustrated.

Figure 11:
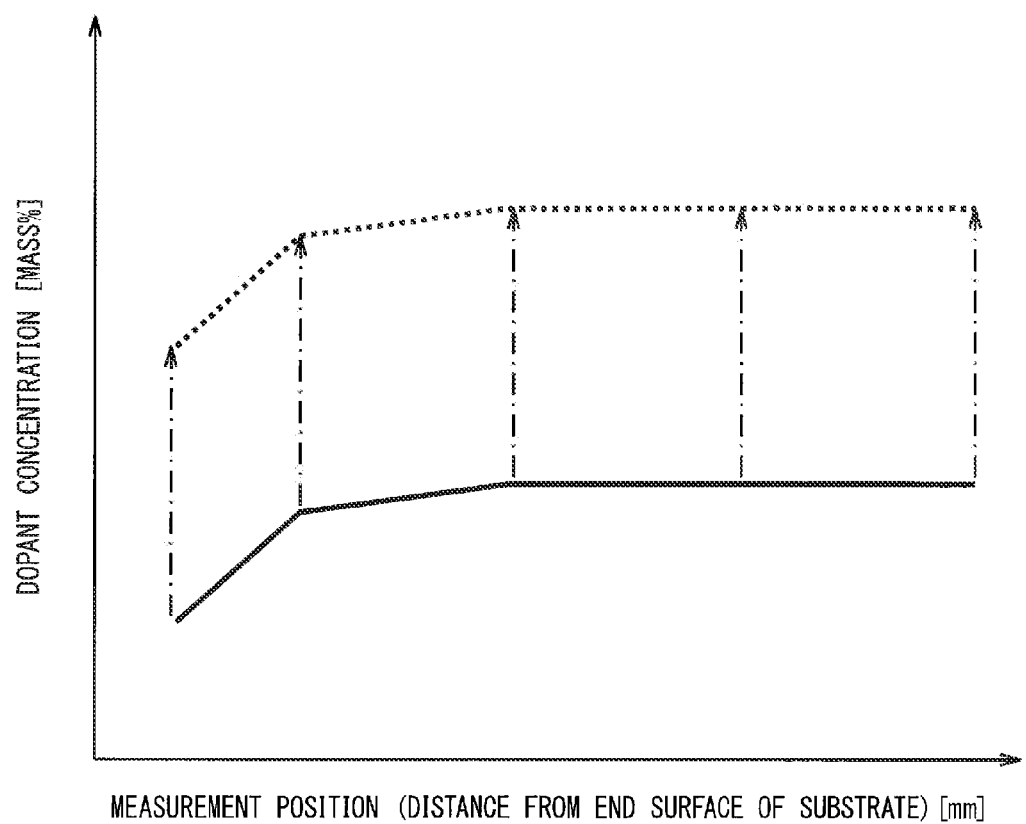
FIG. 11 is a graph illustrating an example of a distribution of a dopant concentration.

In the embodiment, as illustrated in FIG. 9, according to a forming condition of the first concentration region 1Ln, the sheet resistance ρs in the close region 1NA shows a tendency of increasing as approaching the one end portion side (−X side) of the semiconductor substrate 1 and decreasing as approaching the center portion side of the semiconductor substrate 1, in the X direction. At this time, the sheet resistance ρs in the close region 1NA is included in a value range Rr1. Here, as illustrated by a bold line in FIG. 11, the n-type dopant concentration in the close region 1NA shows a tendency of decreasing as approaching the one end portion side (−X side) of the semiconductor substrate 1 and increasing as approaching the center portion side of the semiconductor substrate 1, in the X direction.

Figure 12:
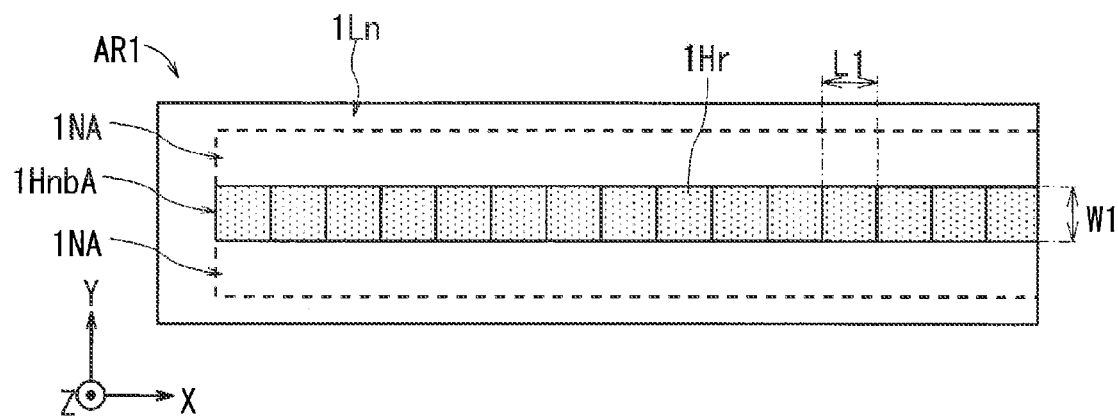
FIG. 12 is a plan view illustrating a reference example according to a configuration of the second concentration region.

Here, as illustrated in FIG. 12, it is assumed that the second line-shaped region 1Hnb is replaced with a second line-shaped region 1HnbA in which the frequency of occurrence of the plurality of high concentration regions 1Hr is set to be constant in the X direction (reference example). In this reference example, as illustrated by a dotted line in FIG. 11, regardless of the position in the X direction, with respect to the n-type dopant concentration in the close region 1NA, the n-type dopant concentration in the second line-shaped region 1HnbA increases with substantially the same tendency as that of the concentration distribution of the close region 1NA. In FIG. 10, a distribution of the sheet resistance ρs in the X direction in the second line-shaped region 1HnbA according to the reference example is illustrated by a bold dotted line. Here, the sheet resistance ρs in the second line-shaped region 1HnbA is included in a value range Rr2A.

In contrast, in the second line-shaped region 1Hnb according to the embodiment, as illustrated in FIGS. 8 and 9, according to the distribution of the n-type dopant concentration and the distribution of the sheet resistance ρs in the close region 1NA, the frequency of occurrence of the plurality of high concentration regions 1Hr in the X direction is adjusted. Accordingly, the n-type dopant concentration and the sheet resistance ρs in the second line-shaped region 1Hnb are adjusted, and as illustrated by the bold line in FIG. 10, the sheet resistance ρs in the second line-shaped region 1Hnb can be settled in the appropriate value range Rr2 which is narrower than the value range Rr2.

Here, adjustment of the n-type dopant concentration and the sheet resistance ρs in the second line-shaped region 1Hnb according to the embodiment will be described in order.

<(1-7-1) Adjustment of Dopant Concentration>

In the embodiment, in the second extending direction of the second line-shaped region 1Hnb, a difference (dopant concentration difference) in the n-type dopant concentration between the second line-shaped region 1Hnb and the close region 1NA which is close to the second line-shaped region 1Hnb in the first concentration region 1Ln changes. Here, the dopant concentration difference is a difference which can be obtained by subtracting the n-type dopant concentration in the close region 1NA from the n-type dopant concentration in the second line-shaped region 1Hnb.

Figure 13:
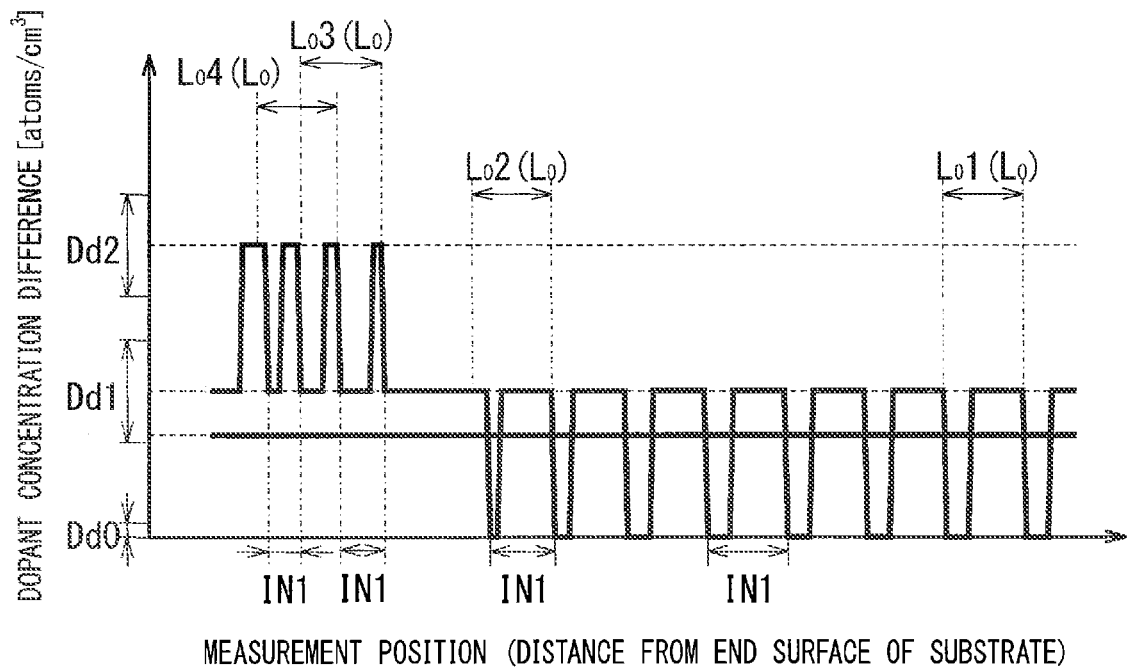
FIG. 13 is a graph illustrating a relationship between a measurement position in an extending direction and a dopant concentration difference.
Figure 14:
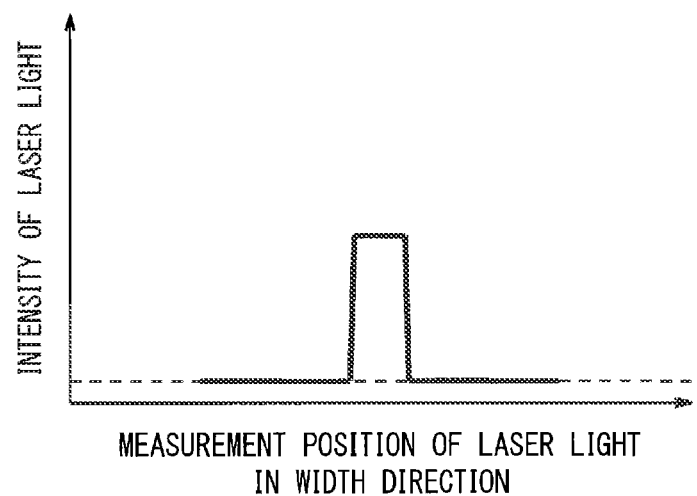
FIG. 14 is a graph illustrating an energy intensity distribution in laser light.

In FIG. 13, when each of the high concentration regions 1Hr is formed by using laser light which has a top-hat type intensity distribution illustrated in FIG. 14, an example of a detailed distribution of the dopant concentration difference regarding the second line-shaped region 1Hnb is illustrated by a bold line. The detailed distribution of the dopant concentration difference can be obtained by setting the measurement target region of the dopant concentration to be narrow. Specifically, a length in the X direction which is the second extending direction in the measurement target region may be approximately equal to or greater than 0.01 mm and equal to or less than 0.1 mm, for example. In FIG. 13, a distance from the end surface on the −X side of the semiconductor substrate 1 to the measurement position is illustrated on a horizontal axis, and the dopant concentration difference is illustrated on a vertical axis. In addition, in FIG. 13, an example of the distribution of the dopant concentration difference regarding the second line-shaped region 1HnbA according to the reference example illustrated in FIG. 12 is illustrated by a bold broken line.

As illustrated in FIG. 13, regarding the second line-shaped region 1Hnb according to the embodiment, the dopant concentration difference repeatedly increases or decreases in the X direction which is the second extending direction of the second line-shaped region 1Hnb. For example, as illustrated in a center portion from a right portion in FIG. 13, the dopant concentration difference repeatedly increases or decreases between a value range Dd0 of roughly zero as a first value range and a value range Dd1 as a second value range in the X direction. For example, it is sufficient that the value range Dd1 is a value range within a range of ±30% of a reference value having the preset reference value as a center. In this case, for example, if the reference value is set to be $1 \times 10^{20}$ atoms/cm$^3$, the value range Dd1 is a range which is equal to or greater than $0.7 \times 10^{20}$ atoms/cm$^3$ and equal to or less than $1.3 \times 10^{20}$ atoms/cm$^3$. In addition, for example, as illustrated in a left portion of FIG. 13, the dopant concentration difference is repeatedly increasing or decreasing between the value range Dd1 which is the first value range and a value range Dd2 which is a second value range in the X direction. For example, it is sufficient that the value range Dd2 is a value range within a range of ±30% of the reference values having the preset reference value as the center. In this case, for example, if the reference value is set to be $2 \times 10^{20}$ atoms/cm$^3$, the value range Dd2 is a range which is equal to or greater than $1.4 \times 10^{20}$ atoms/cm$^3$ and equal to or less than $2.6 \times 10^{20}$ atoms/cm$^3$. Note that a specific example of a range regarding the above-described value ranges Dd1 and Dd2 is merely an example, and the value ranges Dd1 and Dd2 are not limited to the above-described ranges. In addition, in the entire second concentration region 1Hn, the value range Dd1 and the value range Dd2 may be different according to the position. For example, each of the value range Dd1 and the value range Dd2 may not be a constant value range in the entire second concentration region 1Hn. In this case, for example, in a region of a preset size of the second semiconductor region 1n, an aspect in which the value range Dd1 and the value range Dd2 have a relative relationship may be employed. The region of the preset size may be a region which has 10 millimeters square, for example. More specifically, for example, in the preset region of the second semiconductor region 1n, a relationship between the value range Dd1 and the value range Dd2 in which a value which is obtained by dividing the value range Dd2 by the value range Dd1 is equal to or greater than 1.5 and equal to or less than 3, can be considered. In contrast, regarding the second line-shaped region 1HnbA according to the reference example, the dopant concentration difference is maintained to be substantially constant in the X direction which is the extending direction of the second line-shaped region 1HnbA.

Regarding the second line-shaped region 1Hnb, in the X direction, according to decrease of the n-type dopant concentration in the close region 1NA, an occupancy rate of a section in which the dopant concentration difference is included in the second value range among sections of a unit length $L_0$ increases. For example, as illustrated in the center portion from the right portion of FIG. 13, the occupancy rate of the section in which the dopant concentration difference is included in the value range Dd1 serving as the second value range among the sections of the unit length $L_0$ increases, as moving to the −X side. As illustrated in the left portion of FIG. 13, as moving to the −X side, the occupancy rate of a section in which the dopant concentration difference is included in the value range Dd2 serving as the second value range among the sections of the unit length $L_0$ increases. Accordingly, the dopant concentration in the second line-shaped region 1Hnb which is formed by using a part having a relatively low dopant concentration in the first concentration region 1Ln as a base portion can appropriately increase. As a result, the distribution of the sheet resistance ρs in the second line-shaped region 1Hnb can be narrow and can be settled in an appropriate value range.

Here, for example, it is sufficient that the unit length $L_0$ is longer than a length L1 in the X direction of the high concentration regions 1Hr, and for example, the unit length $L_0$ can be set to be equal to or greater than 1.1 times and equal to or less than several times of the length L1. For example, when the length L1 is approximately 200 μm, the unit length $L_0$ is set to be approximately 280 μm. In FIG. 13, sections from $L_0 1$ to $L_0 4$ having the unit length $L_0$ are illustrated. The sections from $L_0 1$ to $L_0 4$ are provided in this order toward the end portion of the −X side from the center portion of the semiconductor substrate 1.

Here, the occupancy rate of the section in which the dopant concentration difference is included in the value range Dd1 serving as the second value range in the section $L_0 2$ is greater than the occupancy rate of the section in which the dopant concentration difference is included in the value range Dd1 serving as the second value range in the section $L_0 1$. Here, in the X direction, according to a decrease in the separation distance Ds1 which is a distance between the adjacent high concentration regions 1Hr, the occupancy rate of the section in which the dopant concentration difference is included in the value range Dd1 serving as the second value range among the sections of the unit length $L_0$ increases. Accordingly, regarding the second line-shaped region 1Hnb, in the X direction which is the second extending direction of the second line-shaped region 1Hnb, the occupancy rate of the section in which the dopant concentration difference is included in the value range Dd1 serving as the second value range among the sections of the unit length $L_0$ can easily increase.

As illustrated in FIGS. 8 and 13, the plurality of high concentration regions 1Hr include a single arrangement region 1Sb as the first high concentration region and an overlapped region 1Sc as the second high concentration region. Here, the dopant concentration difference regarding the single arrangement region 1Sb is included in the value range Dd1 serving as the first value range. In addition, the dopant concentration difference in the overlapped region 1Sc is included in the value range Dd2 serving as the second value range which is larger than the value range Dd1. In other words, in the X direction, the single arrangement region 1Sb having the dopant concentration difference of the value range Dd1 and the overlapped region 1Sc having the dopant concentration difference of the value range Dd2 repeatedly exist.

Here, the occupancy rate of the section in which the dopant concentration difference is included in the value range Dd2 serving as the second value range in the section $L_0 4$ is greater than the occupancy rate of the section in which the dopant concentration difference is included in the value range Dd2 serving as the second value range in the section $L_0 3$. Here, in the X direction, according to an increase in the overlapped length Ls1 in which the plurality of high concentration regions 1Hr are overlapped with each other, the occupancy rate of the section in which the dopant concentration difference is included in the value range Dd2 serving as the second value range among the sections of the unit length $L_0$ increases. Accordingly, regarding the second line-shaped region 1Hnb, in the X direction which is the second extending direction of the second line-shaped region 1Hnb, the occupancy rate of the section in which the dopant concentration difference is included in the value range Dd2 serving as the second value range among the sections of the unit length $L_0$ can easily increase.

In other words, the occupancy rate of the section in which the dopant concentration difference is included in the second value range among the sections of the unit length $L_0$ is greater on the one end portion side (−X side) than that on the center portion side in the X direction which is the second extending direction of the second line-shaped region 1Hnb. In the center portion from the right portion of FIG. 13, and in the left portion of FIG. 13, a state where the occupancy rate increases as moving to the −X side is illustrated. Accordingly, in the second extending direction (X direction) of the second line-shaped region 1Hnb, even in a case where the n-type dopant concentration in the close region 1NA decreases as approaching the one end portion side (−X side) of the semiconductor substrate 1, the n-type dopant concentration in the second line-shaped region 1Hnb can further increase. As a result, the distribution of the dopant concentration in the second line-shaped region 1Hnb can be narrow and can be settled in a high value range. Therefore, the distribution of the sheet resistance ρs in the second line-shaped region 1Hnb can be narrow and can be settled in an appropriate value range.

Figure 15:
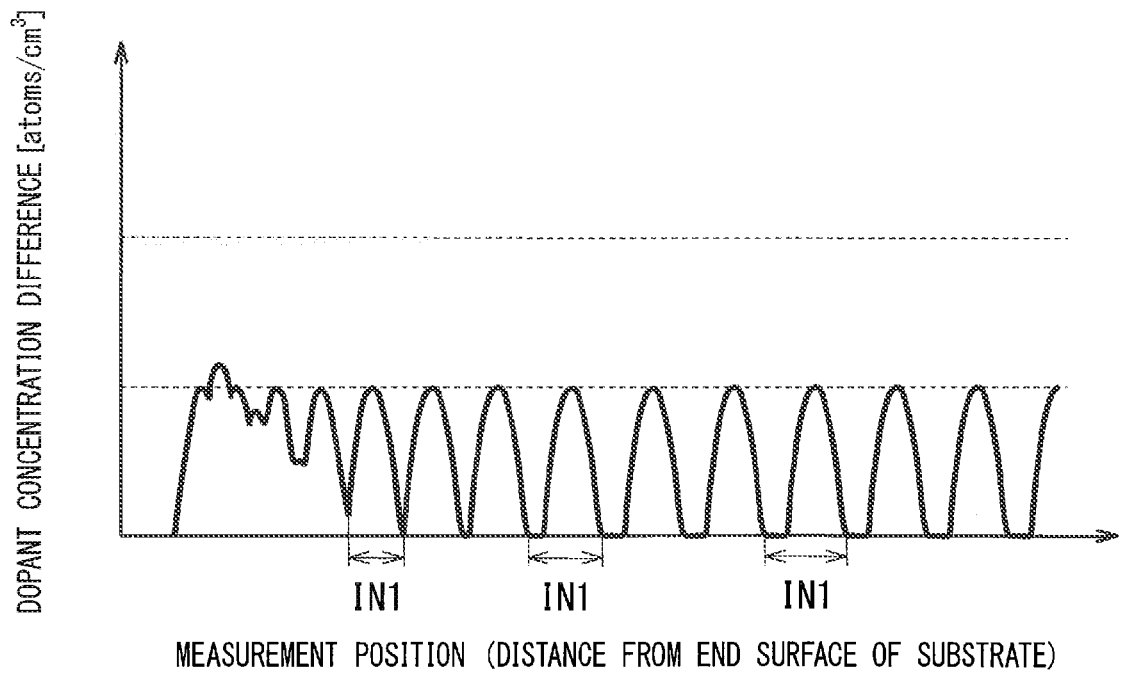
FIG. 15 is a graph illustrating the relationship between the measurement position in the extending direction and the dopant concentration difference.
Figure 16:
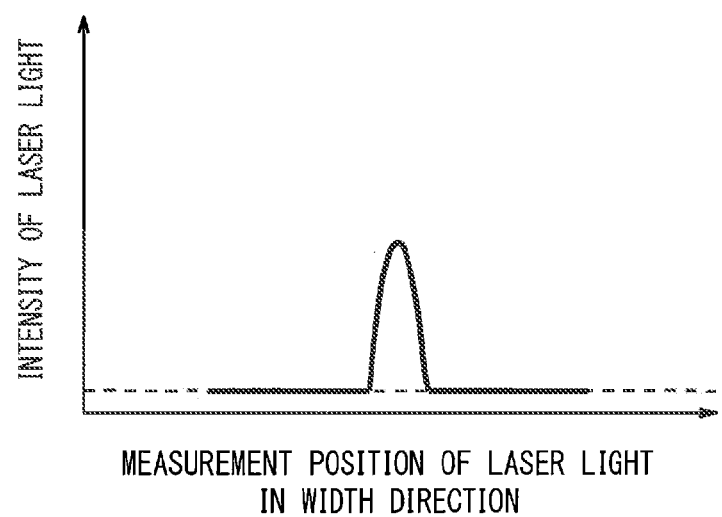
FIG. 16 is a graph illustrating the energy intensity distribution in the laser light.

Meanwhile, in FIG. 15, when laser light having a non-top-hat type intensity distribution illustrated in FIG. 16 is used, an example of a detailed distribution of the dopant concentration difference regarding the second line-shaped region 1Hnb is illustrated by a bold line. The detailed distribution of the dopant concentration difference can be obtained when the measurement target region of the dopant concentration is set to be narrow. In FIG. 15, similarly to FIG. 13, the distance from the end surface on the −X side to the measurement position of the semiconductor substrate 1 is illustrated on a horizontal axis, and the dopant concentration difference is illustrated on a vertical axis.

Here, as illustrated in FIGS. 13 and 15, a change in the dopant concentration difference is focused which is obtained by subtracting the dopant concentration value at a place which is close to a one place in the first concentration region 1Ln from the dopant concentration value at the one place in the second line-shaped region 1Hnb. Note that the one place and the place which is close to the one place may be close to each other in the Y direction. The place which is close to the one place may be included in the close region 1NA, for example. Here, in the X direction which is the second extending direction of the second line-shaped region 1Hnb, the minimum place which has the minimum value of the dopant concentration difference and the maximum place which has the maximum value of the dopant concentration difference alternately and repeatedly exist. In the X direction which is the second extending direction, a part in which an interval (minimum place interval) IN1 between one end portions of the adjacent minimum places varies exists. In addition, in the second line-shaped region 1Hnb, one end portion of the minimum place is an end portion on the −X side of the minimum place. In other words, one end portion of the minimum place in the second line-shaped region 1Hnb is a part in which the dopant concentration difference decreases and reaches the minimum place as moving forward from the end surface side of the semiconductor substrate 1 in the −X direction.

Here, according to the dopant concentration in the close region 1NA which is close to the second line-shaped region 1Hnb, the minimum place interval IN1 appropriately varies, and thereby the second conductivity type dopant concentration in the second line-shaped region 1Hnb is appropriately adjusted. Accordingly, the second conductivity type dopant concentration in the second line-shaped region 1Hnb which is formed by using a part having a relatively low second conductivity type dopant concentration in the first concentration region 1Ln as a base portion can appropriately increase. As a result, the distribution of the sheet resistance ρs in the second line-shaped region 1Hnb can be narrow and can be settled in an appropriate value range. Therefore, by improving the boundary part between the semiconductor substrate 1 and the second electrode 5, the conversion efficiency of the solar cell element 10 can be improved.

For example, there is a part in which the minimum place interval IN1 widens along the second extending direction (X direction). In other words, according to the decrease of the dopant concentration in the close region 1NA, there is a part in which the minimum place interval IN1 becomes gradually narrow along a direction (−X direction) which is reverse to the second extending direction (X direction). For example, when the plurality of high concentration regions 1Hr are arranged, as the separation distance Ds1 between the adjacent high concentration regions 1Hr becomes short along the −X direction, the minimum place interval IN1 becomes gradually narrow. In the vicinity of the center portions from the right portions in FIGS. 13 and 15, a state is illustrated where the plurality of high concentration regions 1Hr are arranged in the second extending direction (X direction), and the minimum place interval IN1 becomes gradually narrow as the separation distance Ds1 between the adjacent high concentration regions 1Hr becomes short along the −X direction. In addition, in the left portion of FIG. 13, a state is illustrated where the minimum place interval IN1 becomes gradually narrow as the overlapped length Ls1 of the high concentration regions 1Hr along the −X direction becomes long. Accordingly, the dopant concentration can appropriately increase in the second line-shaped region 1Hnb which is formed by using the part having a relatively low dopant concentration in the first concentration region 1Ln as a base portion. As a result, the distribution of the sheet resistance ρs in the second line-shaped region 1Hnb can be narrow and can be settled in an appropriate value range.

In addition, in other words, the minimum place interval IN1 in the one end portion (a part on the −X side) of the second line-shaped region 1Hnb is narrower than the minimum place interval IN1 in the center portion of the second line-shaped region 1Hnb. In FIGS. 13 and 15, in the second extending direction (X direction), a state is illustrated where the minimum place interval IN1 in the one end portion (a part on the −X side) of the second line-shaped region 1Hnb is narrower than the minimum place interval IN1 in the center portion of the second line-shaped region 1Hnb. According to this configuration, in the second extending direction (X direction), even when the n-type dopant concentration in the close region 1NA decreases as approaching the one end portion (a part on the −X side) of the semiconductor substrate 1, the n-type dopant concentration in the second line-shaped region 1Hnb can appropriately increase. As a result, the distribution of the dopant concentration in the second line-shaped region 1Hnb can be narrow and can be settled in a high value range. Therefore, the distribution of the sheet resistance ρs in the second line-shaped region 1Hnb can be narrow and can be settled in an appropriate value range.

<(1-7-2) Adjustment of Sheet Resistance>

In the embodiment, in the second extending direction of the second line-shaped region 1Hnb, the difference (sheet resistance difference) of the sheet resistance ρs between the second line-shaped region 1Hnb and the close region 1NA which is close to the second line-shaped region 1Hnb in the first concentration region 1Ln changes. Here, the sheet resistance difference is a difference which can be obtained by subtracting the sheet resistance in the second line-shaped region 1Hnb from the sheet resistance in the close region 1NA.

Figure 17:
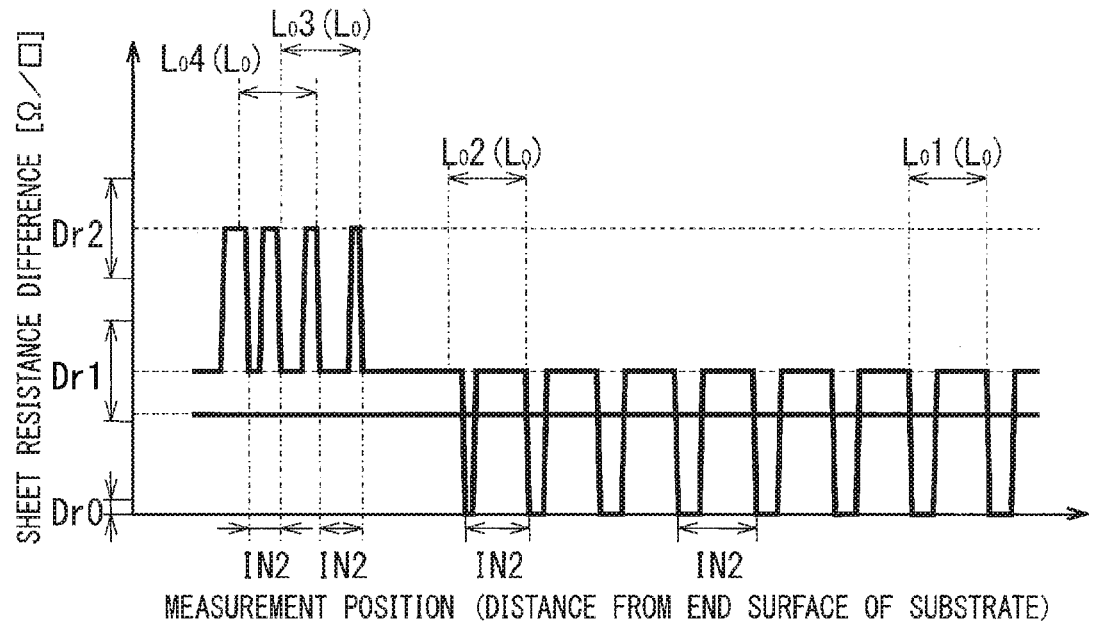
FIG. 17 is a graph illustrating a relationship between the measurement position in the extending direction and a sheet resistance difference.

In FIG. 17, an example of the detailed distribution of the sheet resistance difference regarding the second line-shaped region 1Hnb is described by a bold line. The detailed distribution of the sheet resistance difference can be obtained by setting the measurement target region of the sheet resistance ρs to be narrow. For example, a method of setting the distance between the probes in the four-probe method to be narrow or a method of setting the measurement target region by the SIMS to be narrow, may be employed. Specifically, it is sufficient that the length of the second line-shaped region 1Hnb in the X direction which is the second extending direction in the measurement target region is set to be approximately equal to or greater than 0.01 mm and equal to or less than 0.1 mm, for example. In FIG. 17, the distance from the end surface on the −X side to the measurement position of the semiconductor substrate 1 is illustrated on a horizontal axis, and the sheet resistance difference is illustrated on a vertical axis. In addition, in FIG. 17, an example of the distribution of the sheet resistance difference regarding the second line-shaped region 1HnbA according to the reference example illustrated in FIG. 12 is illustrated by the bold dotted line.

As illustrated in FIG. 17, regarding the second line-shaped region 1Hnb according to the embodiment, the sheet resistance difference repeats increasing or decreasing in the second extending direction (X direction) of the second line-shaped region 1Hnb. For example, as illustrated in a center portion from a right portion in FIG. 17, the sheet resistance difference repeats increasing or decreasing between a roughly zero value range Dr0 serving as the first value range and a value range Dr1 serving as the second value range in the X direction. For example, it is sufficient that the value range Dr1 is a value range in a range of ±20% of the reference value having the preset reference value as a center. In this case, for example, if the reference value is set to be 50 Ω/□, the value range Dr1 is a range in which the value is equal to or greater than 40 Ω/□ and equal to or less than 60 Ω/□. In addition, for example, as illustrated in a left portion in FIG. 17, the sheet resistance difference repeats increasing or decreasing between the value range Dr1 serving as the first value range and a value range Dr2 serving as the second value range in the X direction. For example, it is sufficient that the value range Dr2 is a value range within a range of ±20% of the reference value having the preset reference value as a center. In this case, for example, if the reference value is set to be 80 Ω/□, the value range Dr2 is a range in which the value is equal to or greater than 64 Ω/□ and equal to or less than 96 Ω/□. A specific example of the formula range in the above-described value ranges Dr1 and Dr2 are merely an example, and the value ranges Dr1 and Dr2 are not limited to the above-described formula range. In addition, in the entire second concentration region 1Hn, the value range Dr1 and the value range Dr2 may be different according to the position. In other words, for example, each of the value range Dr1 and the value range Dr2 may not be a constant value range in the entire second concentration region 1Hn. In this case, for example, in a region of a preset size of the second semiconductor region 1n, an aspect in which the value range Dr1 and the value range Dr2 have a relative relationship may be employed. It is sufficient that the region of the preset size is a region which has 10 millimeters square, for example. More specifically, for example, in the preset region of the second semiconductor region 1n, an aspect having a relationship between the value range Dr1 and the value range Dr2 in which a value which is obtained by dividing the value range Dr2 by the value range Dr1 is equal to or greater than 1.2 and equal to or less than 2.8, can be considered. In contrast, regarding the second line-shaped region 1HnbA according to the reference example, the sheet resistance difference is maintained to be substantially constant in the X direction which is the extending direction of the second line-shaped region 1HnbA.

Regarding the second line-shaped region 1Hnb, in the X direction, according to an increase in the sheet resistance difference in the close region 1NA, an occupancy rate of a section in which the sheet resistance is included in the second value range among the sections of a unit length $L_0$ increases. For example, as illustrated in the center portion from the right portion of FIG. 17, as moving to the –X side, the occupancy rate of a section in which the sheet resistance difference is included in the value range Dr1 serving as the second value range among the sections of the unit length $L_0$ increases. As illustrated in the left portion of FIG. 17, as moving to the –X side, the occupancy rate of a section in which the sheet resistance difference is included in the value range Dr2 serving as the second value range among the sections of the unit length $L_0$ increases. Accordingly, the sheet resistance ρs can appropriately decrease in the second line-shaped region 1Hnb which is formed by using a part having a relatively high sheet resistance in the first concentration region 1Ln as a base portion. As a result, the distribution of the sheet resistance ρs in the second line-shaped region 1Hnb can be narrow and can be settled in an appropriate value range.

In FIG. 17, similarly to FIG. 13, the sections $L_0 1$ to $L_0 4$ having the unit length $L_0$ are illustrated. The sections $L_0 1$ to $L_0 4$ are provided in this order toward the end portion of the –X side from the center portion of the semiconductor substrate 1.

Here, the occupancy rate of the section in which the sheet resistance difference is included in the value range Dr1 serving as the second value range in the section $L_0 2$ is greater than the occupancy rate of the section in which the sheet resistance difference is included in the value range Dr1 serving as the second value range in the section $L_0 1$. Here, in the X direction, according to a decrease in the separation distance Ds1 which is an interval between the adjacent plural high concentration regions 1Hr, the occupancy rate of the section in which the sheet resistance difference is included in the value range Dr1 serving as the second value range among the sections of the unit length $L_0$ increases. Accordingly, regarding the second line-shaped region 1Hnb, in the X direction which is the second extending direction of the second line-shaped region 1Hnb, the occupancy rate of the section in which the sheet resistance difference is included in the value range Dr1 serving as the second value range among the sections of the unit length $L_0$ can easily increase.

In addition, as illustrated in FIGS. 8 and 13, the plurality of high concentration regions 1Hr include the single arrangement region 1Sb as the first high concentration region and the overlapped region 1Sc as the second high concentration region. Here, as illustrated in FIG. 17, the sheet resistance difference regarding the single arrangement region 1Sb is included in the value range Dr1 serving as the first value range. In addition, the sheet resistance difference regarding the overlapped region 1Sc is included in the value range Dr2 serving as the second value range which is larger than the value range Dr1. In other words, in the X direction, the single arrangement region 1Sb having the sheet resistance difference of the value range Dr1 and the overlapped region 1Sc having the sheet resistance difference of the value range Dr2 repeatedly exist.

Here, the occupancy rate of the section in which the sheet resistance difference is included in the value range Dr2 serving as the second value range in the section $L_0 4$ is greater than the occupancy rate of the section in which the sheet resistance difference is included in the value range Dr2 serving as the second value range in the section $L_0 3$. Here, in the X direction, according to an increase in the overlapped length Ls1 in which the plurality of high concentration regions 1Hr are overlapped with each other, the occupancy rate of the section in which the sheet resistance difference is included in the value range Dr2 serving as the second value range among the sections of the unit length $L_0$ increases. Accordingly, regarding the second line-shaped region 1Hnb, in the X direction which is the extending direction of the second line-shaped region 1Hnb, the occupancy rate of the section in which the sheet resistance difference is included in the value range Dr2 serving as the second value range among the sections of the unit length $L_0$ can easily increase.

In addition, in other words, the occupancy rate of the section in which the sheet resistance difference is included in the second value range among the sections of the unit length $L_0$ is greater on the one end portion side (–X side) than that on the center portion side in the X direction which is the second extending direction of the second line-shaped region 1Hnb. In the center portion from the right portion of FIG. 17 and in the left portion of FIG. 17, a state where the occupancy rate increases as moving to the –X side is illustrated. Accordingly, in the extending direction (X direction) of the second line-shaped region 1Hnb, even in a case where the sheet resistance ρs in the close region 1NA increases as approaching the one end portion side (–X side) of the semiconductor substrate 1, the sheet resistance ρs in the second line-shaped region 1Hnb can further decrease. As a result, the distribution of the sheet resistance ρs in the second line-shaped region 1Hnb can be narrow and can be settled in an appropriate value range.

Figure 18:
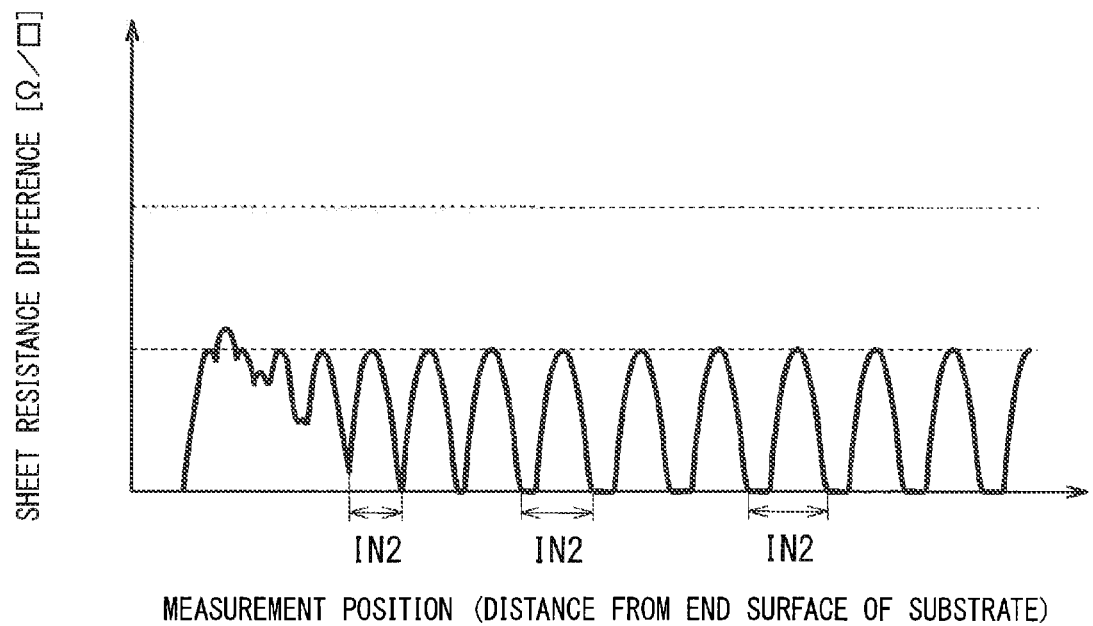
FIG. 18 is a graph illustrating the relationship between the measurement position in the extending direction and the sheet resistance difference.

Meanwhile, in FIG. 18, an example of the detailed distribution of the sheet resistance difference regarding the second line-shaped region 1Hnb when laser light having a non-top-hat type intensity distribution illustrated in FIG. 16 is used, is illustrated by a bold line. The detailed distribution of the sheet resistance difference can be obtained by setting the measurement target region of the sheet resistance ρs to be narrow. In FIG. 18, similarly to FIG. 17, the distance from the end surface on the –X side to the measurement position of the semiconductor substrate 1 is illustrated on a horizontal axis, and the sheet resistance difference is illustrated on a vertical axis.

Here, as illustrated in FIGS. 17 and 18, a change in the sheet resistance difference which is obtained by subtracting the sheet resistance ρs value at a one place in the second line-shaped region 1Hnb from the sheet resistance ρs value at a place which is close to the one place in the first concentration region 1Ln, is focused. For example, the one place and the place which is close to the one place may be close to each other in the Y direction. It is sufficient that the place which is close to the one place is included in the close region 1NA, for example. Here, in the X direction which is the second extending direction of the second line-shaped region 1Hnb, the minimum place which has the minimum value of the sheet resistance difference and the maximum place which has the maximum value of the sheet resistance difference alternately and repeatedly exist. In the X direction which is the second extending direction, a part in which an interval (minimum place interval) IN2 between one end portions of the adjacent minimum places varies exists. In addition, in the second line-shaped region 1Hnb, one end portion of the minimum place is an end portion on the −X side of the minimum place. In other words, one end portion of the minimum place in the second line-shaped region 1Hnb is a part in which the sheet resistance difference decreases as moving forward from the end surface side of the semiconductor substrate 1 in the −X direction and reaches the minimum place.

Here, according to the sheet resistance ρs in the close region 1NA which is close to the second line-shaped region 1Hnb, as the minimum place interval IN2 appropriately varies, the sheet resistance ρs in the second line-shaped region 1Hnb can be appropriately adjusted. Accordingly, the second conductivity type sheet resistance ρs in the second line-shaped region 1Hnb which is formed by using a part having a relatively high second conductivity type sheet resistance ρs in the first concentration region 1Ln as a base portion can appropriately decrease. As a result, the distribution of the sheet resistance ρs in the second line-shaped region 1Hnb can be narrow and can be settled in an appropriate value range. Therefore, by improving the boundary part between the semiconductor substrate 1 and the second electrode 5, the conversion efficiency of the solar cell element 10 can be improved.

In addition, for example, there is a part in which the minimum place interval IN2 widens along the second extending direction (X direction). In other words, there is a part in which the minimum place interval IN2 becomes gradually narrow along a direction (−X direction) which is reverse to the second extending direction (X direction) according to the decrease of the dopant concentration in the close region 1NA. For example, when the plurality of high concentration regions 1Hr are arranged, as the separation distance Ds1 between the adjacent high concentration regions 1Hr becomes short along the −X direction, the minimum place interval IN2 becomes gradually narrow. In the vicinity of the center portions from the right portions in FIGS. 17 and 18, a state is illustrated where the plurality of high concentration regions 1Hr are arranged in the second extending direction (X direction), and the minimum place interval IN2 becomes gradually narrow as the separation distance Ds1 between the adjacent high concentration regions 1Hr becomes short along the −X direction. In addition, in the left portion of FIG. 17, a state is illustrated where the minimum place interval IN2 becomes gradually narrow as the overlapped length Ls1 of the high concentration region 1Hr becomes long along the −X direction. Accordingly, the sheet resistance ρs can appropriately decrease in the second line-shaped region 1Hnb which is formed by using the part having a relatively high sheet resistance ρs in the first concentration region 1Ln as a base portion. As a result, the distribution of the sheet resistance ρs in the second line-shaped region 1Hnb can be narrow and can be settled in an appropriate value range.

In addition, in other words, the minimum place interval IN2 in the one end portion (a part on the −X side) of the second line-shaped region 1Hnb is narrower than the minimum place interval IN2 in the center portion of the second line-shaped region 1Hnb. For example, in FIGS. 17 and 18, a state is illustrated where the minimum place interval IN2 in the one end portion (a part on the −X side) of the second line-shaped region 1Hnb is narrower than the minimum place interval IN2 in the center portion of the second line-shaped region 1Hnb in the second extending direction (X direction). According to this configuration, in the second extending direction (X direction), even when the sheet resistance ρs in the close region 1NA increases as approaching the one end portion (a part on the −X side) of the semiconductor substrate 1, the sheet resistance ρs in the second line-shaped regions 1Hnb can appropriately decrease. As a result, the distribution of the sheet resistance ρs in the second line-shaped region 1Hnb can be narrow and can be settled in an appropriate value range.

When the second concentration region is formed by the laser radiation, not only the dopant concentration and the sheet resistance value, but also a fine shape of the surface of the irradiation location is different from those of the other regions. Accordingly, for example, it is possible to distinguish both regions by the colors of the surface of elements which are different from each other when observing by an optical microscope. In addition, by using a difference in life time of the carriers due to the dopant concentration difference between the first concentration region and the second concentration region, it is possible to observe the distribution of the second concentration region by optical current mapping measurement which uses methods, such as an electron beam induced current (EBIC) method or a laser beam induced current (LBIC) method. Along the extending direction of the second concentration region in the embodiment, as the interval of the second concentration region observed by these methods varies, it is possible to realize an appropriate adjustment of the dopant concentration (sheet resistance) of the second concentration region which is formed by using a part in which the dopant concentration (sheet resistance) of the first concentration region is different as a base portion.

(1-8) Method for Manufacturing Solar Cell Element

Figure 19:
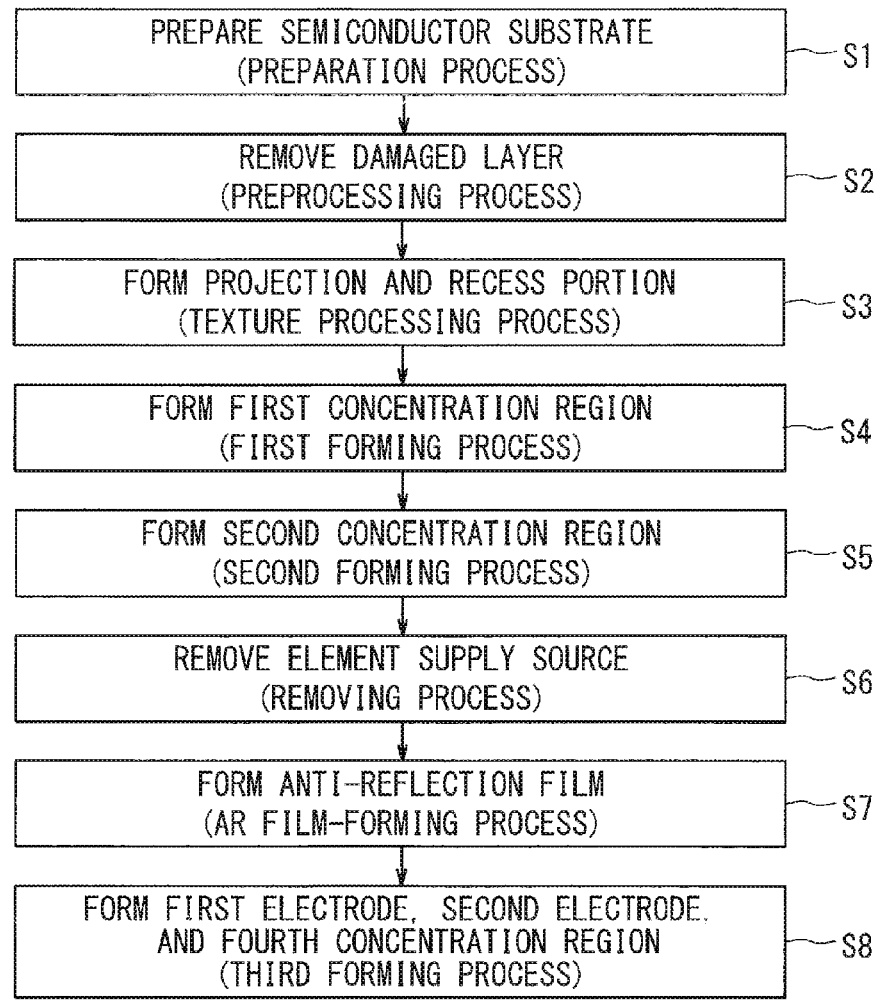
FIG. 19 is a flow chart illustrating a manufacturing flow of the solar cell element according to the embodiment.
Figure 20:
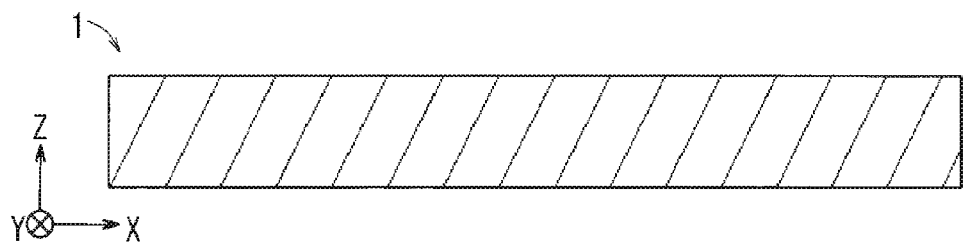
FIG. 20 is a cross-sectional view illustrating a state in the middle of manufacturing of the solar cell element according to the embodiment.
Figure 21:
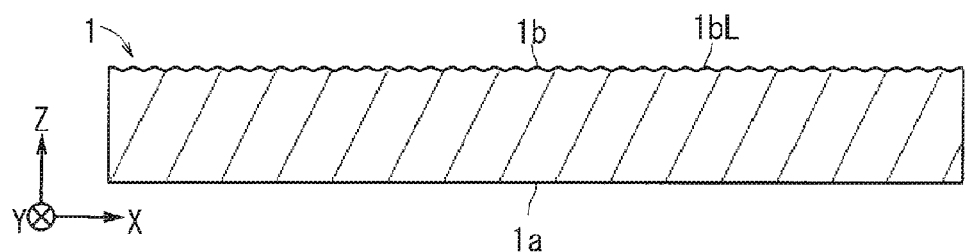
FIG. 21 is a cross-sectional view illustrating a state in the middle of manufacturing of the solar cell element according to the embodiment.
Figure 22:
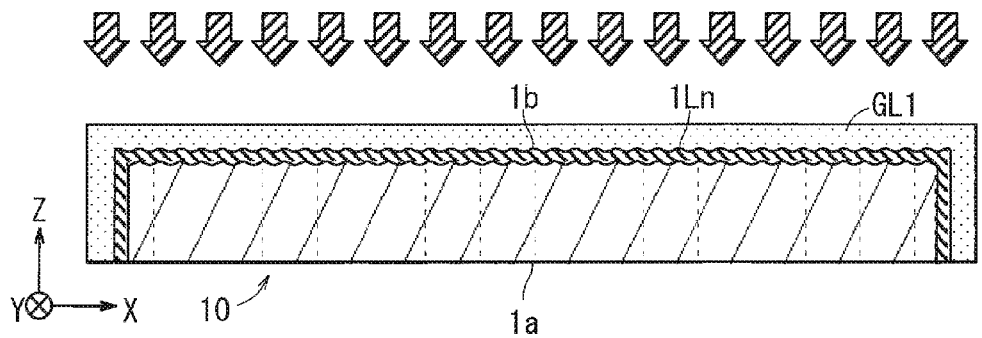
FIG. 22 is a cross-sectional view illustrating a state in the middle of manufacturing of the solar cell element according to the embodiment.

Here, an example of a manufacturing process of the solar cell element 10 having the above-described configuration will be described. As illustrated in FIG. 19, as steps S1 to S8 are performed in order, the solar cell element 10 is manufactured. Hereinafter, each of the steps S1 to S8 will be described in order.

<(1-8-1) Preparation Process>

In a step S1, a process (preparation process) of preparing the semiconductor substrate 1 (refer to FIG. 20) is performed. In the embodiment, the p-type semiconductor substrate 1 as the first conductivity type is prepared. Here, when the semiconductor substrate 1 is a monocrystal silicon substrate, for example, the semiconductor substrate 1 is formed by using a floating zone (FZ) method or the like. In addition, when the semiconductor substrate 1 is a polycrystal silicon substrate, for example, the semiconductor substrate 1 is formed by using a casting method or the like. In this case, for example, first, an ingot of the polycrystal silicon as a semiconductor material is made by the casting method. Next, for example, as the ingot is thinly sliced by a thickness which is equal to or less than 200 μm, the semiconductor substrate 1 is formed. Here, for example, it is sufficient that the semiconductor substrate 1 has a rectangular plate surface having 156 mm on one side. For example, it is sufficient that the semiconductor substrate 1 is a p-type conductivity type by B doping. It is sufficient that specific resistance of the semiconductor substrate 1 is equal to or greater than 1 Ω·cm and equal to or less than 2 Ω·cm.

<(1-8-2) Preprocessing Process>

In a step S2, a process (preprocessing process) of removing a damaged layer from the surface of the semiconductor substrate 1 is performed. For example, the damaged layer is a layer which has a mechanical damage and contamination which are caused on a sliced surface of the semiconductor substrate 1 when the semiconductor substrate 1 is thinly sliced in the step S1. Here, for example, with respect to the surface of the semiconductor substrate 1, the damaged layer is removed by performing an extremely small amount of etching by an alkaline or acid solution. As the alkaline solution, for example, an aqueous solution, such as NaOH or KOH, may be employed. As the acid solution, an aqueous solution, such as the HF or a fluonitric acid, may be employed.

<(1-8-3) Texture Processing Process>

In a step S3, a process (texture processing process) of forming the projection and recess portion 1$b$L (refer to FIG. 21) on the second main surface 1$b$ is performed. Here, for example, when etching processing is performed by an acid aqueous solution at least on the second main surface 1$b$ in the semiconductor substrate 1, the projection and recess portion 1$b$L is formed. As the etching processing, for example, wet etching which uses the alkaline solution, such as NaOH or the acid solution, such as the fluonitric acid, or dry etching which uses the RIE or the like, can be employed.

<(1-8-4) First Forming Process>

In a step S4, a process (first forming process) of forming the n-type first concentration region 1Ln (refer to FIG. 22) as the second conductivity type in the surface layer portion on the second main surface 1$b$ side which is the one main surface in the semiconductor substrate 1 is performed. Here, the first concentration region 1Ln in which the n-type dopant concentration is in the first concentration range is formed by introducing the element which becomes the n-type dopant into the surface layer portion on the second main surface 1$b$ side in the semiconductor substrate 1 by diffusion. It is sufficient that the dopant concentration of the first concentration region may be approximately from $1 \times 10^{18}$ atm/cm$^3$ to $1 \times 10^{20}$ atm/cm$^3$, for example. In addition, at this time, a layer-shaped element supply source GL1 (refer to FIG. 22) including the element which becomes the n-type dopant is formed on the first concentration region 1Ln. When the second concentration region 1Hn is formed in a step S5, the element supply source GL1 serves as a supply source of the element which becomes the n-type dopant.

Here, for example, after cleaning the surface of the semiconductor substrate 1 by the HF or the like, the semiconductor substrate 1 is disposed in a heating furnace 20. In the heating furnace 20 (refer to FIG. 23), in the atmosphere of the raw material gas including the element (for example, P) which becomes the n-type dopant, a heat treatment is performed on the semiconductor substrate 1. At this time, the first concentration region 1Ln is formed by introducing the element, which becomes the n-type dopant, included in the raw material gas into the surface layer portion on the second main surface 1$b$ side of the semiconductor substrate 1 by diffusion. It is sufficient that a thickness of the first concentration region 1Ln is approximately equal to or greater than 0.1 μm and equal to or less than 1 μm, for example.

Figure 23:
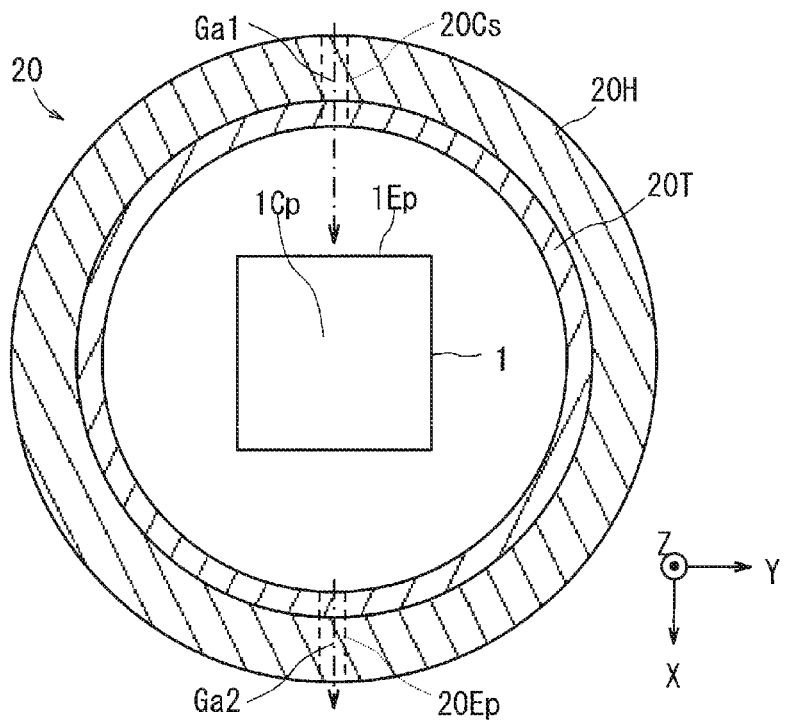
FIG. 23 is a cross-sectional view illustrating a configuration of a heating furnace.
Figure 24:
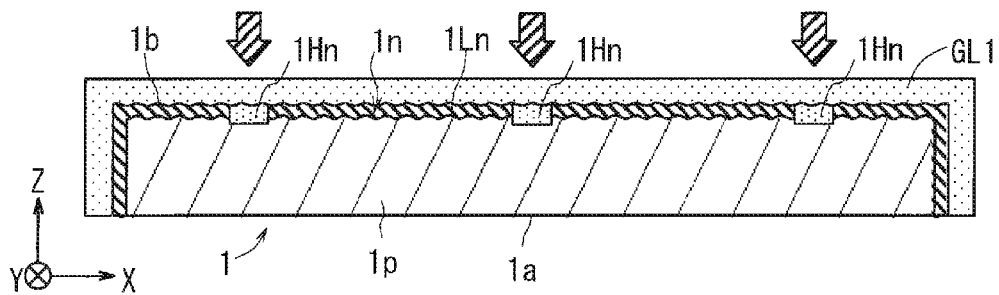
FIG. 24 is a cross-sectional view illustrating a state in the middle of manufacturing of the solar cell element according to the embodiment.

As illustrated in FIG. 23, the heating furnace 20 is provided with a pipe (quartz pipe) 20T made of quartz and a heater 20H which is placed in the periphery of a quartz pipe 20T. In addition, in the heating furnace 20, a gas supply path 20Cs which supplies raw material gas Ga1 to the inside of the quartz pipe 20T, and a gas discharge path 20Ep which discharges gas Ga2 from the inside of the quartz pipe 20T, are provided. The raw material gas Ga1 is a gas which contains the element which becomes the n-type dopant of the second conductivity type.

For example, in the heating furnace 20, a cassette made of quartz in which 10 or more and 1000 or less semiconductor substrates 1 are disposed is attached to the inside of the quartz pipe 20T. After a lid of the quartz pipe 20T is closed, the heat treatment is performed with respect to each semiconductor substrate 1. It is sufficient that a temperature raising rate in the heat treatment is equal to or greater than 1° C./minute and equal to or less than 100° C./minute, for example. However, if the temperature raising rate is equal to or greater than 20° C./minute and equal to or less than 50° C./minute, it is possible to shorten the time required for the heat treatment and stabilize the temperature raising. In addition, at this time, it is sufficient that the semiconductor substrate 1 is heated within a range from 300° C. to 900° C. Here, when the semiconductor substrate 1 is heated within a range from 750° C. to 900° C., the time required for the heat treatment can be shortened. In addition, here, for example, when the semiconductor substrate 1 is maintained for a first predetermined time in the temperature range after raising the temperature, the temperature of the semiconductor substrate 1 can be uniform. The first predetermined time may be equal to or greater than 1 minute and equal to or less than 20 minutes, for example. Subsequently, the semiconductor substrate 1 is maintained for a second predetermined time within the temperature range after raising the temperature, O$_2$ gas and N$_2$ gas are used as carrier gas, and POCl$_3$ gas is introduced into the quartz pipe 20T as the raw material gas Ga1 at equal to or greater than 1 sccm and equal to or less than 10000 sccm of flux. The second predetermined time may be equal to or greater than 1 minute and equal to or less than 200 minutes, for example. At this time, the PSG layer as the element supply source GL1 is formed on the surface of the semiconductor substrate 1, and P is introduced into the surface layer portion of the semiconductor substrate 1 by diffusion. Next, gas is stopped to be supplied to the inside of the quartz pipe 20T, and the semiconductor substrate 1 is maintained for 1 or more minutes and 200 or less minutes within a predetermined maintaining temperature range. It is sufficient that the predetermined maintaining temperature range is from 800° C. to 950° C. At this time, P is further introduced into the surface layer portion of the semiconductor substrate 1 by diffusion. Subsequently, the semiconductor substrate 1 is cooled down to a room temperature at a temperature dropping rate which is equal to or greater than 1° C./minute and equal to or less than 50° C./minute. The cassette is extracted from the inside of the quartz pipe 20T, and the semiconductor substrate 1 is further extracted from the cassette. In this treatment, the first concentration region 1Ln can be formed in the surface layer portion on the second main surface 1$b$ side of the semiconductor substrate 1.

In the embodiment, inside the heating furnace 20, for example, while the semiconductor substrate 1 is heated, the raw material gas Ga1 is supplied to the inside of the heating furnace 20 in a state where the temperature is lower than the temperature of the semiconductor substrate 1 and thereby the first concentration region 1Ln is formed. Here, the raw material gas Ga1 is supplied from the one end portion 1Ep side (−X side) of the semiconductor substrate 1. Accordingly, the n-type dopant concentration in the first concentration region 1Ln becomes lower on the one end portion 1Ep side than on a center portion 1Cp side of the semiconductor substrate 1. Thus, the sheet resistance ρs in the first concentration region 1Ln becomes higher on the one end portion 1Ep side (−X side) than on the center portion 1Cp side.

Specifically, when the $POCl_3$ gas is introduced into the quartz pipe 20T in a state where the semiconductor substrate 1 is disposed, the semiconductor substrate 1 is heated up to the temperature range of approximately 800° C., for example, by radiant heat from the heater 20H. Meanwhile, the $POCl_3$ gas is heated only up to a sufficient temperature (for example, approximately 40° C.) to be evaporated. Accordingly, compared to the temperature of the semiconductor substrate 1, the temperature of the $POCl_3$ gas is extremely low. Therefore, by the $POCl_3$ gas which is supplied to the inside of the quartz pipe 20T, the semiconductor substrate 1 is cooled, and forming the PSG layer on the surface of the semiconductor substrate 1 and diffusion of P to the surface layer portion of the semiconductor substrate 1 are interrupted. As a result, on the one end portion 1Ep side positioned on a side to which the $POCl_3$ gas is supplied as the raw material gas Ga1 in the semiconductor substrate 1, the PSG layer formed on the second main surface 1b of the semiconductor substrate 1 becomes thin and the sheet resistance ρs becomes high in the first concentration region 1Ln. A phenomenon that the sheet resistance ρs becomes high in the first concentration region 1Ln can be caused in a region approximately from 1 mm to 50 mm from the one end portion 1Ep of the semiconductor substrate 1.

For example, as illustrated in FIG. 9, when forming the first concentration region 1Ln, on the one end portion 1Ep side positioned on a side to which the $POCl_3$ gas is supplied as the raw material gas Ga1 in the semiconductor substrate 1, the sheet resistance ρs shows a tendency of increasing in the first concentration region 1Ln. In FIG. 9, the sheet resistance ρs in the first concentration region 1Ln is equal to or greater than 60 Ω/☐ and equal to or less than 120 Ω/☐.

The forming method of the first concentration region 1Ln is not limited to the forming method (gas diffusion method) by diffusion of the element which becomes the dopant from the raw material gas Ga1. For example, a method (coating and diffusion method or liquid diffusion method) of forming the second semiconductor region 1n in the surface layer portion on the second main surface 1b side of the semiconductor substrate 1 by diffusion of the dopant as the semiconductor substrate 1 is heated after the element supply source GL1 is formed on the second main surface 1b, may be employed. In this case, for example, as the second main surface 1b is coated with the paste-formed $P_2O_5$, the element supply source GL1 can be formed. In addition, the element supply source GL1 may be formed as the second main surface 1b is coated with a solution which contains the phosphoric acid and $P_2O_5$ by a nozzle spray. Here, a thickness of the element supply source GL1 may be approximately 30 nm, for example. After the semiconductor substrate 1 is dried in a temperature range approximately from 50° C. to 300° C., it is sufficient that the semiconductor substrate 1 is heated in a high temperature range approximately from 750° C. to 950° C. Accordingly, P diffuses in the surface layer portion on the second main surface 1b side of the semiconductor substrate 1. In addition, it is sufficient that an atmosphere in the heat treatment is, for example, an atmosphere which mainly contains inert gas, such as argon or nitrogen. In addition, it is sufficient that the time for the heat treatment in the high temperature range is approximately equal to or greater than 1 minute and equal to or less than 200 minutes, for example.

<(1-8-5) Second Forming Process>

In the step S5, a process (second forming process) of forming the n-type second concentration region 1Hn (refer to FIG. 24) as the second conductivity type is performed, in the surface layer portion on the second main surface 1b side which is the one main surface in the semiconductor substrate 1. Here, for example, in a state where the element supply source GL1 is placed on the first concentration region 1Ln, the element supply source GL1 is irradiated with the laser light at a periodic timing. Accordingly, the element supply source GL1 and the surface layer portion on the second main surface 1b side of the semiconductor substrate 1 are heated, and the element which becomes the second conductivity type (n-type) dopant diffuses, in the surface layer portion on the second main surface 1b side of the semiconductor substrate 1 from the element supply source GL1. As a result, the second conductivity type second concentration region 1Hn which includes the high concentration region 1Hr is formed. The high concentration regions 1Hr has a second conductivity type (n-type) dopant concentration of the second concentration range which is higher than the first concentration range of the second conductivity type (n-type) dopant concentration in the first concentration region 1Ln. It is sufficient that the dopant concentration of the second concentration range is approximately from $1 \times 10^{19}$ atm/$cm^3$ to $1 \times 10^{21}$ atm/$cm^3$, for example.

Here, it is sufficient that the periodic timing is a plurality of types of timing each of which has a constant preset time interval. It is sufficient that the element which becomes the n-type dopant may be P, for example. When a partial region on the element supply source GL1 is irradiated with the laser light and heated selectively, the second concentration region 1Hn can be formed in the partial region of the surface layer portion on the second main surface 1b side in the semiconductor substrate 1. The sheet resistance ρs in the second concentration region 1Hn may be equal to or less than 40 Ω/☐, for example.

In addition, here, the position of the region (irradiation target region) which is irradiated with the laser light on the element supply source GL1 moves in one direction. Here, the irradiation target region on the element supply source GL1 is an extremely small region (spot) which is irradiated with the laser light generated by one time of laser lighting. The second concentration region 1Hn includes the plurality of high concentration regions 1Hr which are arranged in the extending direction of the second concentration region 1Hn. In other words, here, one direction in which the position of the irradiation target region moves corresponds to the extending direction of the second concentration region 1Hn. Note that it is sufficient that the one direction is the Y direction which is the first extending direction of the first line-shaped region 1Hna when forming the first line-shaped region 1Hna, and is the X direction which is the second extending direction of the second line-shaped region 1Hnb when forming the second line-shaped region 1Hnb.

In the embodiment, when the second line-shaped regions 1Hnb in the second concentration region 1Hn are formed, a moving speed of the irradiation target region in the X direction which is the one direction changes. Accordingly, in the X direction, the dopant concentration difference regarding the second line-shaped region 1Hnb increases or decreases between the first value range and the second value range, and the occupancy rate of the section in which the dopant concentration difference is included in the relatively large second value range among the sections of the unit length $L_0$ can be adjusted. At this time, in the X direction, the minimum place which has the minimum value of the dopant concentration difference regarding the second line-shaped region 1Hnb and the maximum place which has the maximum value of the dopant concentration difference are alternately and repeatedly exist, and the minimum place interval IN1 can be adjusted. In addition, in the X direction, the sheet resistance difference regarding the second line-shaped regions 1Hnb increases or decreases between the first value range and the second value range, and the occupancy rate of the section in which the sheet resistance difference is included in the relatively large second value range among the sections of the unit length $L_0$ can be adjusted. At this time, in the X direction, the minimum place which has the minimum value of the sheet resistance difference in the second line-shaped region 1Hnb and the maximum place which has the maximum value of the sheet resistance difference are alternately and repeatedly exist, and the minimum place interval IN2 can be adjusted.

In addition, here, for example, it is sufficient that according to any one of the distributions of the sheet resistance ρs and the dopant concentration in the first concentration region 1Ln which is formed in the step S4, the moving speed of the irradiation target region changes. In other words, it is sufficient that according to any one of the distributions of the sheet resistance ρs and the dopant concentration in the surface layer portion on the second main surface 1b side which is the one main surface in the semiconductor substrate 1, the moving speed of the irradiation target region changes. Specifically, for example, it is sufficient that according to the decrease in the sheet resistance ρs in the surface layer portion on the second main surface 1b side in the semiconductor substrate 1, the moving speed of the irradiation target region in the X direction increases. Meanwhile, it is sufficient that according to the increase in the sheet resistance ρs in the surface layer portion on the second main surface 1b side in the semiconductor substrate 1, the moving speed of the irradiation target region in the X direction decreases. Accordingly, the distribution of the sheet resistance ρs in the second line-shaped region 1Hnb can be narrow and can be settled in an appropriate value range.

Here, the distributions of the sheet resistance ρs and the dopant concentration in the surface layer portion of the semiconductor substrate 1, for example, can be obtained by measuring the semiconductor substrate 1 itself which is the irradiation target of the laser light or a semiconductor substrate which has a similar configuration to that of the semiconductor substrate 1, as a target.

A process (measuring process) of measuring at least any one of the distributions of the sheet resistance ρs and the dopant concentration in the surface layer portion with a target of the semiconductor substrate 1 itself, may be performed between the first forming process (step S4) and the second forming process (step S5). Accordingly, according to the state of the first concentration region 1Ln, the laser light radiation is possible. As a result, the distribution of the sheet resistance ρs in the second line-shaped region 1Hnb can be narrow and can be settled in an appropriate value range.

In addition, by measuring the semiconductor substrate which has a similar configuration to that of the semiconductor substrate 1 as a target, when at least any one of the distributions of the sheet resistance ρs and the dopant concentration in the surface layer portion of the semiconductor substrate 1 is obtained in advance, it is possible to simplify the manufacturing process of the solar cell element 10. In the embodiment, the n-type dopant concentration in the first concentration region 1Ln is lower on the one end portion 1Ep side than on the center portion 1Cp of the semiconductor substrate 1 in the X direction. In addition, the sheet resistance ρs in the first concentration region 1Ln is higher in the one end portion 1Ep than in the center portion 1Cp of the semiconductor substrate 1 in the X direction. Here, it is sufficient that the moving speed of the irradiation target region in the X direction is set to be faster speed when the center portion 1Cp of the semiconductor substrate 1 is irradiated with the laser light than the speed when a part on the one end portion 1Ep side which is the outer peripheral portion of the semiconductor substrate 1 in the X direction is irradiated with the laser light. Accordingly, it is possible to perform the laser light radiation according to a real state of the distributions of the n-type dopant concentration and the sheet resistance ρs in the first concentration region 1Ln which is used as a base portion when the second concentration region 1Hn is formed.

Here, an example of a laser radiation device 30 to irradiate the element supply source GL1 with the laser light will be described.

Figure 25:
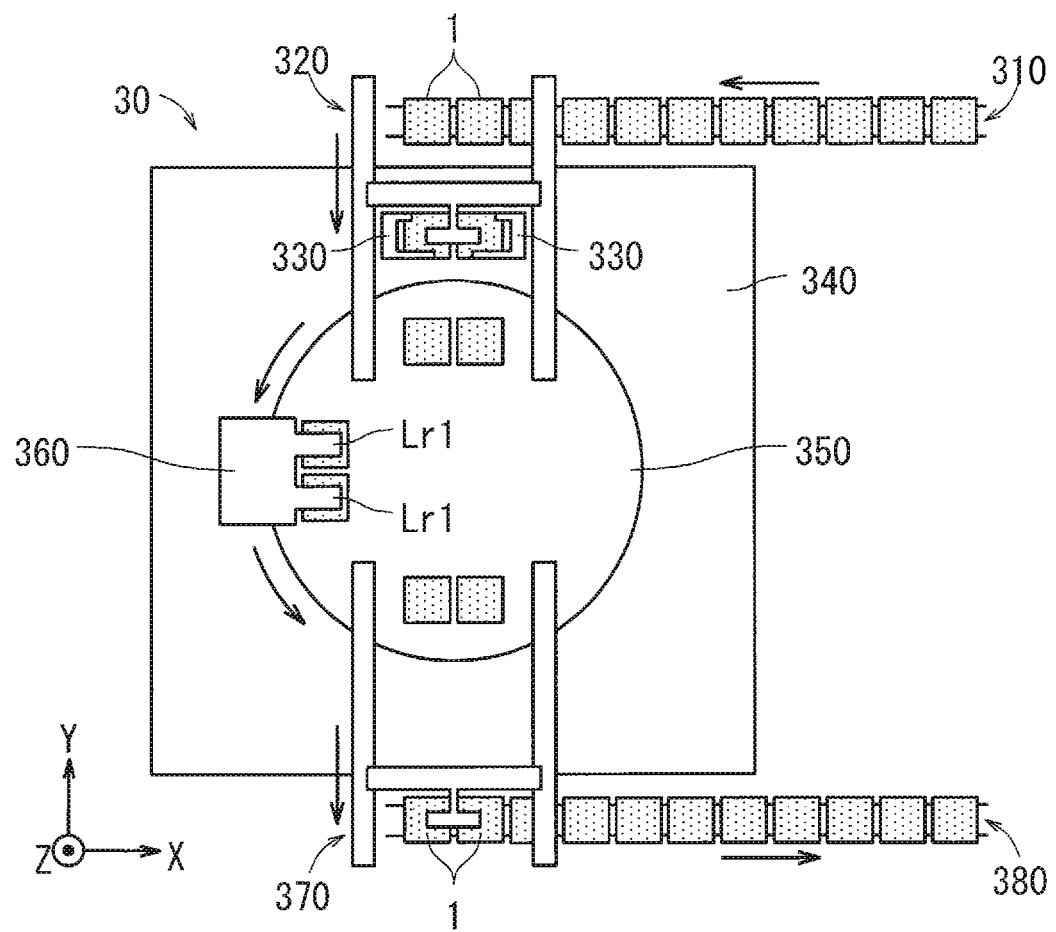
FIG. 25 is a plan view illustrating a configuration of a laser radiation device.

As illustrated in FIG. 25, the laser radiation device 30 includes a first alignment conveyance portion 310, a first parallel conveyance portion 320, an alignment portion 330, a base portion 340, and a rotation conveyance portion 350, a laser radiation portion 360, a second parallel conveyance portion 370, and a second alignment conveyance portion 380.

The first alignment conveyance portion 310 conveys the semiconductor substrate 1 to the first parallel conveyance portion 320 while being aligned in one row. The first parallel conveyance portion 320 conveys the semiconductor substrate 1 onto the rotation conveyance portion 350. When the semiconductor substrate 1 is conveyed by the first parallel conveyance portion 320, the alignment portion 330 reads out a position and a posture of the semiconductor substrate 1 by photographing and image processing, and performs alignment according to the position and the posture of the semiconductor substrate 1. The rotation conveyance portion 350 conveys the semiconductor substrate 1 mounted on the rotation conveyance portion 350 to right below the laser radiation portion 360 by being rotated with respect to the base portion 340. The laser radiation portion 360 irradiates each of the two semiconductor substrates 1 with a predetermined laser light, by two laser radiation mechanisms Lr1. The semiconductor substrate 1 which is irradiated with the laser light is conveyed to below the second parallel conveyance portion 370, by the rotation conveyance portion 350. The second parallel conveyance portion 370 conveys the semiconductor substrate 1 to the second alignment conveyance portion 380. The second alignment conveyance portion 380 conveys the semiconductor substrate 1 to the outside of the laser radiation device 30 while aligning the semiconductor substrates 1 in one row.

In addition, a temperature and a humidity inside the laser radiation portion 360 are managed and controlled by a control portion which is not illustrated. In addition, it is determined whether or not the pattern irradiated with the laser light is appropriate, by photographing and image processing in the image detection portion which is not illustrated. In addition, a control of the entire laser radiation device 30 is performed by a host computer which is not illustrated.

Figure 26:
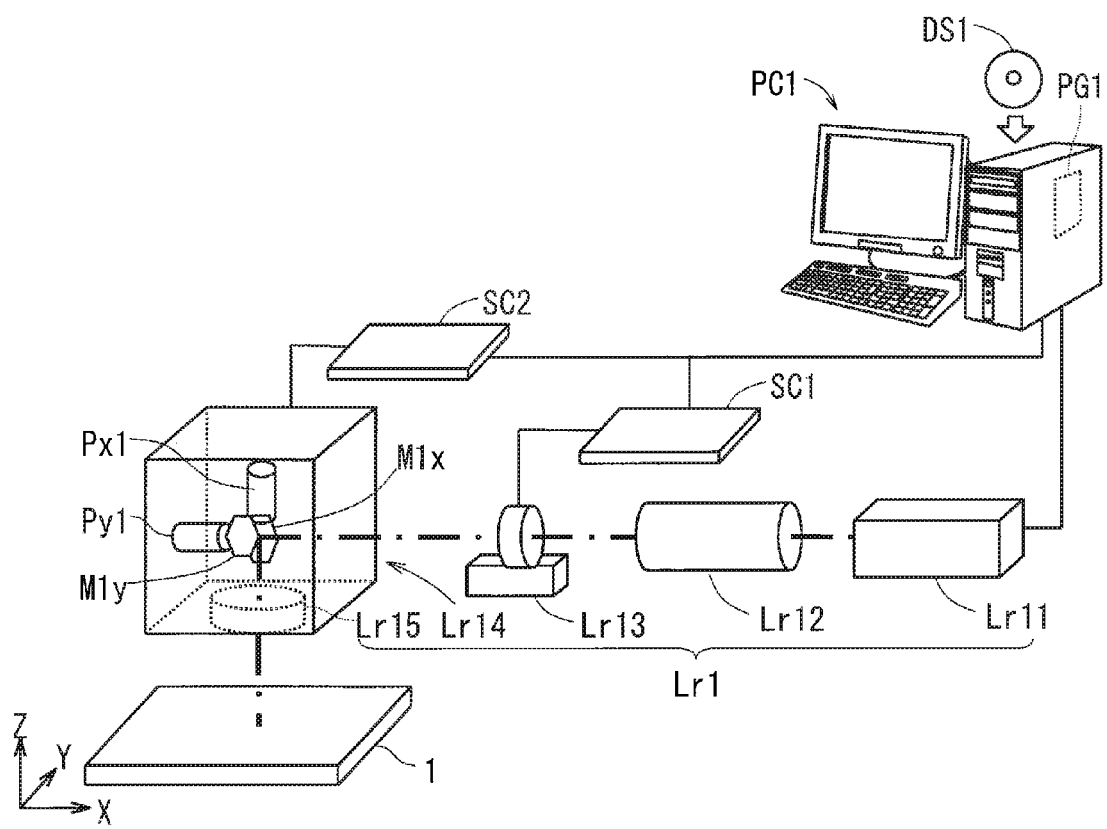
FIG. 26 is a perspective view illustrating a laser radiation mechanism and a configuration in which a control thereof is performed.

As illustrated in FIG. 26, the laser radiation mechanism Lr1 includes a laser oscillator Lr11, a beam expander Lr12, a Z-axis controller Lr13, a two-axes deflector Lr14, and a Fθ lens Lr15. In addition, in FIG. 26, a path through which the laser light passes is illustrated by a one-dot chain line.

A pulse-shaped output of the laser oscillator Lr11 oscillates at a constant repeating frequency. Accordingly, the laser light is generated from the laser oscillator Lr11 at a periodic timing. The beam expander Lr12 adjusts the diameter of the laser light which is generated from the laser oscillator Lr11. The Z-axis controller Lr13 adjusts a focusing point of the laser light. The two-axes deflector Lr14 deflects the laser light in two directions which are substantially orthogonal. Accordingly, the irradiation target region which is irradiated with the laser light can be arbitrarily set on the second main surface 1b of the semiconductor substrate 1. The Fθ lens Lr15 controls an incident angle of the laser light with respect to the semiconductor substrate 1. According to this, a surface on which the focusing point of the laser light forms an image is adjusted to be a surface which is parallel to the second main surface 1b of the semiconductor substrate 1.

For example, the laser oscillator Lr11 includes an excitation light source which is an excitation source of the laser, a main body portion of the laser, a power source which applies a current and a voltage to the laser, a cooler which cools the main body portion and the power source with water and the like. As the excitation light source, for example, a discharge lamp, a semiconductor laser or the like can be employed. As the main body portion of the laser, for example, a semiconductor laser, a solid laser, a gas laser or the like can be employed. As the solid laser, for example, a YAG laser, a YVO laser or the like can be employed. As the gas laser, for example, a carbon dioxide gas laser, an excimer laser or the like can be employed. In addition, an operation of the laser oscillator Lr11 is controlled by a control device PC1. The control device PC1 may be a personal computer, for example.

In addition, in the embodiment, the two-axes deflector Lr14 may be a galvano scanner. The galvano scanner includes, for example, a first mirror M1x, a first servomotor Px1, a second mirror M1y, and a second servomotor Py1. The first mirror M1x and the second mirror M1y reflect the laser light in order. As an angle of the first mirror M1x in the one direction is controlled, the first servomotor Px1 controls the position where the semiconductor substrate 1 is irradiated with the laser light in the X direction. As an angle of the second mirror M1y in the other direction is controlled, the second servomotor Py1 controls the position where the semiconductor substrate 1 is irradiated with the laser light in the Y direction. Operations of the first servomotor Px1 and the second servomotor Py1 are controlled by a two-axes servocontroller SC2. In addition, an operation of the Z-axis controller Lr13 is controlled by a one-axis servocontroller SC1. The two-axes servocontroller SC2 and the one-axis servocontroller SC1 are controlled by the control device PC1.

Figure 27:
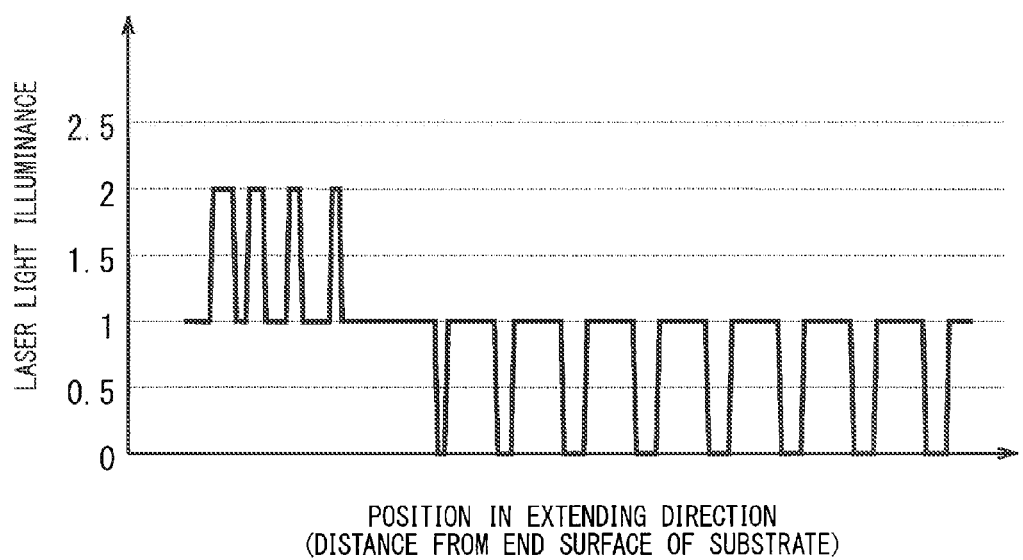
FIG. 27 is a graph illustrating an example of a relationship between a position in the extending direction and a laser light illuminance.
Figure 28:
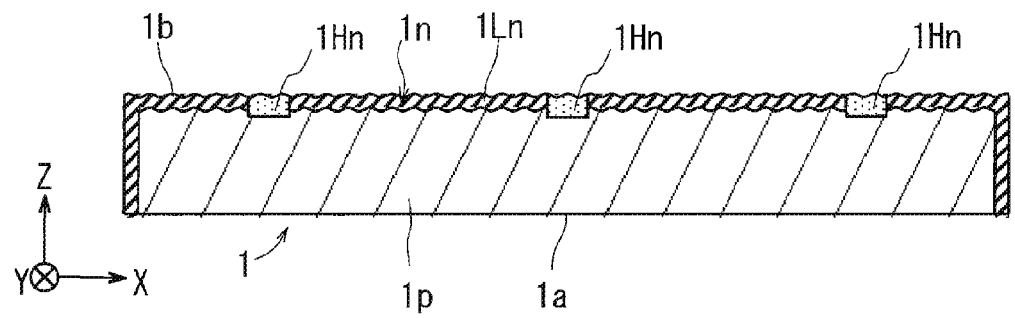
FIG. 28 is a cross-sectional view illustrating a state in the middle of manufacturing of the solar cell element according to the embodiment.

In addition, as a cross-sectional shape of luminous flux of the laser light which causes the irradiation target region on the semiconductor substrate 1 to be irradiated, for example, a circle shape, an elliptical shape, or a rectangular shape can be employed. Here, if the cross-sectional shape of the luminous flux of the laser light is a rectangular shape, the cross-sectional shape of the luminous flux and the shape of the second concentration region 1Hn can have good consistency, and the second concentration region 1Hn can be formed with good accuracy. In addition, as an intensity distribution of the laser light, for example, a top-hat type distribution or a non-top-hat type distribution, such as a Gaussian distribution, can be employed. Here, as the irradiation target region on the semiconductor substrate 1 is irradiated with the laser light having the top-hat type intensity distribution as illustrated in FIG. 14, if the second concentration region 1Hn is formed, the dopant concentration in the second concentration region 1Hn can be adjusted to be more uniform. In this case, at a part which corresponds to the second line-shaped regions 1Hnb formed in the region AR1 in FIG. 6, a illuminance distribution of the laser light which causes the element supply source GL1 to be irradiated is as illustrated in FIG. 27, for example. In addition, for example, the intensity distribution of the laser light can be adjusted to be the top-hat type distribution by a homogenizer which is not illustrated.

In addition, a wavelength of the laser light may be equal to or greater than 100 nm and equal to or less than 4000 nm, for example. An intensity of the laser light may be equal to or greater than 0.1 W and equal to or less than 100 W. An oscillation frequency of the laser oscillator Lr11 may be equal to or greater than 0.1 kHz and equal to or less than 1000 kHz, for example. A pulse width which is output in a pulse shape by the laser oscillator Lr11 may be equal to or greater than 1 nanosecond (ns) and equal to or less than 1000 ns, for example. In the element supply source GL1, a diameter of the laser light may be approximately equal to or greater than 0.1 μm and equal to or less than 1000 μm. According to the intensity of the laser light, the same irradiation target region may be irradiated with the pulse-shaped laser light 1 or more times and 100 or less times.

Here, for example, by irradiating the element supply source GL1 with the laser light, when the element which becomes the second conductivity type dopant is introduced into the surface layer portion on the second main surface 1b side of the semiconductor substrate 1 by diffusion, it is sufficient that a depth of diffusion of the element which becomes the second conductivity type dopant is equal to or less than 2 μm. Accordingly, it is possible to realize high generating efficiency in the solar cell element 10. Accordingly, it is sufficient that heating the semiconductor substrate 1 by irradiation with the laser light is limited to the vicinity of the second main surface 1b of the semiconductor substrate 1. Specifically, for example, it is sufficient that the wavelength of the laser light is equal to or less than 1100 nm which is a relatively small infiltration depth with respect to silicon. If the pulse width is equal to or less than 300 ns in the laser output, with respect to the surface layer portion on the second main surface 1b side of the semiconductor substrate 1, high energy can be given by irradiation with the laser light in a short period of time.

However, the pattern of the second concentration region 1Hn has a similar pattern to that of the second electrode 5. In consideration of the irradiation position and a tolerance of width of the laser light on the semiconductor substrate 1, and the forming position and a tolerance of width of the second electrode 5, the line width of the second concentration region 1Hn is set to be larger than the line width of the pattern of the second electrode 5. For example, when the line width of the second line-shaped portion 5b of the second electrode 5 is 100 μm, and the sum of the forming position and the tolerance of width of the second electrode 5 is ±80 μm, the line width of the second line-shaped region 1Hnb is set to be approximately 260 μm. At this time, for example, regarding the size of the irradiation target region where the element supply source GL1 is irradiated with the laser light, it is sufficient that the width of the second line-shaped region 1Hnb in the line width direction is 260 μm, and the length of the second line-shaped region 1Hnb in the second extending direction is 200 μm. In addition, for example, when the irradiation target region related to the laser light has 130 μm in width of the second line-shaped regions 1Hnb in the line width direction and 200 μm in length of the second line-shaped region 1Hnb in the second extending direction, it is sufficient that the irradiation with the laser light is performed two times in parallel. However, when the width of the second line-shaped region 1Hnb in the line width direction in the irradiation target region related to the laser light is 260 μm, the time required for forming the second concentration region 1Hn by the irradiation with the laser light can be shortened. In addition, as the size of the irradiation target region of the laser light expands, the time required for forming the second concentration region 1Hn can be shortened. However, in this case, in order to ensure the energy per unit area on the cross section of the luminous flux of the laser light, a large output laser is necessary.

In addition, regarding the irradiation target region of the laser light, if the width of the second concentration region 1Hn in the line width direction is extremely large, the line width of the second concentration region 1Hn becomes extremely large. In this case, recombination of the carrier is likely to be generated in the semiconductor substrate 1. Accordingly, if the line width of the second concentration region 1Hn is set as narrow as possible within a range in which the second electrode 5 does not go out from the second concentration region 1Hn, the recombination of the carrier is unlikely to be generated in the semiconductor substrate 1, and the generating efficiency in the solar cell element 10 can be improved.

In addition, it is sufficient that the moving speed (scanning speed) of the irradiation target region related to the laser light is approximately equal to or greater than 100 mm/s and equal to or less than 10000 mm/s, for example. Here, for example, it is assumed that the length of the irradiation target region in the moving direction (scanning direction) of the irradiation target region related to the laser light is 200 μm, and the oscillation frequency of the laser is 20 kHz. In this case, the scanning speed at which the irradiation target region related to the laser light does not generate either an overlap or a gap is 4000 mm/s. In addition, the setting of the scanner speed of the laser light can be realized by a program PG1 stored in the control device PC1, for example. The program PG1 may be stored in the control device PC1 from a storage medium DS1 which is installed on the control device PC1.

In addition, in the second forming process, in a region where the second concentration region 1Hn of the second main surface 1b of the semiconductor substrate 1 is not formed, as the heat is locally given onto the element supply source GL1, the alignment reference portions 1m at two or more locations are formed. Here, as the heat is locally given with respect to the two or more locations which are separated from each other in the second main surface 1b of the element supply source GL1, the surface of the surface layer portion of the two or more locations which are separated from each other on the second main surface 1b side of the semiconductor substrate 1 becomes rough. Accordingly, the alignment reference portions 1m at two or more locations is formed. In addition, in the embodiment, the alignment reference portions 1m at two locations are formed.

Here, it is sufficient that the local heat is given by the irradiation with the laser light. It is sufficient that the number of times of the irradiation to one location with the laser light, is larger than the number of times when the second concentration region 1Hn is formed. Specifically, for example, it is sufficient that the laser light which is substantially the same as the laser light generated by one time of laser lightening when forming the second concentration region 1Hn causes the same one location to be irradiated 100 to 10000 times continuously within the time range from 0.01 seconds to 1 second at the same location. In addition, similarly to the laser light when forming the second concentration region 1Hn, it is sufficient that the frequency generated by the laser light is equal to or greater than 0.1 kHz and equal to or less than 1000 kHz, for example. It is sufficient that the pulse width is also equal to or greater than 1 ns and equal to or less than 1000 ns.

<(1-8-6) Removing Process>

Figure 29:
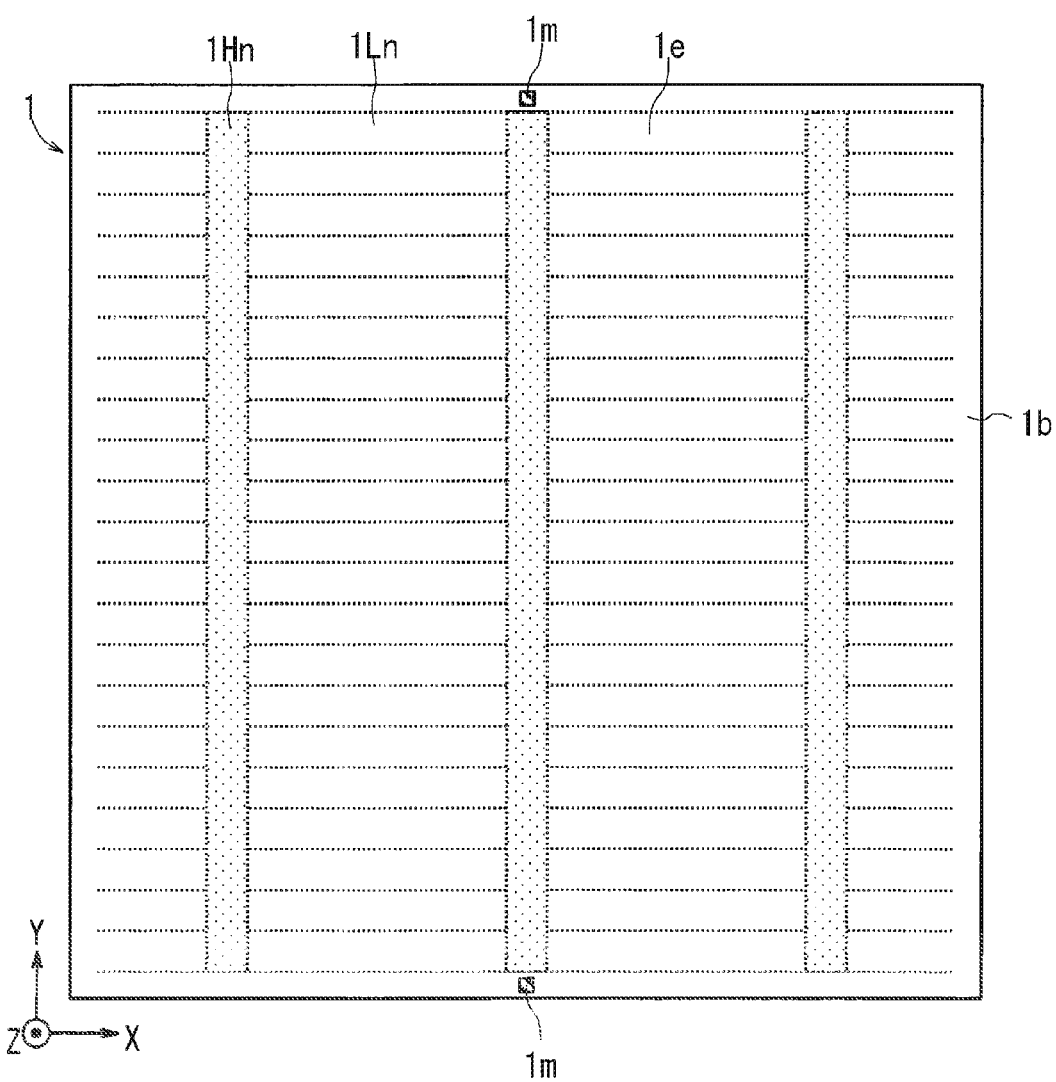
FIG. 29 is a plan view illustrating a state in the middle of manufacturing of the solar cell element according to the embodiment.

In a step S6, a process (removing process) of removing the element supply source GL1 which is placed on the second main surface 1b of the semiconductor substrate 1 is performed. Here, for example, by the etching process which uses the HF or the like, the element supply source GL1 can be removed. Accordingly, the semiconductor substrate 1 (refer to FIG. 28) in which the second semiconductor region 1n is exposed to the second main surface 1b is formed. As illustrated in FIG. 29, on the surface layer portion on the second main surface 1b side of the semiconductor substrate 1, the alignment reference portions 1m at two locations are placed. In FIG. 29, an outer edge of the formed region where the second electrode 5 in the second main surface 1b is formed is illustrated by a dotted line. In addition, when the first concentration region 1Ln is formed even in the surface layer portion on the first main surface 1a side of the semiconductor substrate 1 in the first forming process of the step S4, for example, by the etching process which uses the aqueous solution of the fluonitric acid, the first concentration region 1Ln on the first main surface 1a side may be removed.

<(1-8-7) AR Film-Forming Process>

Figure 30:
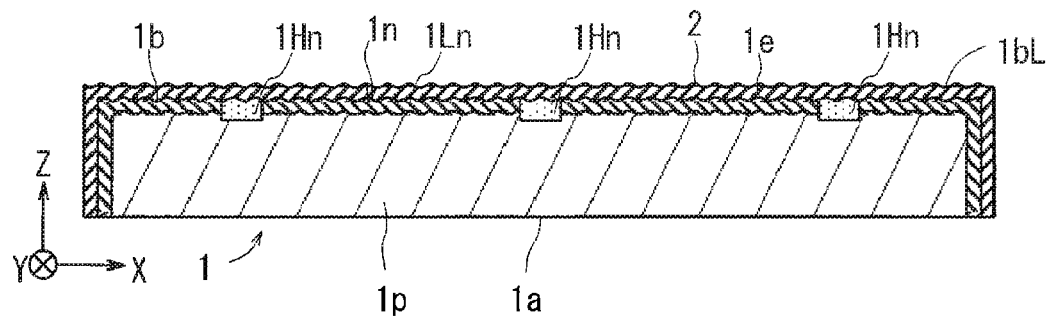
FIG. 30 is a cross-sectional view illustrating a state in the middle of manufacturing of the solar cell element according to the embodiment.
Figure 31:
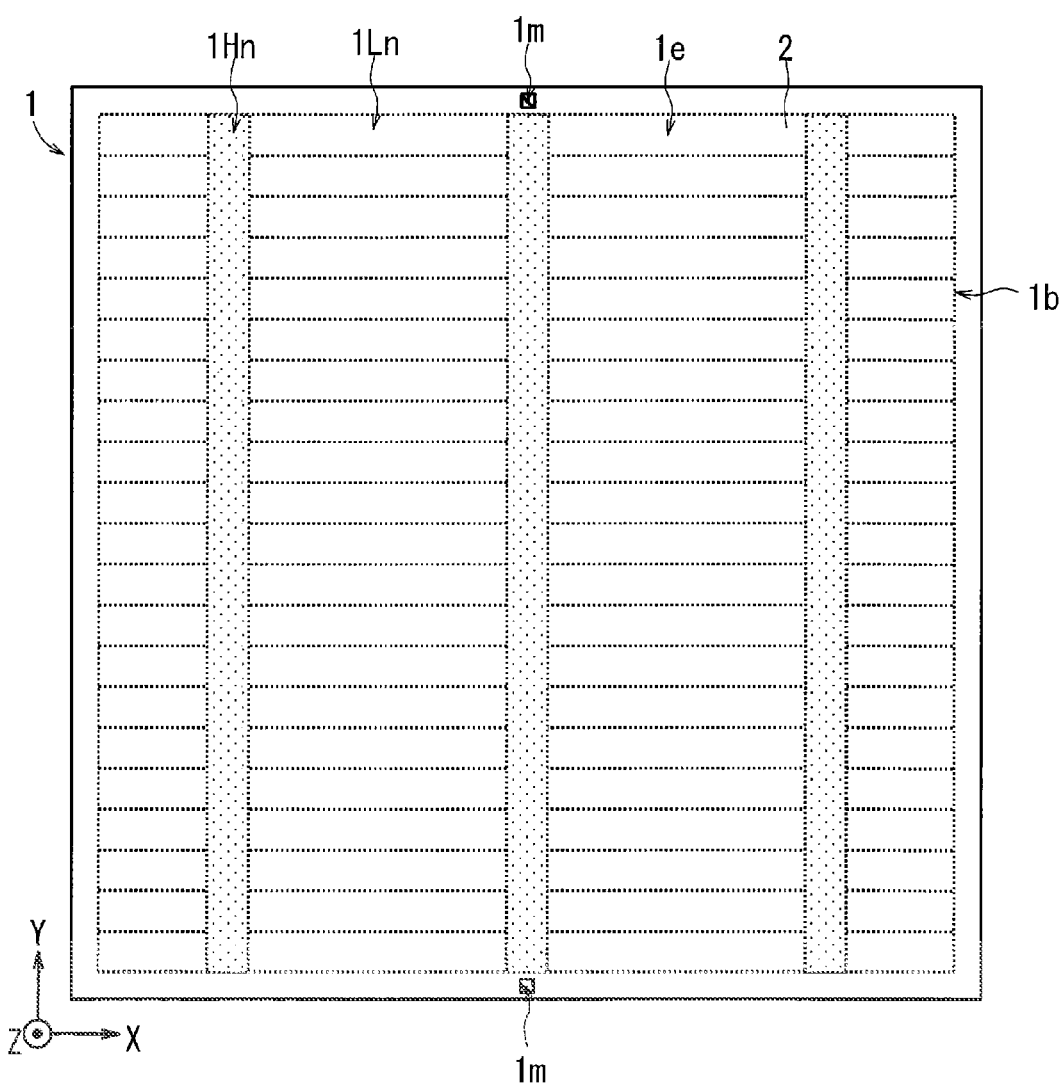
FIG. 31 is a plan view illustrating a state in the middle of manufacturing of the solar cell element according to the embodiment.

In a step S7, a process (AR film-forming process) of forming the anti-reflection film 2 (refer to FIG. 30) on the second main surface 1b of the semiconductor substrate 1 is performed. As a forming method of the anti-reflection film 2, for example, a plasma enhanced chemical vapor deposition (PECVD) method, an evaporation method, a sputtering method or the like may be employed. For example, when the PECVD method is employed, in a film-forming device, gas mixed by $SiH_4$ gas and $NH_3$ gas is diluted by $N_2$ gas, the gas becomes plasma by grow discharge decomposition in a chamber, and silicon nitride (SiN) is deposited on the second main surface 1b. Accordingly, the anti-reflection film 2 containing SiN is formed. In addition, the temperature in the chamber when SiN is deposited may be approximately 500° C., for example. In FIG. 31, an outer appearance of the second main surface 1b of the semiconductor substrate 1 in which the anti-reflection film 2 is placed is illustrated. In addition, in FIG. 31, the outer edge of the formed region where the second electrode 5 is formed in the second main surface 1b is illustrated by a dotted line.

<(1-8-8) Third Forming Process>

In a step S8, a process (third forming process) of forming the first electrode 4, the second electrode 5 and the fourth concentration region 1Hp is performed.

First, a forming method of the first electrode 4 will be illustrated. The collection electrode 4a of the first electrode 4 is formed by using the Al paste which contains Al powder and organic vehicle. Here, the substantially entire surface of the first main surface 1a of the semiconductor substrate 1 is coated with the Al paste, the substantially entire surface being one except a part where the output extraction electrode 4b is formed. Here, as a method of coating with the Al paste, for example, a screen printing method or the like is employed. In addition, after coating the Al paste on the first main surface 1a of the semiconductor substrate 1, at a preset temperature, a drying process which causes components of the solvent in the Al paste to transpire may be performed. Accordingly, in each process after the drying process, the Al paste is unlikely to be adhered to each portion other than a part to be coated. Accordingly, operability in each process after the drying process can be improved.

The output extraction electrode 4b of the first electrode 4 is formed by using the Ag paste which contains metal powder mainly including Ag powder or the like, organic vehicle, and glass frit. Here, for example, after coating the first main surface 1a of the semiconductor substrate 1 with the above-described Al paste, the first main surface 1a of the semiconductor substrate 1 is coated with the Ag paste to have a shape determined in advance. At this time, a position which is in contact with a part of the Al paste for forming the collection electrode 4a is coated with the Ag paste. Accordingly, the output extraction electrode 4b is formed to be overlapped with a part of the collection electrode 4a. Here, as a method of coating with the Ag paste, for example, the screen printing method or the like is employed. In addition, after coating the first main surface 1a of the semiconductor substrate 1 with the Ag paste, at the preset temperature, the drying process which causes the components of the solvent in the Ag paste to transpire may be performed.

With respect to the semiconductor substrate 1 which is coated with the Al paste and the Ag paste, inside a firing furnace, the heat treatment is performed while maintaining the semiconductor substrate 1 for approximately several ten seconds or several ten minutes at the highest temperature which is equal to or greater than 600° C. and equal to or less than 850° C. Accordingly, as the Al paste and the Ag paste are fired, the first electrode 4 is formed. In addition, at this time, the Al of the Al paste diffuses into the semiconductor substrate 1. Accordingly, the fourth concentration region 1Hp is formed in the surface layer portion on the first main surface 1a side of the semiconductor substrate 1.

Next, a forming method of the second electrode 5 will be described. For example, the second electrode 5 is formed by using the Ag paste which contains the metal powder mainly containing Ag or the like as a main component, the organic vehicle, and the glass frit. Specifically, the anti-reflection film 2 of the semiconductor substrate 1 is coated with the Ag paste. At this time, when adjusting a region which is coated with the Ag paste, the alignment reference portions 1m at two or more locations are used as a reference. For example, in a state where the semiconductor substrate 1 is mounted on a coating device of the Ag paste, the second main surface 1b is photographed by a photographing device. In the image processing with respect to the image which is captured by the second main surface 1b obtained at this time, for example, binarization processing is performed, and a position of the alignment reference portions 1m at two locations is detected. According to the detected position of the alignment reference portions 1m at two locations, a region which is coated with the Ag paste in the second main surface 1b is adjusted.

Subsequently, as the Ag paste which coats the second main surface 1b is fired, the second electrode 5 is formed on the second concentration region 1Hn. Here, it is sufficient that the highest temperature in firing is equal to or greater than 600° C. and equal to or less than 800° C., for example. In addition, it is sufficient that the time when the firing is performed is approximately several ten seconds or several ten minutes. It is sufficient that as a method of coating with the Ag paste, for example, the screen printing method or the like is employed. After coating with the Ag paste, as the Ag paste is dried at a predetermined temperature, the solvent in the Ag paste may transpire. In addition, the second electrode 5 includes the first line-shaped portion 5a and the second line-shaped portion 5b, but by employing the screen printing method, the first line-shaped portion 5a and the second line-shaped portion 5b can be formed during the same period in one process.

In addition, here, the forming method of the first electrode 4 and the second electrode 5 by printing and firing is described, but the first electrode 4 and the second electrode 5 may be formed by another forming methods, such as the evaporation method, the sputtering method, a plating method and the like. In this case, for example, before forming the first electrode 4 and the second electrode 5, the fourth concentration region 1Hp is formed as B, Ga, Al, or the like are introduced into the surface layer portion on the first main surface 1a side of the semiconductor substrate 1 by diffusion.

(1-9)—Summary of Embodiment

As illustrated above, in the solar cell element 10 according to the embodiment, for example, in the extending direction of the second concentration region 1Hn, the minimum place which has the minimum value of the dopant concentration difference that is obtained by subtracting the dopant concentration value at a place which is close to a one place in the first concentration region 1Ln from the dopant concentration value at the one place in the second concentration region 1Hn and the maximum place which has the maximum value of the dopant concentration difference are alternately and repeatedly exist. In the extending direction of the second concentration region 1Hn, a part in which the minimum place interval IN1 between one end portions of the adjacent minimum places varies exists. Accordingly, as the minimum place interval IN1 appropriately varies according to the dopant concentration in the close region 1NA which is close to the second concentration region 1Hn, the second conductivity type dopant concentration in the second concentration region 1Hn can be appropriately adjusted. In addition, in other words, for example, in the extending direction of the second concentration region 1Hn, the dopant concentration difference between the second concentration region 1Hn and the close region 1NA which is close to the second concentration region 1Hn in the first concentration region 1Ln repeats increasing and decreasing. Here, in the extending direction of the second concentration region 1Hn, the dopant concentration difference increases or decreases between the first value range and the second value range which is higher the first value range. In the extending direction of the second concentration region 1Hn, according to decrease of the dopant concentration in the close region 1NA, the occupancy rate of the section in which the dopant concentration difference is included in the relatively high second value range among the sections of the unit length $L_0$ increases. Accordingly, the second conductivity type dopant concentration in the second concentration region 1Hn which is formed by using a part having a relatively low second conductivity type dopant concentration in the first concentration region 1Ln as a base portion can appropriately increase. As a result, the distribution of the sheet resistance ρs in the second concentration region 1Hn can be narrow and can be settled in an appropriate value range. Therefore, by improving the boundary part between the semiconductor substrate 1 and the second electrodes 5, it is possible to improve conversion efficiency of the solar cell element 10.

In addition, in the solar cell element 10 according to the embodiment, for example, in the extending direction of the second concentration region 1Hn, the minimum place which has the minimum value of the sheet resistance difference that is obtained by subtracting the sheet resistance ρs value at a one place in the second concentration region 1Hn from the sheet resistance ρs value at a place which is close to the one place in the first concentration region 1Ln and the maximum place which has the maximum value of the dopant concentration difference are alternately and repeatedly exist. In the extending direction of the second concentration region 1Hn, a part where the minimum place interval IN2 between one end portions of the adjacent minimum places varies exists. Accordingly, as the minimum place interval IN2 appropriately varies according to the sheet resistance ρs in the close region 1NA which is close to the second concentration region 1Hn, the sheet resistance ρs in the second concentration region 1Hn can be appropriately adjusted. In addition, in other words, for example, in the extending direction of the second concentration region 1Hn, the sheet resistance difference between the second concentration region 1Hn and the close region 1NA which is close to the second concentration region 1Hn in the first concentration region 1Ln repeats increasing and decreasing. Here, in the extending direction of the second concentration region 1Hn, the sheet resistance difference increases or decreases between the first value range and the second value range which is higher the first value range. In the extending direction of the second concentration region 1Hn, according to an increase in the sheet resistance ρs in the close region 1NA, the occupancy rate of the section in which the sheet resistance difference is included in the relatively high second value range among the sections of the unit length $L_0$ increases. Accordingly, the sheet resistance ρs in the second concentration region 1Hn which is formed by using a part having a relatively high sheet resistance ρs in the first concentration region 1Ln as a base portion can appropriately decrease. As a result, the distribution of the sheet resistance ρs in the second concentration region 1Hn can be narrow and can be settled in an appropriate value range. Therefore, by improving the boundary part between the semiconductor substrate 1 and the second electrodes 5, it is possible to improve conversion efficiency of the solar cell element 10.

In addition, in the method for manufacturing the solar cell element 10 according to the embodiment, in a state where the element supply source GL1 is placed on the first concentration region 1Ln, the element supply source GL1 is irradiated with the laser light at a periodic timing. Accordingly, as the element which becomes the second conductivity type dopant diffuses in the surface layer portion on the second main surface 1b side of the semiconductor substrate 1 from the element supply source GL1, the second concentration region 1Hn is formed. At this time, the moving speed at which the position of the irradiation target region which is irradiated with the laser light on the element supply source GL1 moves in one direction changes. Accordingly, in the extending direction of the second concentration region 1Hn, the minimum place which has the minimum value of the dopant concentration difference regarding the second concentration region 1Hn and the maximum place which has the maximum value of the dopant concentration difference are alternately and repeatedly exist, and the minimum place intervals IN1 between one end portions of the adjacent minimum places can be adjusted to vary. In addition, in the extending direction of the second concentration region 1Hn, the minimum place which has the minimum value of the sheet resistance difference regarding the second concentration region 1Hn and the maximum place which has the maximum value of the sheet resistance difference are alternately and repeatedly exist, and the minimum place intervals IN2 between one end portions of the adjacent minimum places can be adjusted to vary. In addition, in the extending direction, the dopant concentration difference regarding the second concentration region 1Hn increases or decreases between the first value range and the second value range, and the occupancy rate of the section in which the dopant concentration difference is included in the relatively large second value range among the sections of the unit length $L_0$ can be adjusted. In addition, in the extending direction, the sheet resistance difference regarding the second concentration region 1Hn increases or decreases between the first value range and the second value range, and the occupancy rate of the section in which the sheet resistance difference is included in the relatively large second value range among the sections of the unit length $L_0$ can be adjusted. Accordingly, the sheet resistance ρs in the second concentration region 1Hn which is formed by using a part having a relatively high sheet resistance ρs in the first concentration region 1Ln as a base portion can appropriately decrease. As a result, the distribution of the sheet resistance ρs in the second concentration region 1Hn can be narrow and can be settled in an appropriate value range. In addition, since the thickness of the second concentration region 1Hn increases, an amount of defects which exist in the pn junction portion can be reduced. As a result, the recombination of the carrier is unlikely to be generated in the semiconductor substrate 1, and a fill factor (FF) and conversion efficiency can be improved. Therefore, by improving the boundary part between the semiconductor substrate 1 and the second electrode 5, it is possible to improve conversion efficiency of the solar cell element 10.

(1-10)—Specific Example According to Embodiment

Here, a specific example according to the above-described embodiment will be described.

<(1-10-1) Forming First Concentration Region>

First, the p-type polycrystal silicon substrate in which the projection and recess portion was formed across the entire main surface thereof by the RIE and of which one side of the rectangular plate surface thereof was 156 mm was prepared as the semiconductor substrate 1. After cleaning the surface of the semiconductor substrate 1 by the HF, the semiconductor substrate 1 was disposed in the heating furnace 20. As P which becomes the n-type dopant diffused in the surface layer portion on the one main surface side of the semiconductor substrate 1 by the gas diffusion method, the n-type first concentration region 1Ln was formed.

Here, the quartz-made cassette in which the semiconductor substrate 1 was disposed was attached to the inside of the quartz pipe 20T, and a lid of the quartz pipe 20T was closed. After the temperature increases at 50° C./minute of temperature raising rate and the semiconductor substrate 1 was maintained for 10 minutes at 850° C., the semiconductor substrate 1 was maintained for 30 minutes at 850° C., $O_2$ gas and $N_2$ gas were used as the carrier gas, and the $POCl_3$ gas was introduced into the quartz pipe 20T at 1000 sccm of flux. At this time, the PSG layer was formed as the element supply source GL1 on the surface of the semiconductor substrate 1, and P was introduced into the surface layer portion of the semiconductor substrate 1 by diffusion. Next, as the gas supply into the quartz pipe 20T was stopped and the semiconductor substrate 1 was maintained for 30 minutes at 850° C., P was further introduced into the surface layer portion of the semiconductor substrate 1 by diffusion. Subsequently, the semiconductor substrate 1 was cooled up to the room temperature at 50° C./minute of temperature dropping rate. The cassette was extracted from the inside of the quartz pipe 20T, and the semiconductor substrate 1 was further extracted from the cassette.

<(1-10-2) Sheet Resistance ρs in First Concentration Region>

The sheet resistance ρs in the first concentration region 1Ln which was formed on the semiconductor substrate 1 as described above was measured. The sheet resistance ρs in the first concentration region 1Ln was measured by the four-probe method based on JIS H 0602-1995, in a darkroom which has 25.5° C. of room temperature and 60% RH of relative temperature, for example.

Here, after the semiconductor substrate 1 was extracted from the heating furnace 20, for example, as the semiconductor substrate 1 was left in the dark room for 20 minutes, the temperature of the semiconductor substrate 1 became substantially equal to the room temperature. Then, the semiconductor substrate 1 was disposed in the measurement instrument, static electricity was removed from the surface of the semiconductor substrate 1 by grounding. Here, a probe in which a material of the surface was, for example, tungsten carbide, and the diameter of the tip end was 100 μm was used, the distance between the probes was set to be 1 mm, and the probe was pressed to the semiconductor substrate 1 by 1 N of weight. A current applied between the probes was set to be 1 mA, for example, and a measurement value was read in 1 second after the current was started to be applied. At this time, the value which was obtained at 25.5° C. was corrected to a value which was under a condition of 25° C. of room temperature, and was employed as the measurement value of the sheet resistance ρs. In addition, assuming that the depth t of the first concentration region 1Ln was 2 μm. As the voltage V which was detected by the measurement instrument was substituted in above-described Formula (1) and Formula (2), the measurement value of the sheet resistance ρs was calculated. An average of 10 measurement values at the same measurement position was calculated as the sheet resistance ρs in the first concentration region 1Ln.

As a result of the above-described measurement, as illustrated in FIG. 9, the sheet resistance ρs in the first concentration region 1Ln was equal to or greater than 60 Ω/□ and equal to or less than 120 Ω/□. Specifically, when forming the first concentration region 1Ln, in the vicinity of the one end portion 1Ep on the side to which the POCl₃ gas was supplied in the semiconductor substrate 1, the sheet resistance ρs in the first concentration region 1Ln showed a tendency of increasing. The phenomenon in which the sheet resistance ρs in the first concentration region 1Ln increases was confirmed in a region where the distance from the one end portion 1Ep of the semiconductor substrate 1 was approximately equal to or less than 6 mm Here, in the vicinity of the one end portion 1Ep of the semiconductor substrate 1, it was assumed that a thickness of the first concentration region 1Ln and the PSG layer and the concentration of the n-type dopant in the first concentration region 1Ln decreased.

<(1-10-3) Forming Second Concentration Region>

Next, the second concentration region 1Hn was formed as the PSG layer was irradiated with the laser light. When forming the second line-shaped region 1Hnb of the second concentration region 1Hn, the laser had approximately 20 W of output, approximately 100 ns of output pulse width, and approximately 20 kHz of oscillation frequency. The cross-sectional shape of the luminous flux of the laser light was substantially rectangular, and the intensity distribution of the laser light was the top-hat type. Regarding the size of the irradiation target region related to the laser light, the width of the second line-shaped region 1Hnb in the X direction which was the line width direction was approximately 260 μm, and the length of the second line-shaped region 1Hnb in the Y direction which was the second extending direction was approximately 200 μm.

In scanning the laser light when forming one second line-shaped region 1Hnb, the scanning direction of the laser light was set as a direction which faced the other end portion opposite to the one end portion 1Ep side which was placed on the gas supply path 20Cs side in the heating furnace 20 of the semiconductor substrate 1, across the center portion 1Cp. The laser light radiation in one direction started at a position (scanning start position) of approximately 1.5 mm from the one end portion 1Ep of the semiconductor substrate 1, and ended at a position (scanning end position) of approximately 1.5 mm from the other end portion of the semiconductor substrate 1. The scanning speed of the laser light was set to be approximately 2000 mm/s when starting the laser light radiation, increased up to approximately 5000 mm/s as a terminal speed with approximately 1000000 mm/s² of acceleration, and after that, the terminal speed was maintained. Accordingly, when starting the laser light radiation, between the irradiation target regions related to the laser light, an overlap having approximately 97 μm was generated, and when the scanning speed reached the terminal speed, a gap having approximately 50 μm was generated between the irradiation target regions of the laser light. In addition, the distance from the scanning start position to the position (terminal speed reaching position) at which the scanning speed reached the terminal speed was approximately 4.5 mm. In other words, the distance from the one end portion 1Ep of the semiconductor substrate 1 to the terminal speed reaching position was approximately 6 mm By such laser light scanning, the frequency of occurrence of the high concentration region 1Hr in the second line-shaped region 1Hnb was realized. As the similar laser light radiation is performed repeatedly, many second line-shaped regions 1Hnb were formed. Such laser light radiation conditions were realized by the program PG1 in the control device PC1.

Subsequently, the first line-shaped region 1Hna was formed as the laser light radiation was performed at a constant scanning speed. Accordingly, the second semiconductor region 1n was formed. In other words, the second semiconductor region 1n according to the specific example of the embodiment was formed. In addition, at this time, as the local heat was given by the laser light radiation from the upward of the element supply source GL1 with respect to a region where the second concentration region 1Hn of the second main surface 1b of the semiconductor substrate 1 had not been formed, the alignment reference portions 1m at two locations which were separated from each other were formed. Here, as the laser light which was generated by one time of laser lightening when forming the second concentration region 1Hn and the substantially same laser light was irradiated 10000 times for approximately 0.05 seconds to the same location, the alignment reference portion 1m was formed.

In contrast, as the second line-shaped region 1HnbA was formed as illustrated in FIG. 12 not to generate either the overlap or the gap between the irradiation target regions of the laser light, the second semiconductor region 1n according to the reference example was made. At this time, the scanning speed in one direction of the laser light was set to be approximately 4000 mm/s constantly from the time when the laser light radiation started to the time when the laser light radiation ended.

<(1-10-4) Measurement Result of Sheet Resistance ρs in Second Line-Shaped Region>

Here, each of the sheet resistances ρs in the second line-shaped regions 1Hnb and 1HnbA which are formed in the above-described manner according to the specific example of the embodiment and the reference example was respectively measured. The sheet resistances ρs in the second line-shaped regions 1Hnb and 1HnbA, in a manner similar to the sheet resistance ρs in the first concentration region 1Ln, were measured by the four-probe method based on JIS H 0602-1995 in the darkroom in which the room temperature was 25.5° C. and the relative humidity was 60% RH. However, the diameter of the tip end of the probe was changed to be 10 μm, the distance between the probes was changed to be 0.1 mm, the pressing load of the probe to the semiconductor substrate 1 was changed to be 0.1 N, and the current applied between the probes was changed to be 0.1 mA, respectively.

As a result of the above-described measurement, as illustrated by the bold dotted line in FIG. 10, the sheet resistance ρs of the second line-shaped region 1HnbA according to the reference example was 30 Ω/□ on the center portion 1Cp side of the semiconductor substrate 1, and was 80 Ω/□ on the one end portion 1Ep side. Here, regardless of presence of the part which had a high sheet resistance ρs in the first concentration region 1Ln, in order to cause the laser light to be uniformly irradiated when forming the second line-shaped region 1HnbA, it was assumed that the sheet resistance ρs in the second line-shaped region 1HnbA was not sufficiently reduced. In addition, here, on the one end portion 1Ep side of the semiconductor substrate 1, as approaching the one end portion 1Ep side of the semiconductor substrate 1, it was assumed that the thickness of the second line-shaped region 1HnbA and the n-type dopant concentration in the second line-shaped region 1HnbA showed a tendency of decreasing.

In contrast, as illustrated by the bold line in FIG. 10, the sheet resistance ρs of the second line-shaped region 1Hnb according to the specific example of the embodiment was 30 Ω/□ on the center portion 1Cp side of the semiconductor substrate 1, and was 40 Ω/□ on the one end portion 1Ep side. In other words, regarding the second line-shaped region 1Hnb according to the specific example of the embodiment, the nonuniformity of the sheet resistance ρs was improved and the sheet resistance ρs was appropriately reduced. Here, since the frequency of occurrence of the irradiation target region of the laser light when forming the second line-shaped region 1Hnb was adjusted according to the distribution of the sheet resistance ρs in the first concentration region 1Ln, it was assumed that the sheet resistance ρs in the second line-shaped region 1Hnb was uniform and was sufficiently reduced. In addition, here, it was assumed that the concentration of the n-type dopant in the second line-shaped region 1Hnb and the thickness of the second line-shaped region 1Hnb were substantially uniform and were sufficiently increased.

<(1-10-5) Forming Solar Cell Element>

After the second concentration region 1Hn was formed as described above, the PSG layer was removed from the semiconductor substrate 1 by cleaning by the HF. Subsequently, as the etching was performed by the fluonitric acid with respect to the entire first main surface 1a of the semiconductor substrate 1, PN separation was performed.

In addition, by the CVD method, the SiN film which is the anti-reflection film 2 was formed on the second semiconductor region 1n. Furthermore, as the first electrode 4, the second electrode 5, and the fourth concentration region 1Hp were formed, the solar cell element 10 is formed. Here, as the first main surface 1a was fired after being coated with the Al paste and the Ag paste in order by screen printing, the first electrode 4 which includes the collection electrode 4a and the output extraction electrode 4b was formed. At this time, as the Al of the Al paste diffuse to the first semiconductor region 1p, the fourth concentration region 1Hp was formed in the surface layer portion on the first main surface 1a side of the semiconductor substrate 1. In addition, as the second main surface 1b was fired after being coated with the Ag paste by screen printing, the second electrode 5 was formed. At this time, the alignment reference portions 1m at two or more locations which were on the second main surface 1b were used as a reference, and the formed region where the second electrode 5 was formed was adjusted.

Accordingly, the solar cell element 10 according to the specific example of the embodiment was made. In addition, similarly to the solar cell element 10 according to the specific example, after forming the second line-shaped region 1HnbA, as the PSG layer was removed, the PN separation was performed, and the anti-reflection film 2, the first electrode 4, the second electrode 5, and the fourth concentration region 1Hp were formed, the solar cell element according to the reference example was made.

<(1-10-6) Characteristics of Solar Cell Element>

Here, by using the solar cell element 10 according to the specific example of the embodiment and the solar cell element according to the reference example as targets, the conversion efficiency and the fill factor (FF) were measured. Here, the conversion efficiency and the FF of the solar cell element 10 according to the specific example and the solar cell element according to the reference example, were measured by using a fixed light solar simulator under conditions that the irradiation intensity of the light with respect to each light receiving surface was 100 mW/cm$^2$, and AM (air mass) was 1.5.

As a result of the above-described measurement, regarding the solar cell element according to the reference example, the conversion efficiency was 16.8% and the FF was 0.779. In contrast, regarding the solar cell element 10 according to the specific example of the embodiment, the conversion efficiency was 17.0% and the FF was 0.781. In other words, compared to the solar cell element according to the reference example, the characteristics of the solar cell element 10 according to the specific example of the embodiment was better.

From the above-described measurement result, in the solar cell element according to the reference example, the sheet resistance ρs of the second line-shaped region 1HnbA in the vicinity of the one end portion 1Ep of the semiconductor substrate 1 increased, the connection resistance between the second electrode 5 and the semiconductor substrate 1 increased, and it was assumed that the FF and the conversion efficiency decreased. In addition, in the vicinity of the one end portion 1Ep of the semiconductor substrate 1, the thickness of the second line-shaped region 1HnbA became thin, and many defects which were included in the vicinity of the surface of the semiconductor substrate 1 existed in the pn junction portion. According to this, the recombination of the carrier was likely to be generated, and as a result, it was assumed that the FF and the conversion efficiency decreased.

Meanwhile, in the solar cell element 10 according to the specific example of the embodiment, due to the change in the frequency of occurrence of the irradiation target region of the laser light, the sheet resistance ρs of the second line-shaped region 1Hnb even in the vicinity of the one end portion 1Ep of the semiconductor substrate 1 is reduced. Accordingly, the connection resistance between the second electrode 5 and the semiconductor substrate 1 was reduced even in the vicinity of the one end portion 1Ep of the semiconductor substrate 1, and it was assumed that the FF and the conversion efficiency increased. In addition, even in the vicinity of the one end portion 1Ep of the semiconductor substrate 1, as the thickness of the second line-shaped region 1Hnb sufficiently increased, the number of defects which existed in the pn junction portion decreased, and as a result, the recombination of the carrier was unlikely to be generated, and it was assumed that the FF and the conversion efficiency increased.

(2) Modification Example

In addition, the present invention is not limited to the above-described embodiment, and various changes, improvements or the like can be employed without departing from the scope of the present invention.

For example, in the above-described embodiment, P is employed as the second conductivity type n-type dopant, but the invention is not limited thereto. For example, if the second conductivity type is the n-type, a V-B group element (15 group element), such as arsenic (As), may be employed as the second conductivity type dopant. In addition, when the first conductivity type is the n-type and the second conductivity type is the p-type, P or As is employed as the first conductivity type dopant, and a III-B group element (13 group element), such as B or Al, may be employed as the second conductivity type dopant. In this case, for example, with respect to the n-type silicon substrate, the element which becomes the second conductivity type dopant by the gas diffusion method or the coating diffusion method (liquid diffusion method) is introduced into the surface layer portion of the semiconductor substrate 1 by diffusion. For example, the semiconductor substrate 1 is heated in the atmosphere of the raw material gas which contains boron tribromide (BBr$_3$), B diffuses to the semiconductor substrate 1, and the first concentration region 1Ln which contains B in the surface layer portion on the second main surface 1b side of the semiconductor substrate 1 is formed. At this time, a boron silicate glass (BSG) layer which is the element supply source GL1 on the second main surface 1b is formed. Subsequently, as the BSG layer is irradiated with the laser light, B is further introduced into the surface layer portion on the second main surface 1b side of the semiconductor substrate 1 by diffusion. Accordingly, as the second concentration region 1Hn is formed, the second semiconductor region 1n is formed.

Figure 32:
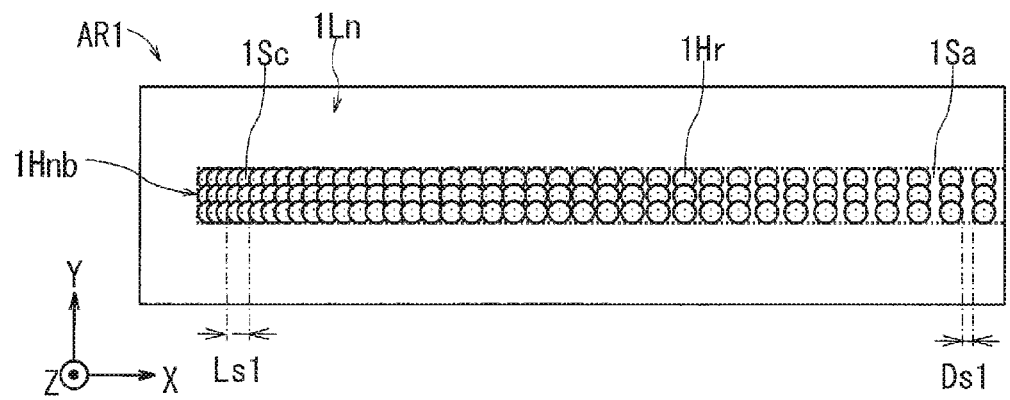
FIG. 32 is a plan view illustrating a configuration of a second concentration region according to a modification example.

In addition, in the above-described embodiment, as the frequency of occurrence of the irradiation target region of the laser light on the element supply source GL1 has changed, the frequency of occurrence of the plurality of high concentration regions 1Hr in the second line-shaped region 1Hnb is adjusted, but the invention is not limited thereto. For example, in a state where the element supply source is placed to have a low or high density which contains the element that becomes the second conductivity type dopant in a region where the second line-shaped region 1Hnb is formed in the first concentration region 1Ln, as the semiconductor substrate 1 is heated, the second line-shaped region 1Hnb may be formed. Even in this state, as illustrated in FIG. 32, the frequency of occurrence of the plurality of high concentration regions 1Hr in the second line-shaped region 1Hnb can be adjusted.

Next, a specific example of the method for forming the second line-shaped region 1Hnb will be described. For example, the p-type polycrystal silicon substrate in which the projection and recess portion is formed across the entire main surface thereof by the RIE and of which one side of the rectangular plate surface thereof is 156 mm is prepared as the semiconductor substrate 1. After cleaning the surface of the semiconductor substrate 1 by the HF, as P is introduced into the surface layer portion on the second main surface 1b side of the semiconductor substrate 1 by the gas diffusion method which uses the POCl$_3$ gas as the raw material gas, the first concentration region 1Ln is formed. Next, the PSG layer which is formed on the first concentration region 1Ln is removed by cleaning by the HF. Subsequently, as the solution which contains the phosphoric acid and/or a phosphorus oxide on the region where the second electrode 5 is formed in the second main surface 1b of the semiconductor substrate 1 is printed by an ink jet method, the element supply source is formed. As the heat treatment is performed at the temperature range from 700° C. to 950° C. with respect to the semiconductor substrate 1, P is introduced into the surface layer portion on the second main surface 1b side of the semiconductor substrate 1 from the element supply source by diffusion. Accordingly, the second concentration region 1Hn is formed.

In printing the element supply source by the ink jet method, the diameter of the element supply source which is formed by one liquid droplet on the semiconductor substrate 1 by the ink jet method may be approximately 100 μm, for example. In this case, for example, in the Y direction which is the line width direction of the second line-shaped region 1Hnb, three liquid droplets are uniformly overlapped with each other, and the total width of the element supply source in the Y direction is 260 μm. At this time, the overlapped length of the liquid droplets in the line width direction of the second line-shaped region 1Hnb is 20 μm. One group of liquid droplets which is made of three liquid droplets is formed to have a low or high density in the X direction which is the second extending direction of the second line-shaped region 1Hnb. For example, in the vicinity of the one end portion 1Ep of the semiconductor substrate 1, the overlapped length Ls1 made by one group of liquid droplets overlapped in the X direction is set to be large. In the X direction, toward the center portion 1Cp from the vicinity of the one end portion 1Ep, after the overlapped length Ls1 is reduced, the element supply source is formed so that the gap is generated between the liquid droplets in one group, and further, the separation distance Ds1 between the liquid droplets in one group which are separated from each other in the X direction is large. Specifically, it is sufficient that the overlapped length Ls1 in the vicinity of the one end portion 1Ep of the semiconductor substrate 1 is set to be approximately 60 μm, for example, and the separation distance Ds1 in the vicinity of the center portion 1Cp of the semiconductor substrate 1 may be set to be approximately 30 μm, for example.

In this manner, as the plurality of liquid droplets which are the element supply source placed on the first concentration region 1Ln have a low or high density, the frequency of occurrence of the plurality of high concentration regions 1Hr in the second line-shaped region 1Hnb can be adjusted. For example, as relatively many liquid droplets are adhered onto the region where the sheet resistance ρs of the first concentration region 1Ln is relatively high, the sheet resistance ρs can be reduced in the second line-shaped region 1Hnb. In addition, as relatively many liquid droplets are adhered onto the region where the second conductivity type dopant concentration in the first concentration region 1Ln is relatively low, the second conductivity type dopant concentration in the second line-shaped region 1Hnb can increase. As a result, similarly to the solar cell element 10 according to the above-described embodiment, in a state of the solar cell element 10, the recombination of the carrier is unlikely to be generated, and the FF and the conversion efficiency can increase.

In addition, for example, after once the high concentration region 1Hr is formed across the entire surface of the first concentration region 1Ln, as the high concentration region 1Hr is removed so that a part of the high concentration regions 1Hr remains, density of the plurality of high concentration regions 1Hr in the second concentration region 1Hn may be adjusted. Specifically, for example, by the gas diffusion method which uses the raw material gas, the temperature of the semiconductor substrate 1 increases up to a first temperature, the first concentration region 1Ln is formed as P is introduced into the surface layer portion on the second main surface 1b side of the semiconductor substrate 1, and the PSG layer is formed on the first concentration region 1Ln. Subsequently, as the semiconductor substrate 1 is maintained at a second temperature which is higher than the first temperature, and as P is further introduced into the surface layer portion on the second main surface 1b side of the semiconductor substrate 1, the high concentration region 1Hr is formed. In a state where the partial region which remains in the high concentration region 1Hr is covered by the mask, such as a resist, a part other than the partial region in the high concentration region 1Hr is removed by etching by a drug solution, such as the HF. Accordingly, the second concentration region 1Hn in which the frequency of occurrence of the plurality of high concentration regions 1Hr is adjusted can be formed.

Figure 33:
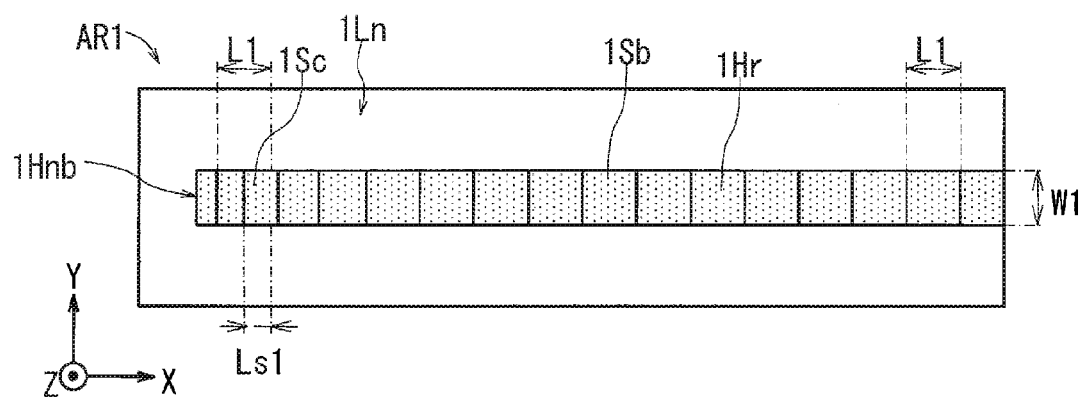
FIG. 33 is a plan view illustrating a configuration of the second concentration region according to the modification example.
Figure 34:
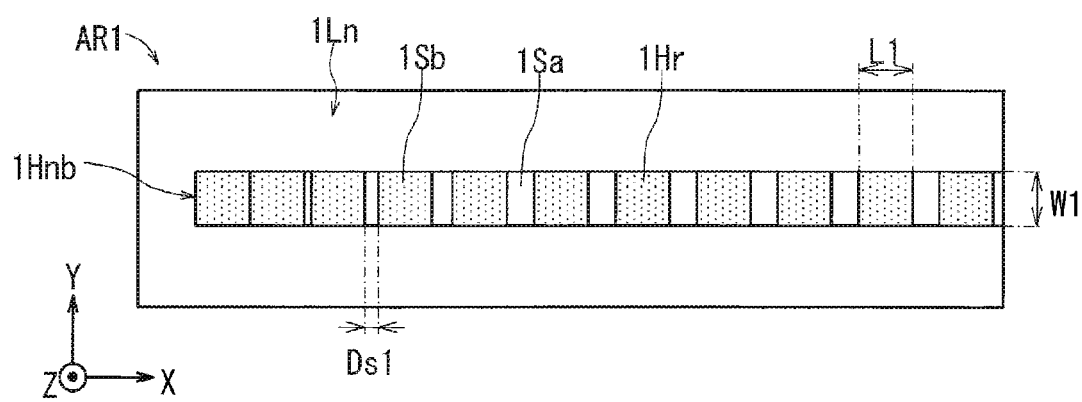
FIG. 34 is a plan view illustrating a configuration of the second concentration region according to the modification example.

In addition, in the above-described embodiment, as both the overlapped length Ls1 and the separation distance Ds1 in the plurality of high concentration regions 1Hr are adjusted, the frequency of occurrence of the plurality of high concentration regions 1Hr is adjusted, but the invention is not limited thereto. For example, as illustrated in FIG. 33, without the non-arrangement region 1Sa in the second line-shaped region 1Hnb, by adjusting the overlapped length Ls1 in the plurality of high concentration regions 1Hr, the frequency of occurrence of the plurality of high concentration regions 1Hr may be adjusted. In this case, since the high concentration region 1Hr is formed to be integrated by the plurality of high concentration regions 1Hr, only one high concentration region 1Hr exists in the extending direction of the second concentration region 1Hn. In addition, for example, as illustrated in FIG. 34, as the overlapped region 1Sc is not provided in the second line-shaped region 1Hnb, and the separation distance Ds1 in the plurality of high concentration regions 1Hr is adjusted, the frequency of occurrence of the plurality of high concentration regions 1Hr may be adjusted.

Even in all of the above-described aspects, in the extending direction of the second concentration region 1Hn, the minimum place which has the minimum value of the dopant concentration difference regarding the second concentration region 1Hn and the maximum place which has the maximum value of the dopant concentration difference alternately and repeatedly exist, and the minimum place interval IN1 between the one end portions of the adjacent minimum places can be adjusted to vary. In addition, in the extending direction of the second concentration region 1Hn, the minimum place which has the minimum value of the sheet resistance difference in the second concentration region 1Hn and the maximum place which has the maximum value of the sheet resistance difference alternately and repeatedly exist, and the minimum place interval IN2 between the one end portions of the adjacent minimum places can be adjusted to vary. In addition, in the extending direction, the dopant concentration difference regarding the second concentration region 1Hn increases or decreases between the first value range and the second value range, and the occupancy rate of the section in which the dopant concentration difference is included in the relatively large second value range among the sections of the unit length $L_0$ can be adjusted. In addition, in the extending direction, the sheet resistance difference in the second concentration region 1Hn increases or decreases between the first value range and the second value range, and the occupancy rate of the section in which the sheet resistance difference is included in the relatively large second value range among the sections of the unit length $L_0$ can be adjusted. The sheet resistance ρs in the second concentration region 1Hn which is formed by using a part having a relatively high sheet resistance ρs in the first concentration region 1Ln as a base portion can appropriately decrease. As a result, the distribution of the sheet resistance ρs in the second concentration region 1Hn can be narrow and can be settled in an appropriate value range.

In addition, in the above-described embodiment, the frequency of occurrence of the plurality of high concentration regions 1Hr included in the second line-shaped region 1Hnb is adjusted, but the invention is not limited thereto. For example, when the second conductivity type dopant concentration and the sheet resistance in the first concentration region 1Ln change in the Y direction which is the first extending direction, according to these changes, the frequency of occurrence of the plurality of high concentration regions 1Hr included in the first line-shaped region 1Hna may be adjusted. Accordingly, the distribution of the sheet resistance ρs in the second concentration region 1Hn can be narrow and can be settled in an appropriate value range.

In addition, in the above embodiment, in the laser radiation device 30, the semiconductor substrate 1 is conveyed by the rotation conveyance portion 350, and the laser light is deflected by the two-axes deflector Lr14 which includes the galvano scanner or the like, but the invention is not limited thereto. For example, without deflection of the laser light, as a table on which the semiconductor substrate 1 is mounted moves in the X direction and the Y direction for each semiconductor substrate 1, the irradiation target region which is irradiated with the laser light on the second main surface 1b of the semiconductor substrate 1 may be moved. However, in this case, when the table is moved in the X direction and the Y direction, a large inertial force is generated by the weight of the table. Accordingly, if a irradiation target position of the laser light is moved by the two-axes deflector Lr14 which includes the galvano scanner or the like, a drastic acceleration and deceleration in movement of the irradiation target position of the laser light can be easily realized.

In addition, in the above-described embodiment, in the second forming process, an example in which the moving speed of the laser light is changed and the interval between the extremely small irradiation regions which are called spots as described above is changed while moving in one direction the position of the irradiation target region which is irradiated with the laser light on the element supply source, is described, but the invention is not limited thereto. Other than the change in the moving speed of the laser light, for example, by changing the oscillation frequency of the laser, it is possible to change the interval between each spot. In addition, not being limited to the spot interval, it is possible to change an area of the spot by changing a width, a length, or a diameter of the spot. In addition, even in changing the laser radiation energy for the spot by changing the laser output or laser pulse width, it is possible to appropriately adjust the dopant concentration (sheet resistance) of the second concentration region which is formed by using a part in which the dopant concentration (sheet resistance) of the first concentration region is different as a base portion.

In particular, according to the method for adjusting the dopant concentration (sheet resistance) of the second concentration region by particularly changing the moving speed of the laser light, compared to another methods, it is not required that an optical system, such as a lens, be replaced, and it is appropriate that there is no loss in processing time by stopping the laser output for a certain period of time.

In addition, after peeling the second electrode 5 and the anti-reflection film 2 off by a hydrochloric acid (HCl) and the HF, the frequency of occurrence of the high concentration region 1Hr in the solar cell element 10 can be confirmed by an analysis by the TOF-SIMS which uses the second main surface 1b of the semiconductor substrate 1 as the target. In addition, for example, after peeling the second electrode 5 and the anti-reflection film 2 off by the HCl and the HF, the boundary of the high concentration region 1Hr can be visually confirmed by observation by the optical microscope which uses the second main surface 1b of the semiconductor substrate 1 as the target. Accordingly, the frequency of occurrence of the high concentration region 1Hr can be confirmed.

In addition, the entire configuration or a part of the configuration of the above-described embodiment and various modification examples can be appropriately combined with each other without causing contradiction therebetween.

REFERENCE SIGNS LIST

1 Semiconductor substrate
1Cp Center portion
1Ep One end portion
1Hn Second concentration region
1Hna First line-shaped region
1Hnb, 1HnbA Second line-shaped region
1Hr High concentration region
1Ln First concentration region
1NA Close region
1Sa Non-arrangement region
1Sb Single arrangement region
1Sc Overlapped region
1a, 10a First main surface
1b, 10b Second main surface
1n Second semiconductor region
1p First semiconductor region
4 First electrode
5 Second electrode
5a First line-shaped portion
5b Second line-shaped portion
10 Solar cell element
20 Heating furnace
30 Laser radiation device
100 Solar cell module
Dd1, Dd2, Dr1, Dr2, Rr1, Rr2, Rr2A Value range
Ds1 Separation distance
GL1 Element supply source
Ga1 Raw material gas
IN1, IN2 Minimum place interval
Lr1 Laser radiation mechanism
Ls1 Overlapped length
PC1 Control device

The invention claimed is:

1. A solar cell element, comprising:
a semiconductor substrate which includes a first conductivity type first semiconductor region positioned on a first main surface, and a second conductivity type second semiconductor region which is different from the first conductivity type in a surface layer portion of a second main surface positioned on an opposite side to the first main surface; and
an electrode in line shape which is disposed on the second main surface of the semiconductor substrate,
wherein the second semiconductor region includes a first concentration region which exists at a position separated from the electrode by a predetermined distance in plan view, and a second concentration region which includes a high concentration region where a dopant concentration is higher than that in the first concentration region and exists along a longitudinal direction of the electrode, and
wherein the second concentration region includes a part in which a minimum place which has a minimum value of a dopant concentration difference and a maximum place which has a maximum value of the dopant concentration difference alternately and repeatedly exist along the longitudinal direction of the electrode and in which a minimum place interval of adjacent minimum places in the longitudinal direction of the electrode varies;
wherein the dopant concentration difference is calculated by subtracting a dopant concentration value of the first concentration region at a first place from a dopant concentration value of the second concentration region at a second place; and
wherein the first place is close to the second place.

2. The solar cell element according to claim 1, wherein along the longitudinal direction of the electrode, the minimum place interval of the dopant concentration difference becomes gradually wide.

3. The solar cell element according to claim 2, wherein along the longitudinal direction of the electrode, a plurality of high concentration regions of the second concentration region are arranged, and
wherein the second concentration region includes a gap between two adjacent high concentration regions.

4. The solar cell element according to claim 2, wherein only a single high concentration region exists in the second concentration region.

5. The solar cell element according to claim 2,
wherein the minimum place interval of the dopant concentration difference in one end portion of the electrode in the longitudinal direction is narrower than the minimum place interval in a center portion of the electrode in the longitudinal direction.

\* \* \* \* \*